United States Patent
Gajek et al.

(10) Patent No.: US 10,693,056 B2
(45) Date of Patent: Jun. 23, 2020

(54) THREE-DIMENSIONAL (3D) MAGNETIC MEMORY DEVICE COMPRISING A MAGNETIC TUNNEL JUNCTION (MTJ) HAVING A METALLIC BUFFER LAYER

(71) Applicant: SPIN MEMORY, INC., Fremont, CA (US)

(72) Inventors: Marcin Gajek, Berkeley, CA (US); Michail Tzoufras, Sunnyvale, CA (US)

(73) Assignee: SPIN MEMORY, INC., Wilmington, DE (US)

( * ) Notice: Subject to any disclaimer, the term of this patent is extended or adjusted under 35 U.S.C. 154(b) by 0 days.

(21) Appl. No.: 16/103,835

(22) Filed: Aug. 14, 2018

(65) Prior Publication Data

US 2019/0207094 A1 Jul. 4, 2019

Related U.S. Application Data

(63) Continuation-in-part of application No. 15/858,808, filed on Dec. 29, 2017, now Pat. No. 10,326,073, and
(Continued)

(51) Int. Cl.
| | |
|---|---|
| *H01L 27/22* | (2006.01) |
| *H01L 43/08* | (2006.01) |
| *G11C 11/16* | (2006.01) |
| *H01L 43/10* | (2006.01) |
| *H01L 43/12* | (2006.01) |
| *H01L 43/04* | (2006.01) |
| *H01L 43/14* | (2006.01) |

(52) U.S. Cl.
CPC ............ *H01L 43/04* (2013.01); *H01L 27/228* (2013.01); *H01L 43/08* (2013.01); *H01L 43/14* (2013.01); *G11C 11/161* (2013.01); *H01L 43/10* (2013.01); *H01L 43/12* (2013.01)

(58) Field of Classification Search
CPC ..... H01L 43/00–14; H01L 27/222–228; H01L 29/66984; H01F 10/32–3295; G11C 11/14–161; G11C 11/18
See application file for complete search history.

(56) References Cited

U.S. PATENT DOCUMENTS

| | | |
|---|---|---|
| 4,910,709 A | 3/1990 | Dhong et al. |
| 5,308,782 A | 5/1994 | Mazure et al. |
| (Continued) | | |

OTHER PUBLICATIONS

Beleggia et al., "Phase diagram for magnetic nano-rings", Journal of Magnetism and Magnetic Materials, pp. 131-146, 2005.*
(Continued)

*Primary Examiner* — Younes Boulghassoul
(74) *Attorney, Agent, or Firm* — Morgan, Lewis & Bockius LLP

(57) ABSTRACT

A magnetic memory device is provided. The magnetic memory device includes: (i) a cylindrical core, (ii) a metallic buffer layer that surrounds the cylindrical core, (iii) a first ferromagnetic layer that surrounds the metallic buffer layer, (iv) a barrier layer that surrounds the first ferromagnetic layer, and (v) a second ferromagnetic layer that surrounds the barrier layer. The cylindrical core, the metallic buffer layer, the first ferromagnetic layer, the barrier layer, and the second ferromagnetic layer collectively form a magnetic tunnel junction.

18 Claims, 33 Drawing Sheets
(15 of 33 Drawing Sheet(s) Filed in Color)

Related U.S. Application Data a continuation-in-part of application No. 15/858,765, filed on Dec. 29, 2017, and a continuation-in-part of application No. 15/857,574, filed on Dec. 28, 2017, now Pat. No. 10,541,268.

(56) References Cited

U.S. PATENT DOCUMENTS

| | | | |
|---|---|---|---|
| 5,656,842 A | 8/1997 | Iwamatsu et al. | |
| 5,717,373 A | 2/1998 | Vachris | |
| 6,621,730 B1 * | 9/2003 | Lage | B82Y 10/00 257/E21.665 |
| 6,829,161 B2 | 12/2004 | Huai et al. | |
| 6,909,631 B2 | 6/2005 | Durlam et al. | |
| 7,067,866 B2 | 6/2006 | Shi | |
| 7,166,881 B2 | 1/2007 | Lin et al. | |
| 7,224,601 B2 | 5/2007 | Panchula | |
| 7,248,498 B2 | 7/2007 | Nazarian | |
| 7,577,019 B2 | 8/2009 | Hung et al. | |
| 7,800,938 B2 | 9/2010 | Rivkin et al. | |
| 7,826,260 B2 | 11/2010 | Zhu et al. | |
| 7,872,905 B2 | 1/2011 | Florez Marino et al. | |
| 7,881,099 B2 | 2/2011 | Lim | |
| 7,936,597 B2 | 5/2011 | Clinton et al. | |
| 8,008,706 B2 | 8/2011 | Choi et al. | |
| 8,077,509 B2 | 12/2011 | Yanagi et al. | |
| 8,107,280 B2 | 1/2012 | Yoon et al. | |
| 8,179,711 B2 | 5/2012 | Kim et al. | |
| 8,194,361 B2 | 6/2012 | Kudo et al. | |
| 8,199,553 B2 | 6/2012 | Chen et al. | |
| 8,203,389 B1 | 6/2012 | Zhou et al. | |
| 8,345,474 B2 | 1/2013 | Oh et al. | |
| 8,353,568 B2 | 1/2013 | Lee | |
| 8,416,539 B2 | 4/2013 | Carey et al. | |
| 8,421,440 B2 | 4/2013 | Oksanen et al. | |
| 8,508,973 B2 | 8/2013 | Jin et al. | |
| 8,582,240 B1 | 11/2013 | Chen et al. | |
| 8,587,993 B2 | 11/2013 | Lee et al. | |
| 8,625,337 B2 | 1/2014 | Wu et al. | |
| 8,633,720 B2 | 1/2014 | Tudosa et al. | |
| 8,724,380 B1 | 5/2014 | Zhou et al. | |
| 8,817,546 B2 | 8/2014 | Wang | |
| 9,110,746 B2 | 8/2015 | Zhu et al. | |
| 9,142,277 B2 | 9/2015 | Kim et al. | |
| 9,166,147 B2 | 10/2015 | Carman et al. | |
| 9,208,878 B2 | 12/2015 | Iyer et al. | |
| 9,230,571 B1 | 1/2016 | Chen et al. | |
| 9,236,416 B2 | 1/2016 | Shukh | |
| 9,240,799 B1 | 1/2016 | Wang et al. | |
| 9,337,415 B1 | 5/2016 | Oh et al. | |
| 9,362,336 B2 | 6/2016 | Lu | |
| 9,443,905 B1 | 9/2016 | Bandic et al. | |
| 9,444,036 B1 * | 9/2016 | Franca-Neto | H01L 43/02 |
| 9,460,769 B2 | 10/2016 | Nozaki et al. | |
| 9,461,094 B2 | 10/2016 | Li et al. | |
| 9,502,133 B2 | 11/2016 | Ueda et al. | |
| 9,503,097 B2 | 11/2016 | Lee et al. | |
| 9,525,126 B1 * | 12/2016 | Lin | H01L 43/02 |
| 9,543,505 B2 | 1/2017 | Park et al. | |
| 9,595,917 B2 | 3/2017 | Kan et al. | |
| 9,608,043 B2 | 3/2017 | Shimabukuro et al. | |
| 9,634,237 B2 | 4/2017 | Lee et al. | |
| 9,637,272 B2 | 5/2017 | Albaum | |
| 9,660,183 B2 | 5/2017 | Wang et al. | |
| 9,678,178 B2 | 6/2017 | Bai et al. | |
| 9,734,882 B2 | 8/2017 | Toh et al. | |
| 9,741,926 B1 | 8/2017 | Pinarbasi et al. | |
| 9,766,705 B2 | 9/2017 | Chan et al. | |
| 9,773,913 B1 | 9/2017 | Balakrishnan et al. | |
| 9,799,383 B2 | 10/2017 | Hosotani et al. | |
| 9,852,800 B2 | 12/2017 | Lang et al. | |
| 9,853,206 B2 | 12/2017 | Pinarbasi et al. | |
| 9,881,970 B2 | 1/2018 | Chung | |
| 10,026,892 B2 | 7/2018 | Pinarbasi et al. | |
| 10,109,367 B2 | 10/2018 | Raberg | |
| 10,199,083 B1 | 2/2019 | Bozdag et al. | |
| 10,236,047 B1 | 3/2019 | Ryan et al. | |
| 10,236,048 B1 | 3/2019 | Tzoufras et al. | |
| 10,255,962 B1 | 4/2019 | El Baraji et al. | |
| 10,326,073 B1 | 6/2019 | Tzoufras et al. | |
| 10,347,308 B1 | 7/2019 | Bozdag et al. | |
| 2003/0183889 A1 * | 10/2003 | Kajiyama | G11C 11/155 257/421 |
| 2004/0047204 A1 | 3/2004 | Hung et al. | |
| 2005/0026307 A1 * | 2/2005 | Osipov | G11C 11/16 438/3 |
| 2005/0073878 A1 | 4/2005 | Lin et al. | |
| 2005/0184348 A1 | 8/2005 | Youn et al. | |
| 2005/0232006 A1 | 10/2005 | Iwata | |
| 2006/0152969 A1 | 7/2006 | Trouilloud | |
| 2007/0047294 A1 | 3/2007 | Panchula | |
| 2007/0201265 A1 | 8/2007 | Ranjan et al. | |
| 2007/0210338 A1 | 9/2007 | Orlowski | |
| 2009/0032849 A1 | 2/2009 | Higashino | |
| 2010/0003767 A1 * | 1/2010 | Cho | H01L 43/08 438/3 |
| 2010/0052029 A1 | 3/2010 | Huang | |
| 2010/0102290 A1 | 4/2010 | Lu et al. | |
| 2010/0187601 A1 | 7/2010 | Masuoka et al. | |
| 2011/0062515 A1 | 3/2011 | Masuoka et al. | |
| 2011/0089496 A1 | 4/2011 | Masuoka et al. | |
| 2012/0155164 A1 | 6/2012 | Shukh | |
| 2012/0217468 A1 | 8/2012 | Tekleab et al. | |
| 2012/0313742 A1 | 12/2012 | Kurs et al. | |
| 2013/0200467 A1 | 8/2013 | Edge et al. | |
| 2013/0258763 A1 | 10/2013 | Ranjan et al. | |
| 2014/0008606 A1 | 1/2014 | Hussain et al. | |
| 2014/0050019 A1 | 2/2014 | Lee et al. | |
| 2014/0103470 A1 | 4/2014 | Shukh | |
| 2014/0151830 A1 | 6/2014 | Apalkov et al. | |
| 2014/0151831 A1 | 6/2014 | Chen et al. | |
| 2014/0170821 A1 | 6/2014 | Nyhus et al. | |
| 2014/0175577 A1 * | 6/2014 | Apalkov | H01L 43/08 257/421 |
| 2014/0264513 A1 | 9/2014 | De Brosse et al. | |
| 2014/0264552 A1 | 9/2014 | Prabhakar et al. | |
| 2015/0021675 A1 * | 1/2015 | Min | H01L 43/08 257/295 |
| 2015/0138873 A1 | 5/2015 | Lu et al. | |
| 2015/0279904 A1 | 10/2015 | Pinarbasi et al. | |
| 2015/0333254 A1 | 11/2015 | Liu et al. | |
| 2016/0079361 A1 | 3/2016 | Ching et al. | |
| 2016/0225818 A1 | 8/2016 | Toh et al. | |
| 2016/0240533 A1 | 8/2016 | Oxland | |
| 2016/0240542 A1 | 8/2016 | Kwon | |
| 2016/0274198 A1 | 9/2016 | Naik et al. | |
| 2016/0315249 A1 | 10/2016 | Kardasz et al. | |
| 2016/0372656 A1 | 12/2016 | Pinarbasi et al. | |
| 2017/0005106 A1 | 1/2017 | Zhang | |
| 2017/0178705 A1 | 6/2017 | Buhrman et al. | |
| 2017/0317070 A1 | 11/2017 | Salcedo et al. | |
| 2018/0075895 A1 | 3/2018 | Kishi et al. | |
| 2018/0096896 A1 | 4/2018 | Zhu | |
| 2018/0211994 A1 * | 7/2018 | kim | H01L 27/222 |
| 2018/0248110 A1 | 8/2018 | Kardasz et al. | |
| 2018/0269210 A1 | 9/2018 | Tezuka et al. | |
| 2018/0308534 A1 | 10/2018 | Gaudin et al. | |
| 2019/0036013 A1 * | 1/2019 | Mo | H01L 43/08 |
| 2019/0096957 A1 | 3/2019 | Uchida et al. | |
| 2019/0206465 A1 | 7/2019 | Bozdag et al. | |
| 2019/0207094 A1 | 7/2019 | Gajek et al. | |
| 2019/0207102 A1 | 7/2019 | Gajek et al. | |
| 2019/0214431 A1 | 7/2019 | Sharma et al. | |
| 2019/0273202 A1 * | 9/2019 | Nikitin | H01F 10/3286 |
| 2019/0296223 A1 * | 9/2019 | Araki | H01L 27/228 |
| 2019/0311956 A1 | 10/2019 | Sharma et al. | |

OTHER PUBLICATIONS

Bhatti et al., "Spintronics based random access memory: a review," Materials Today, vol. 20, No. 9, 530-548, Nov. 2017, from http://dx.doi.org/10.1016/j.mattod.2017.07.007, 19 pgs.

(56) References Cited

OTHER PUBLICATIONS

Chen et al., "On-Chip Caches Built on Multilevel Spin-Transfer Torque RAM Cells and Its Optimizations," ACMJournal on Emerging Technologies in Computing Systems, vol. 9, No. 2, Article 16, May 2013, 22 pgs.
Chen et al., "Processor Caches Built Using Multi-Level Spin-Transfer Torque RAM Cells," Jun. 2011 © 2011 IEEE, 6 pgs.
Dyakonov, M. I., "Spin Hall Effect," arXiv:1210.3200v1 (2010), from https://arxiv.org/ftp/arxiv/papers/1210/1210.3200.pdf, 12 pgs.
Eitan et al., "NROM: A Novel Localized Trapping, 2-Bit Nonvolatile Memory Cell," IEEE Electron Device Letters, vol. 21, No. 11, Nov. 2000, 3 pgs.
Fernandez-Pacheco et al., "Three-dimensional nanomagnetism," Nat. Comm. 8, 15756 ( 2017).
Jiang et al., "Constructing Large and Fast Multi-Level Cell STT-RAM based Cache for Embedded Processors," DAC 20125, Jun. 3-7, 2012, San Francisco, California, 6 pgs.
Laczkowski et al., "Large enhancement of the spin Hall effect in Au by side-jump scattering on Ta impurities," Phys. Rev. B 96, 140405(R) (2017).
Lavrijsen et al., "Magnetic ratchet for three-dimensional spintronic memory and logic," Nature 493, pp. 647-650 (2013).
Lavrijsen et al., "Multi-bit operations in vertical spintronic shift registers," Nanotechnology 25, 105201 (2014).
Lavrijsen et al., "Tuning the interlayer exchange coupling between single perpendicularly magnetized CoFeB layers," Appl. Phys. Lett. 100, 052411 (2012).
Lee et al., "Domain Imaging During Soliton Propagation in a 3D Magentic Ratchet," Spin 3(4), 1340013 (2013).
Lee et al., "Soliton propagation in micron-sized magnetic ratchet elements," Appl. Phys. Lett. 104, 232404 (2014).
Li Gao, "Spin Polarized Current Phenomena in Magnetic Tunnel Junctions," Ph.D. Dissertation, Stanford University, Sep. 2009, 126 pgs.
Li et al., A New Self-reference Sensing Scheme for TLC MRAM, Sep. 2015 ©2015 IEEE, 4 pgs.
Mansell et al., "A magnetic shift register with out-of-plane magnetized layers," Nanotechnology 28, 385201 (2017).
Mansell et al., "A robust soliton ratchet using combined antiferromagnetic and ferromagnetic interlayer couplings," Appl. Phys. Lett. 106, 092404 (2015).
Parkin, "Systematic Variation of the Strength and Oscillation Period of Indirect Magnetic Exchange Coupling through the 3d, 4d, and Sd Transition Metals," Phys. Rev. Lett. 67(25), pp. 3598-3601 (1991).
Petit et al., "Systematic layer-by-layer characterization of multilayers for three-dimensional data storage and logic," Nanotechnology 27, 155203 (2016).
Sbiaa et al., "Materials with perpendicular magnetic anisotropy for magnetic random access memory," Phys. Status Solidi RRL 5, No. 12, 413-419 (2011) / DOI: 10.1002/pssr.201105420, 7 pgs.
Van den Brink et al., "Spin-Hall-assisted magnetic random access memory," Applied Physics Letters, 104, 012403 (2014), 4 pgs.
Vincent et al., "Spin-Transfer Torque Magnetic Memory as a Stochastic Memristive Synapse for Neuromorphic Systems," IEEE Transactions on Biomedical Circuits and Systems, vol. 9, No. 2, Apr. 2015, 9 pgs.
Wang et al., "Spintronic materials and devices based on antiferromagnetic metals," Progress in Natural Science: Materials International, Oct. 23, 2016, 27 (2017) 208-216, 9 pgs.
Yuen et al., "A 2-Bit MONOS Nonvolatile Memory Cell Based on Asymmetric Double Gate MOSFET Structure," IEEE Electron Device Letters, vol. 24, No. 8, Aug. 2003, 3 pgs.
Zhang et al., "MLC STT-RAM Design Considering Probabilistic and Asymmetric MTJ Switching," Mar. 2013 ©2013 IEEE, 4 pgs.
Zhang et al., Multi-level Cell STT-RAM: Is it Realistic or Just a Dream?, IEEE/ACM International Conference on Computer-Aided Design, Nov. 5-8, 2012, San Jose, California, 8 pgs.
Tzoufras, Office Action dated Sep. 27, 2018, U.S. Appl. No. 15/859,157,14 pgs.
Tzoufras, Office Action dated Nov. 9, 2018, U.S. Appl. No. 15/858,808, 8 pgs.
Bozdag, Office Action dated Jul. 18, 2018, U.S. Appl. No. 15/859,259, 15pgs.
Bozdag, Final Office Action dated Dec. 3, 2018, U.S. Appl. No. 15/859,259, 14 pgs.
Bozdag, Notice of allowance dated Feb. 13, 2019, U.S. Appl. No. 15/859,259, 9 pgs.
Bozdag, Office Action, U.S. Appl. No. 15/859,256, dated Jan. 22, 2019, 12 pgs.
Bozdag, Notice of Allowance, U.S. Appl. No. 15/859,256, dated Apr. 24, 2019, 9 pgs.
Bozdag, Office Action, U.S. Appl. No. 15/859,250, dated Feb. 1, 2019, 12 pgs.
Bozdag, Notice of Allowance, U.S. Appl. No. 15/859,250, dated Apr. 25, 2019, 9 pgs.
Kim, Office Action dated Sep. 17, 2018, U.S. Appl. No. 15/865,125, 10 pgs.
Kim, Notice of Allowance dated Jan. 25, 2019, U.S. Appl. No. 15/865,125, 5 pgs.
Kim, Office Action dated Nov. 28, 2018, U.S. Appl. No. 15/865,144, 9 pgs.
Sharma, Notice of Allowance dated Sep. 13, 2018, U.S. Appl. No. 15/865,138, 17 pgs.
Sharma, Notice of Allowance dated Sep. 25, 2018, U.S. Appl. No. 15/865,140, 10pgs.
Sharma, Notice of Allowance dated Sep. 26, 2018, U.S. Appl. No. 15/865,132, 11 pgs.
Sharma, Notice of Allowance dated Sep. 24, 2018, U.S. Appl. No. 15/865,123, 11 pgs.

* cited by examiner

Magnetic Tunnel Junction 100

(Parallel Configuration)

(Anti-Parallel Configuration)

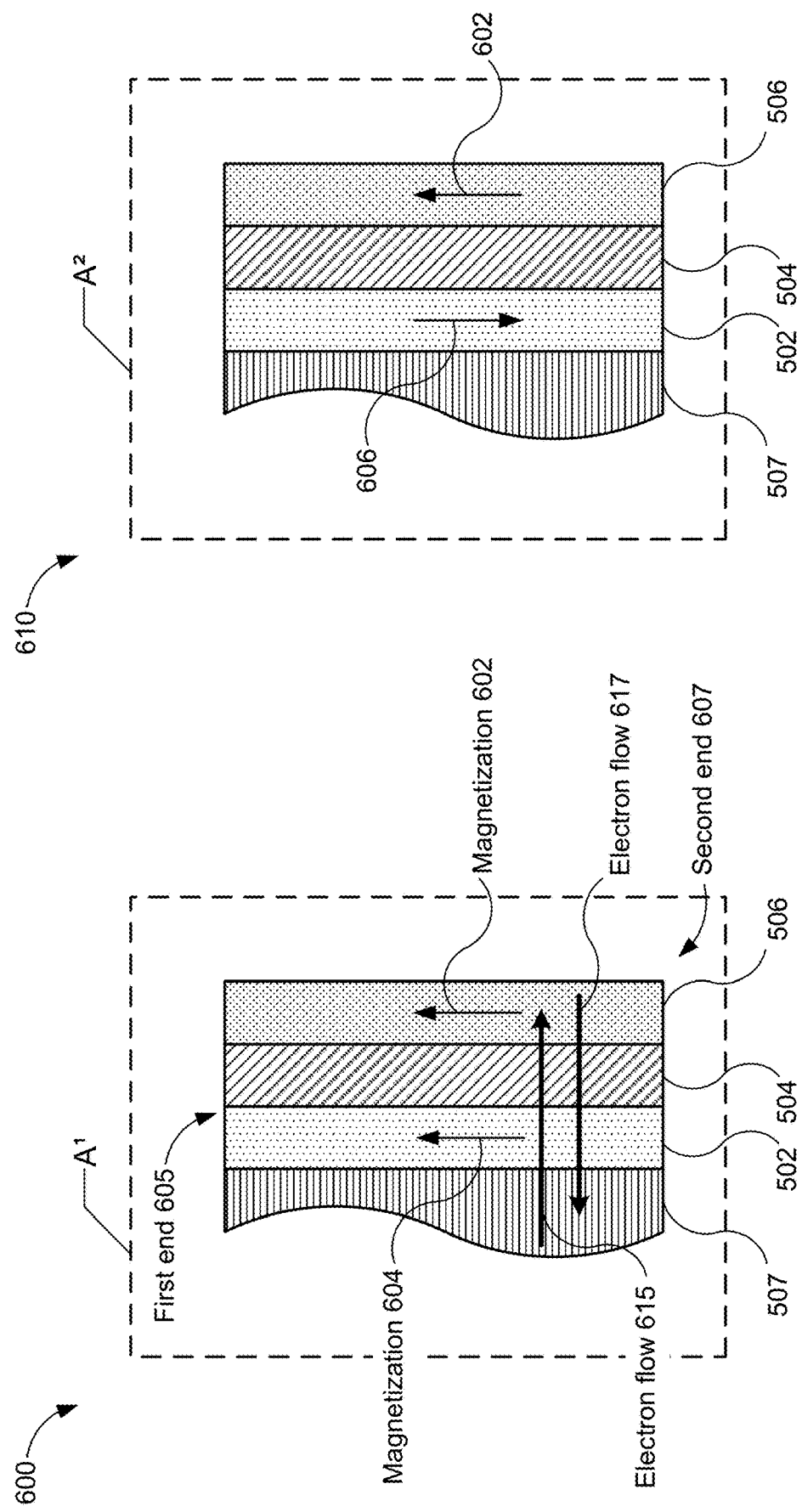

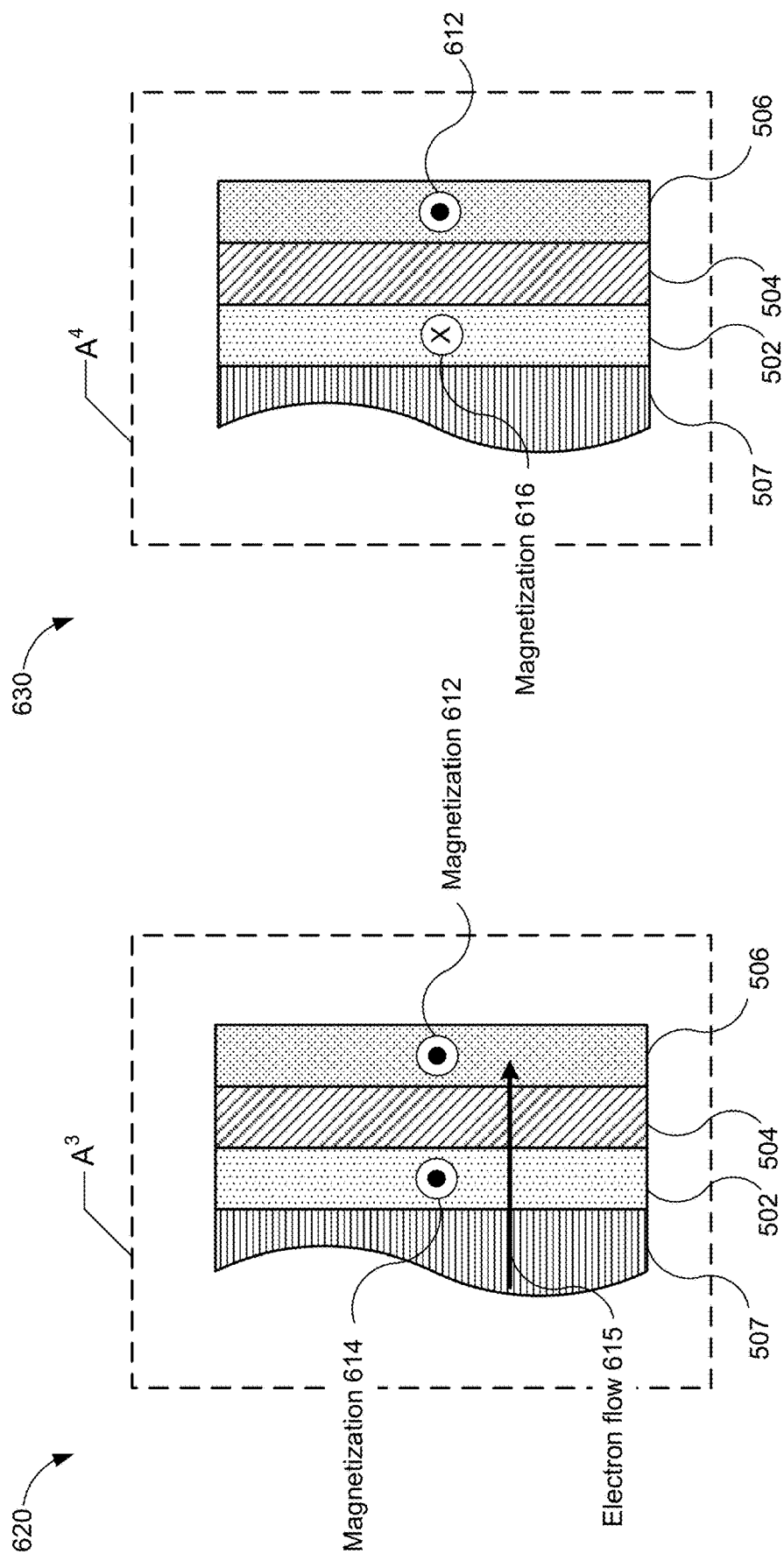

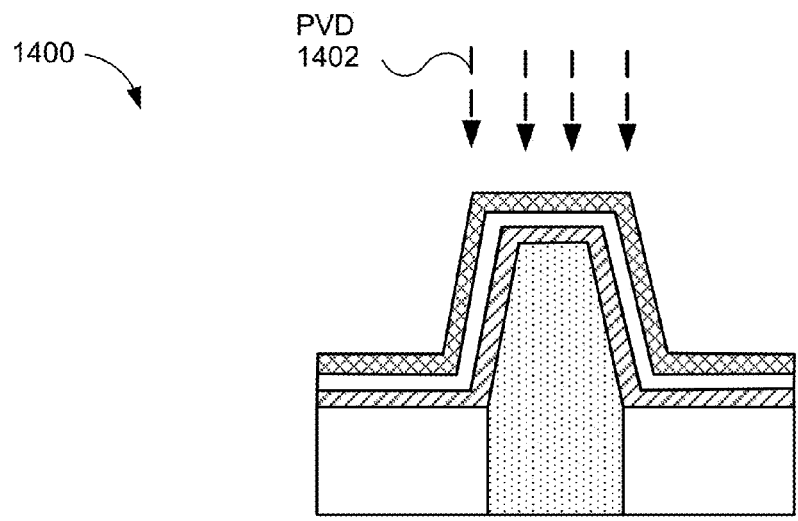
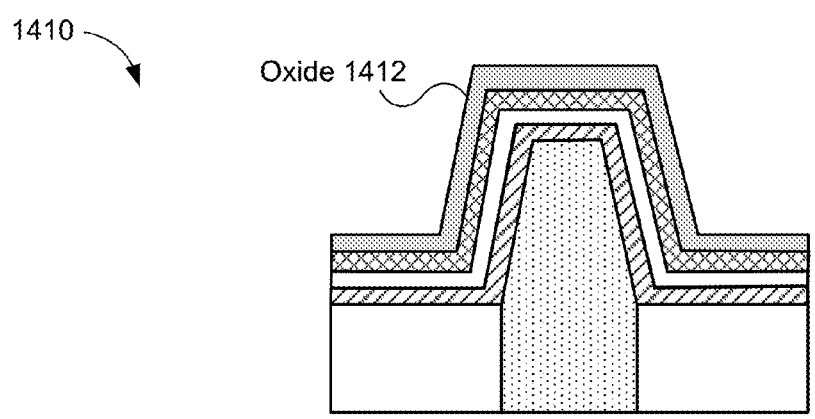
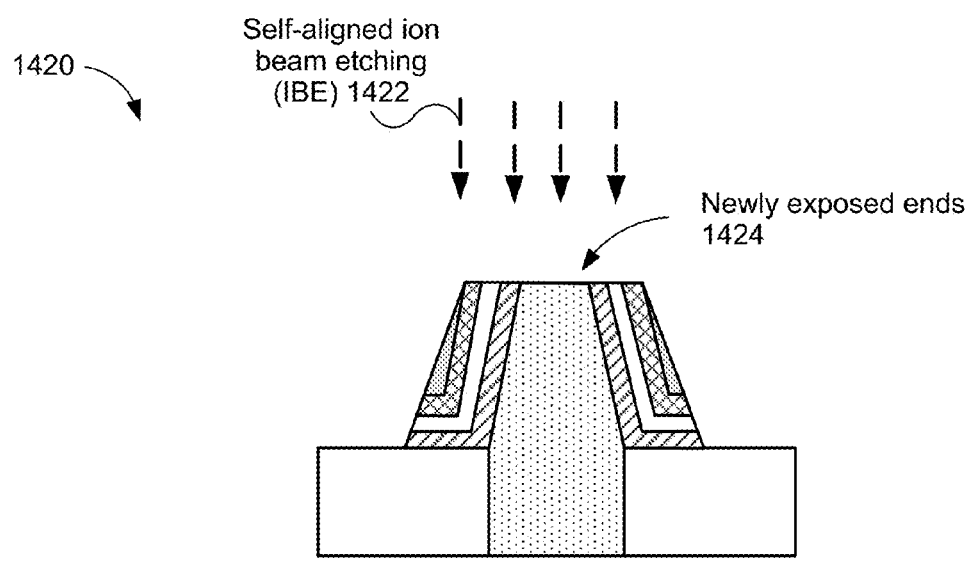
Figure 14A

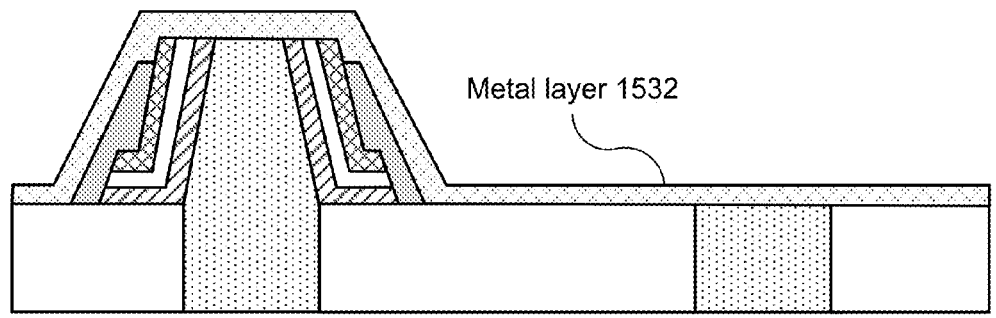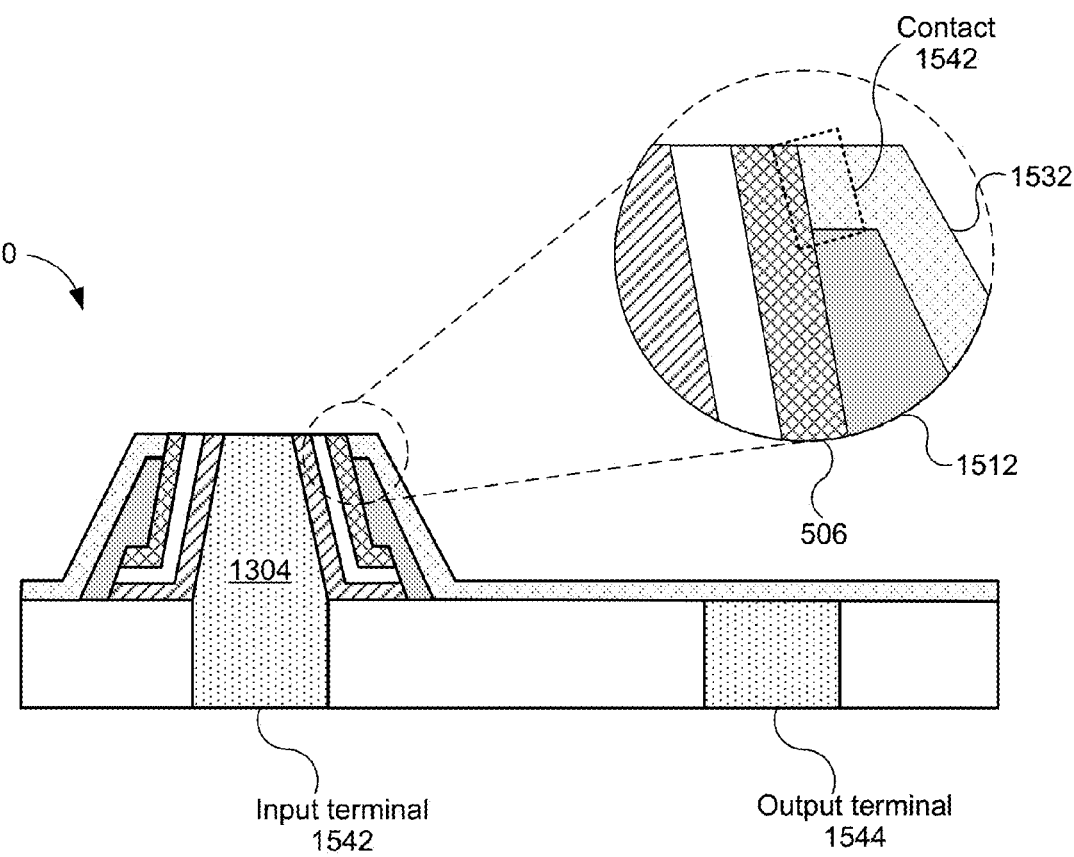
Figure 15B

THREE-DIMENSIONAL (3D) MAGNETIC MEMORY DEVICE COMPRISING A MAGNETIC TUNNEL JUNCTION (MTJ) HAVING A METALLIC BUFFER LAYER

RELATED APPLICATIONS

This application is a continuation-in-part of:
U.S. patent application Ser. No. 15/857,574, entitled "Three-Dimensional Magnetic Memory Devices," filed Dec. 28, 2017;
U.S. patent application Ser. No. 15/858,765, entitled "Methods of Fabricating Three-Dimensional Magnetic Memory Devices," filed Dec. 29, 2017; and
U.S. patent application Ser. No. 15/858,808, entitled "Methods, Devices, and Systems for Utilizing Spin Hall Effect with Three-Dimensional Magnetic Memory Devices," filed Dec. 29, 2017. Each of which is incorporated by reference herein in its entirety.

TECHNICAL FIELD

This relates generally to the field of memory applications, including but not limited to magnetic memory.

BACKGROUND

Magnetoresistive random access memory (MRAM) is a non-volatile memory technology that stores data through magnetic storage elements. MRAM devices store information by changing the orientation of the magnetization of a storage layer. For example, based on whether the storage layer is in a parallel or anti-parallel alignment relative to a reference layer, either a "1" or a "0" can be stored in each MRAM cell.

The field of memory applications is becoming more challenging as the performance requirements for memory-based devices increase. Because of many useful properties of MRAM (e.g., retention of data, resistance to errors, and life span of memory cells), memory systems based on MRAM have superior performance over conventional memory systems.

SUMMARY

There is a need for systems and/or devices with more efficient, accurate, and effective methods for fabricating and/or operating memory systems. Such systems, devices, and methods optionally complement or replace conventional systems, devices, and methods for fabricating and/or operating memory systems.

The present disclosure describes various implementations of MRAM systems and devices. As discussed in greater detail below, MRAM stores data through magnetic storage elements. These elements typically include two ferromagnetic films or layers that can hold a remnant magnetization and are separated by a non-magnetic material. In general, one of the layers has its magnetization pinned (e.g., a "reference layer"), meaning that this layer possesses a large thermal stability and requires a large magnetic field or spin-polarized current to change the orientation of its magnetization. The second layer is typically referred to as the storage, or free, layer and its magnetization direction can be changed by a smaller magnetic field or spin-polarized current relative to the reference layer.

Due to the spin-polarized electron tunneling effect, the electrical resistance of the cell changes due to the relative orientation of the magnetization of the two layers. A memory cell's resistance will be different for the parallel and anti-parallel states and thus the cell's resistance can be used to distinguish between a "1" and a "0". One important feature of MRAM devices is that they are non-volatile memory devices, since they maintain the information even when the power is off. In particular, the layers can be sub-micron in lateral size and the magnetization direction can still be stable over time and with respect to thermal fluctuations.

In particular, the present disclosure describes a three-dimensional MRAM device. In some implementations, the three-dimensional MRAM device is a cylindrical Magnetic Tunnel Junction (MTJ) device. Conventional MTJ devices (e.g., MTJs having layers stacked one on top of another) suffer from poor thermal stability and data retention as device size decreases. Such a result is problematic because size is a fundamental design constraint limiting widespread implementation of MRAM (e.g., in high-density memory arrays). The three-dimensional geometry (e.g., cylindrical geometry) of the MTJ described herein allows for a substantial reduction in device size (e.g., less than 20 nanometers) hardly obtained in conventional MRAM devices. To accomplish this reduction in device size, the three-dimensional MRAM device includes a cylindrical core (e.g., a non-magnetic metal core in the shape of a cylinder) and a plurality of layers that surround the core in succession (e.g., two ferromagnetic layers that can hold a magnetic field separated by a non-magnetic barrier (spacer) material). In such a configuration, each of the plurality of layers is a cylindrical shell with a different radius. The cylindrical nature of the MTJ facilitates size reduction while also maintaining (and in some cases improving) thermal stability and data retention of the MTJ.

Additionally, the present disclosure describes a process of fabricating the three-dimensional MTJ. The process includes starting with a dielectric substrate with a metallic core (e.g., a metal plug) protruding from the dielectric substrate. In such an arrangement, a lower portion of the metallic core is not exposed and an upper portion of the metallic core is exposed. The process further includes depositing a first ferromagnetic layer on the exposed portion of the metallic core (and also exposed portions of the dielectric substrate). Next, the process includes depositing a non-magnetic spacer layer on exposed surfaces of the first ferromagnetic layer. Continuing, the process further includes depositing a second ferromagnetic layer on exposed surfaces of the non-magnetic spacer layer. In doing so, the three-dimensional MTJ includes a cylindrical core and a plurality of magnetic and nonmagnetic layers that surround the core in succession.

Additionally, the present disclosure describes a three-dimensional MTJ that uses the Spin Hall Effect (SHE) to reduce an amount of current needed to switch a magnetic configuration of the MTJ (switch from a parallel state to an anti-parallel state, or vice versa). Reducing a switching current (referred to herein as the spin transfer torque (STT) current, the spin-polarized current, and the tunneling current) using the SHE, at a minimum, prolongs the life of the MTJ. Additionally, the Spin Hall (SH) spin current can jumpstart the switch from one magnetic configuration to another (e.g., reduce a switching time as compared to only using the STT current). To accomplish this, the three-dimensional SHE MRAM device includes a core and a plurality of layers that surround the core in succession, as mentioned above. Additionally, the SHE MRAM device includes a first terminal coupled to the core that receives a first current (e.g., the STT current) and a second terminal couple to the core that receives a second current (e.g., the SHE current). The first current flows away from the core (e.g., radially) through the plurality of layers and imparts a torque on a magnetization of one or more of the layers via spin transfer torque. Moreover, the second current creates a SHE around the perimeter of the core, which contributes to the torque imparted by the first current. Due to the contribution of the SHE, the first current can be reduced. In some implementations, the first and second terminals are the same terminal. Alternatively, in some implementations, the first and second terminals are different terminals.

This disclosure addresses the issue of thermal stability loss that arises with device size reduction in MTJ arrays, which has hampered the implementation of MRAM as a viable DRAM replacement. For example, in planar geometries where the magnetization lies in the thin-film plane, thermal stability derives from shape anisotropy, which can be tuned by changing the in-plane aspect ratio. Scaling this geometry down to sizes less than 30 (or so) nanometers is impractical because large aspect ratios are necessary for proper data retention, even at such small sizes. Similarly, in perpendicular geometries where the magnetization lies out of the thin-film plane, data retention decreases with the area of the device and thermal stability arises from interfacial anisotropy. Thus, the thermal stability of both geometries (in-plane and out-of-plane) is severely limited for small device sizes, thereby presenting a challenge for adopting MRAM for applications such as DRAM.

To overcome these issues, a three-dimensional geometry for spin transfer torque (STT) MRAM is described herein that solves the problem of poor thermal stability of the free layer (also referred to as the storage layer) in magnetic tunnel junction structures with stacked layers. Also, the STT MRAM described herein enables higher data retention in high-density memory arrays. In some implementations, the MTJs described herein have diameters that are less than or approximately equal to 20 nanometers.

As will be discusses in further detail below (e.g., with reference to FIG. 5), in some implementations, the storage layer and the reference layer are concentric cylindrical shells. Moreover, the two layers wrap around a central core in succession, where the central core provides structural support and serves as current lead if metallic. The storage layer and the reference layer are separated by a non-magnetic tunnel barrier (referred to herein as a spacer layer or barrier layer) with high spin polarization, such as Magnesium Oxide (MgO). Depending on magnetic configuration requirements, the reference layer can have a smaller or larger radius relative to a radius of the storage layer. In some implementations, a current is received by the central core. The current flows away from the central core through the layers towards the outermost layer, imparting a torque on the magnetization of the storage layer and the reference layer via spin transfer torque.

A magnetic ground state (also referred to herein as a magnetization orientation) of both the storage layer and reference layer can be chosen to be either in-plane, out-of-plane (along the axis of the core), or vortex. In the latter case, the magnetization wraps itself around the core in a clockwise or counterclockwise manner, depending on the circumstances. In some implementations or instances, both the out-of-plane and vortex magnetic ground states are suitable for writing the parallel (P) and anti-parallel (AP) configurations provided that the reference layer is in the same magnetic ground state as the storage layer. In the vortex same magnetic ground state, P and AP correspond to the two possible chiralities of the storage layer magnetization.

In some implementations, the magnetic ground state of the storage layer and reference layer can be tailored via several parameters, including: (i) exchange energy, (ii) saturation magnetization, (iii) uniaxial anisotropy, (iv) layer thickness, (v) layer height, (vi) radius of the core, and (vii) core height. Both the exchange energy and the saturation magnetization depend on material composition. In some implementations, high exchange energy disfavors the vortex magnetic ground state while high magnetization has the opposite effect. Moreover, increasing the vertical height in comparison to the core radius promotes the perpendicular magnetic ground state. Typically, an elongated cylindrical structure will favor the perpendicular magnetic ground state. The perpendicular magnetic ground state favors a small curvature radius (e.g., Radius X, FIG. 8A). A flattened cylinder favors either the vortex or in-plane magnetic ground state. In this case, a large curvature radius (e.g., Radius Y, FIG. 8B) and/or a low exchange constant favor the vortex magnetic ground state.

In some implementations, the storage and reference layers are made of thin (0.5-10 nm) CoFeB films with various compositions. In some implementations, the boron content of the layers varies between 10% and 40%. In some implementations, the storage and/or reference layers have the following composition $(Co_xFe_{1-x})_{1-y}B_y$.

If the perpendicular magnetic ground state (along the axis of the cylindrical core) is preferred, the material of the storage and/or reference layers needs to be relatively stiff (e.g., have a large exchange constant). In some implementations, an increase in cobalt content increases the exchange constant. In contrast, if the vortex magnetic ground state is preferred, layers with a low exchange energy (or high Fe content) are used. In some implementations, exchange energy is decreased by using a combination (bilayer) of CoFeB and other layers having a lower exchange stiffness, such as permalloy, which lowers the overall exchange stiffness of the layer.

In some implementations, the storage layer is single layer or a composite layer using interspersed layers of Tungsten or Tantalum to tailor the anisotropy of the storage layer. As explained below, the storage layer differs from the reference layer because the reference layer is more thermally stable, which is achieved by changing a composition and/or the thickness of the reference layer. In some implementations, the reference layer is made more thermally stable by making the reference layer in a synthetic anti-ferromagnetic configuration where (typically) two ferromagnetic layers are separated by a thin layer of Ruthenium (or the like). In some implementations, a thickness of the Ruthenium layer ranges from 4 to 8 Angstroms. In some implementations, the layers are coupled via magnetostatic and electronic coupling (e.g., Ruderman-Kittel-Kasuya-Yosida coupling). The result of said coupling is an increase in the thermal stability of the reference layer.

Advantages of the three-dimensional MTJ discussed herein include but are not limited to: (i) higher thermal energy barrier relative to a thermal energy barrier of a traditional planar geometry MTJ with a similar size (additional increases in the thermal energy barrier can be achieved by increasing height), (ii) the three-dimensional MRAM device does not rely on interfacial anisotropy for thermal stability as is the case with traditional perpendicular MTJ's, and therefore the three-dimensional MTJ can use a less complicated/restrictive material set, (iii) thicker ferromagnetic layers facilitate increased tunnel magnetoresistance ratios, and (iv) the three-dimensional MRAM device is compatible with ultra-dense geometries and lends itself well to three-dimensional integration.

This disclosure also addresses issues associated with manufacturing of the three-dimensional cylindrical MRAM device. Traditionally, fabrication of the MRAM device begins with a planar complementary metal-oxide-semiconductor (CMOS) based logic layer, and subsequently the various layers are stacked one after another atop the planar CMOS layer. In contrast, fabrication of the three-dimensional cylindrical MRAM device begins with a CMOS plug (e.g., the central core) protruding from a dielectric substrate. In some implementations, the CMOS plug is made from Tantalum (Ta), Tungsten (W), Copper (Cu), Ruthenium (Ru), and Niobium (Nb), or a combination thereof or a layer of doped Silicon (Si) such as found in vertical transistors. In some implementations, the plug protruding from the dielectric substrate is fabricated by starting with a dielectric substrate. Next, an opening is formed towards the underlying CMOS (transistors) layers (e.g., by forming resist patterning via photolithography and selectively etching the dielectric substrate by using an anisotropic etching technique, such as reactive-ion etching). In some implementations, the opening is then filled with a metal (e.g., the plug materials noted above) by electrodeposition and/or a wet solution based deposition technique. At this stage, the dielectric substrate defines a circular hole filled with metal, which is polished flush with the dielectric substrate. In a subsequent step, the dielectric around the metallic core is removed via selective etching and/or a dry vacuum-based technique such as reactive-ion etching. In some implementations, a wet-based technique such as piranha etch is also used. Thereafter, the metallic core is left protruding from of the dielectric substrate.

Next, the plurality of layers is deposited on the plug in succession via magnetron sputtering at normal incidence to the wafer. In some implementations, the plurality of layers is ordered as follows: a storage layer, a high spin polarization spacer layer (typically MgO), and a reference layer. Alternatively, in some implementations, the plurality of layers is ordered as follows: a reference layer, a high spin polarization spacer layer, and a storage layer. By using magnetron sputtering in combination with the relatively steep plug sidewall angles, it is possible to achieve plug sidewall coverage two to three times smaller than the coverage in the field (e.g., exposed surface 1306 of the dielectric substrate 1302, FIG. 13) and less than on the top of the plug. Consequently, a thickness of the MgO tunnel spacer layer barrier is two-times thinner on the plug sidewalls as compared to its thickness on the plug top or field. As a benefit, the tunneling current via those thicker regions will be exponentially smaller and therefore will not contribute to the resistance of the device with the majority of the current flowing through the sidewall region.

In a subsequent step, parts of the plurality of layers remaining in the field can be removed via a self-aligned process that consists of repeated ion beam etching (IBE) steps and/or reactive-ion etching (RIE) processes combined with oxide sidewall deposition. For example, an oxide layer of appropriate thickness is first deposited on the structure, and then the oxide layer is etched via IBE and/or RIE. This etching removes the oxide layer on top of the plug as well as the oxide layer in the field. Furthermore, portions of the plurality of layers on top of the plug and in the field are also removed by the same process but part of the oxide layer and the plurality of layers remain unhindered on the sidewalls of the plug. Optionally, the oxide deposition and etch process is repeated to achieve desired results. Thereafter, a physical vapor deposition (PVD) dielectric encapsulation step is performed in such a way that the oxide layer in the field is less than the height of the plug. Moreover, in some implementations, the oxide layer on the sidewalls of the plug is removed by etching with IBE at glancing incidence. In some implementations, the oxide layer removal is performed in such a way as to leave some oxide layer on the top of the plug, which prevents the structure from shorting. In some implementations, a top electrode is deposited on the top of the plug and patterned (Route 1, FIG. 14C). In some implementations, a variant where the contact runs on the sidewalls and down to the field is also described herein (Route 2, FIG. 15B).

Advantages of the fabrication process discussed herein include, but are not limited to: (i) fabrication of cylindrical MRAM devices with high thermal stability at small sizes, (ii) self-aligned process that requires one photolithographic step, (iii) process is compatible with high density pillar arrays (e.g., an array of cylindrical MTJ can be fabricated using this process), (iv) process lends itself well with vertical transistor architectures as the plurality of layers wrap around the vertical transistor channel in some implementations, and (v) no masking is required.

This disclosure also describes a three-dimensional MRAM device that uses the Spin Hall Effect (SHE) to reduce a switching voltage. The three-dimensional MRAM device has the same structure to the three-dimensional MRAM device discussed above. However, an additional current is included (the SHE current), which flows along the central core and generates a spin current that imparts a spin torque on the storage layer. The spin polarization of the SHE-electrons wraps around the central core in a circular manner, akin to one of the possible ground state configurations such as the vortex magnetic ground state of the storage layer. In some implementations, the SHE-electrons are transmitted to the storage layer and impart a torque on the storage layer. Importantly, the SH current can reduce the STT current without the SHE current passing through the tunnel spacer layer barrier.

Optionally, if the storage layer is in the perpendicular magnetic ground state, the SHE-electrons provide a spike of orthogonal spin-polarized electrons to the storage layer that jumpstart its precession from a first direction of magnetization to a second direction of magnetization. In some implementations, to maximize the effect of the spike, the SHE current is a short pulse, relative to the precession period of the storage layer. Optionally, if the storage layer is in the vortex magnetic ground state, the SHE-electrons impart the same type of spin torque on the storage layer as the STT current, such that the two contributions—from STT and SHE—can simply be added together. In some implementations, the effect of the SHE-electrons increases with the length of the SHE current pulse. It is noted that in the vortex magnetic ground state, the SHE-electrons will either stabilize (if they have the same chirality relative to a chirality of the storage layer) or they will tend to switch the storage layer (if they have the opposite chirality relative to the chirality of the storage layer). In some implementations, the chirality of the SHE is controlled by controlling the sign of the current through the core.

It is noted that the circular structure of the three-dimensional MRAM device described herein is well suited for the SHE. For example, in planar geometry MRAM device, SHE-electrons are extracted from one side of the current-currying lead, and as a result, the SHE-electrons on the other side(s) are effectively wasted. In contrast, the population of SHE-electrons is transmitted to the storage layer due to the circular geometry of the three-dimensional MRAM device described herein. Moreover, the three-dimensional MRAM device is a three-terminal device (e.g., a first terminal connected to a first end of the core, a second terminal connected to a second end of the core, and a third terminal connected to an outer layer of the MRAM device). The first and second terminals are used to create the SHE and the third terminal creates the STT current. Because the STT current passes through the spacer layer, a resistance associated with the STT current is larger than resistances associated with the SHE current. Consequently, the STT current passed through the magnetic tunnel junction structure is small compared to the SHE currents passed through core. Moreover, from Kirkhoff's law, a current originating from the first terminal is approximately the same as a current originating form the second terminal (e.g., treat these two currents as the same current: the "Spin Hall current"). Thus, the three-dimensional MRAM device operates with two different currents: a "Spin Hall" current that flows between first and second terminals, and a smaller current that flows through the magnetic tunnel junction structure. In some implementations, the sign of these currents determines their respective direction of flow.

In some implementations, the SHE current pulse coincides with the STT current pulse through the magnetic tunnel junction structure. Moreover, in the case of a perpendicular magnetic ground state, where the SHE-electrons provide orthogonal spins to jumpstart the switching process with a SHE spike, this "spike" occurs at the beginning of the STT current.

Advantages of the three-dimensional MTJ with the SHE discussed herein include but are not limited to: (i) a reduction of the voltage requirement across the spacer layer, and correspondingly, a reduction of the STT current, and (ii) a facilitation of faster switching of the device from a first magnetization direction to a second magnetization direction (e.g., switching time from state 1012 to state 1014, FIG. 10B), especially when the MRAM device is in the perpendicular magnetic ground state.

This disclosure also discloses a metallic buffer layer disposed between the cylindrical core and the first ferromagnetic layer. To provide some context, the thermal stability in conventional perpendicular MTJ's relying on perpendicular interfacial anisotropy (PMA) is highly reduced at small sizes, which is an obvious roadblock towards achieving high density memories. The three-dimension MTJ discussed above scales much better than conventional perpendicular MTJs towards small sizes. Additionally, the three-dimension MTJ disclosed herein may, in certain instances, display spin torque threshold switching voltages (Vc0) that are several times smaller than conventional perpendicular MTJs. However, while a higher perpendicular interfacial anisotropy is sought after in conventional perpendicular MTJs and perpendicular shape anisotropy MTJ's because it imparts higher thermal stability, it is problematic in the three-dimension MTJs discussed herein. Thus, below is described a structure where the contribution of the interfacial anisotropy can be either minimized or its sign can be potentially reversed via the use of appropriate buffer layers, thereby contributing to the overall energy barrier of the device.

It is noted that this problem has not been addressed in the past since in conventional planar perpendicular MTJs, higher PMA is desirable. In contrast, with the three-dimension MTJ discussed herein, PMA is detrimental to the thermal stability due to the unique geometry of the MTJ.

Accordingly, in this modified three-dimension MTJ, the free layer, barrier layer and reference layers are wrapped in a concentric fashion around a central metallic core. The desired magnetic "easy" axis direction is along the axis of the core and is imparted via the shape aspect ratio of the three-dimension MTJ. In this preferred magnetic configuration, the magnetization lies parallel to the interfaces between the various layers. With traditional buffer layers such as Ta or TaN, the interfacial anisotropy is along a direction perpendicular to the interfaces and it favors a magnetization that lies in the plane or perpendicular to the axis of the core. Unfortunately, with the geometry of the three-dimension MTJ, the interfacial anisotropy contribution is proportional to the surface area of the three-dimension MTJ, and as a result, the interfacial anisotropy contribution can be predominant.

In thin film form this interfacial contribution has been shown to be extremely sensitive to the nature of the interfaces, it is for instance well documented that bonding at the CoFeB/MgO interface, namely Fe—O hybridization can give rise to a substantial anisotropy contribution perpendicular to the interface. Furthermore, the use of Tantalum (Ta) buffer layers has been shown to also further the PMA (it is noted that, under the current understanding, PMA is created due to high spin orbit coupling in Ta, combined with an ability to soak Boron and foster crystallization at the CoFeB/MgO interface). Conversely, some metallic buffer layers are poor at promoting this anisotropy and/or trigger a change in the sign of the anisotropy constant. Such materials can include but are not limited to aluminum, magnesium, ruthenium, and rhodium. Accordingly, the modified three-dimension MTJ described herein includes a buffer layer that maintains the magnetization pointing parallel to the interfaces of the system (i.e., to prevent the interfacial anisotropy from predominating). Further, since this direction is also the easy axis direction promoted by the shape anisotropy of the device, such an arrangement can increase the thermal stability of the structure and also help achieve large values of delta at those small sizes (>60 kT at 10-20 nm width). For example, a higher delta can be obtained by using this method than by just increasing the vertical shape anisotropy. This can be accomplished with either a null or a small increase in lateral size of the three-dimensional MTJ.

In one aspect, some implementations include magnetic memory device comprising: (i) a cylindrical core, (ii) a first cylindrical ferromagnetic layer that surrounds the cylindrical core, (iii) a spacer layer that surrounds the first cylindrical ferromagnetic layer; and (iv) a second cylindrical ferromagnetic layer that surrounds the spacer layer. The cylindrical core, the first cylindrical ferromagnetic layer, the spacer layer, and the second cylindrical ferromagnetic layer collectively form a magnetic tunnel junction.

In another aspect, some implementations include a method of fabricating a magnetic memory device comprising providing a dielectric substrate with a metallic core protruding from the dielectric substrate, wherein: (i) a first portion of the metallic core is surrounded by the dielectric substrate and a second portion of the metallic core protrudes away from a surface of the dielectric substrate, and (ii) the second portion of the metallic core comprises: (a) a surface offset from the surface of the dielectric substrate and (b) sidewalls extending away from the surface of the dielectric substrate to the offset surface. The method further includes depositing a first ferromagnetic layer on first exposed surfaces of the metallic core and the dielectric substrate, depositing a spacer layer on second exposed surfaces of the first ferromagnetic layer, and depositing a second ferromagnetic layer on third exposed surfaces of the spacer layer. The first ferromagnetic layer, the spacer layer, and the second ferromagnetic layer each substantially conforms to a shape of the first exposed surfaces.

In yet another aspect, some implementations include a magnetic memory device comprising: (i) a core, (ii) a plurality of layers that surround the core in succession, (iii) a first input terminal coupled to the core, and (iv) a second input terminal coupled to the core. The first input terminal is configured to receive a first current, where (a) the first current flows radially from the core through the plurality of layers and (b) the radial flow of the first current imparts a torque on, at least, a magnetization of an inner layer of the plurality of layers. Further, the second input terminal is configured to receive a second current, where (a) the second current imparts a Spin Hall Effect (SHE) around a perimeter of the core and (b) the SHE imparted around the perimeter of the core contributes to the torque imparted on the magnetization of the inner layer by the first current. In some implementations, the plurality of layers includes a first ferromagnetic layer, a spacer layer, and a second ferromagnetic layer, and the inner layer is the first ferromagnetic layer. Further, in some implementations, the first ferromagnetic layer is a storage layer and the second ferromagnetic layer is a reference layer (or vice versa).

In yet another aspect, some implementations include a magnetic memory device comprising: (i) a cylindrical core, (ii) a metallic buffer layer that surrounds the cylindrical core, (iii) a first ferromagnetic layer that surrounds the metallic buffer layer, (iv) a barrier layer that surrounds the first ferromagnetic layer, and (v) a second ferromagnetic layer that surrounds the barrier layer. The cylindrical core, the metallic buffer layer, the first ferromagnetic layer, the barrier layer, and the second ferromagnetic layer collectively form a magnetic tunnel junction.

Thus, devices and systems are provided with methods for fabricating and operating magnetic memory, thereby increasing the effectiveness, efficiency, and user satisfaction with such systems and devices.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

For a better understanding of the various described implementations, reference should be made to the Description of Implementations below, in conjunction with the following drawings in which like reference numerals refer to corresponding parts throughout the figures.

FIGS. 6A-6D are cross-sectional views of the cylindrical three-dimensional MRAM device of FIG. 5 having different magnetization orientations in accordance with some implementations.

FIGS. 13, 14A-C and 15A-B illustrate a process of fabricating the three-dimensional MRAM device of FIG. 5 in accordance with some implementations.

Like reference numerals refer to corresponding parts throughout the several views of the drawings.

DETAILED DESCRIPTION

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

Conventional MRAM devices (e.g., stacked MTJs) generally have poor thermal stability and data retention when device size is decreased. Cylindrical MRAM devices described herein allow for a substantial reduction in size (e.g., less than 20 nanometers) while also maintaining (and in some cases improving) thermal stability and data retention of the MRAM device. An exemplary cylindrical MRAM device includes a central core and a plurality of layers that surround the core in succession (e.g., two ferromagnetic layers that can hold a magnetic field separated by a spacer layer). In some implementations, magnetization orientation of the two ferromagnetic layers is based, at least in part, on the characteristics of the two ferromagnetic layers. In some implementations, the characteristics of the two ferromagnetic layers include but are not limited to (i) thicknesses of the first and second cylindrical ferromagnetic layers and (ii) heights of the first and second cylindrical ferromagnetic layers, respectively, impact the magnetization orientation of the two ferromagnetic layers. Additionally, in some implementations, the magnetization orientation of the two ferromagnetic layers is further based on characteristics of the cylindrical core. In some implementations, the characteristics of the cylindrical core include but are not limited to: (i) a radius of the cylindrical core and (ii) a height of the cylindrical core.

Figure 1A:
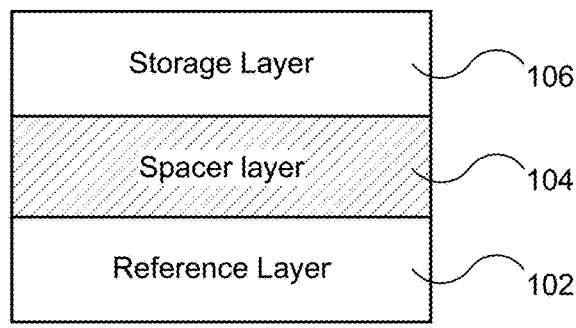
FIG. 1A illustrates a schematic diagram of a representative magnetic tunnel junction (MTJ) structure in accordance with some implementations.

FIG. 1A is schematic diagram of a magnetic tunnel junction (MTJ) structure 100 (e.g., for use in an MRAM device) in accordance with some implementations. In accordance with some implementations, the MTJ structure 100 is composed of a first ferromagnetic layer (reference layer 102), a second ferromagnetic layer (storage layer 106), and a non-magnetic layer (spacer layer 104). The reference layer 102 is also sometimes referred to as a pinned or fixed layer. The storage layer 106 is also sometimes referred to as a free layer. The spacer layer 104 is also sometimes referred to as a barrier layer (or a non-magnetic spacer layer). In some implementations, the spacer layer 104 comprises an electrically-insulating material such as silicon oxide.

In some implementations, the reference layer 102 and the storage layer 106 are composed of the same ferromagnetic material. In some implementations, the reference layer 102 and the storage layer 106 are composed of different ferromagnetic materials. In some implementations, the reference layer 102 is composed of a ferromagnetic material that has a higher coercivity than the storage layer 106. In some implementations, the reference layer 102 and the storage layer 106 are composed of different ferromagnetic materials with the same or similar thicknesses (e.g., within 10%, 5%, or 1% of one another). In some implementations, the thickness of the reference layer 102 is different from that of the storage layer 106 (e.g., the reference layer 102 is thicker than the storage layer 106). In some implementations, the thickness of the spacer layer 104 is on the order of a few atomic layers. In some implementations, the thickness of the spacer layer 104 is on the order of a few nanometers (nm). In some implementations, thicknesses of the reference layer 102, the spacer layer 104, and the storage layer 106 are uniform. In some implementations, thicknesses of the reference layer 102, the spacer layer 104, and the storage layer 106 are not uniform (e.g., a first portion of the spacer layer 104 is thinner relative to a second portion of the spacer layer 104).

In some implementations, the reference layer 102 and/or the storage layer 106 is composed of two or more ferromagnetic layers separated from one another with spacer layers. In some implementations, each of these ferromagnetic layers is composed of identical, or varying, thickness(es) and/or material(s). In some implementations, the spacer layers are composed of identical, or varying, thickness(es) and/or material(s) with respect to one another.

Figure 1B:
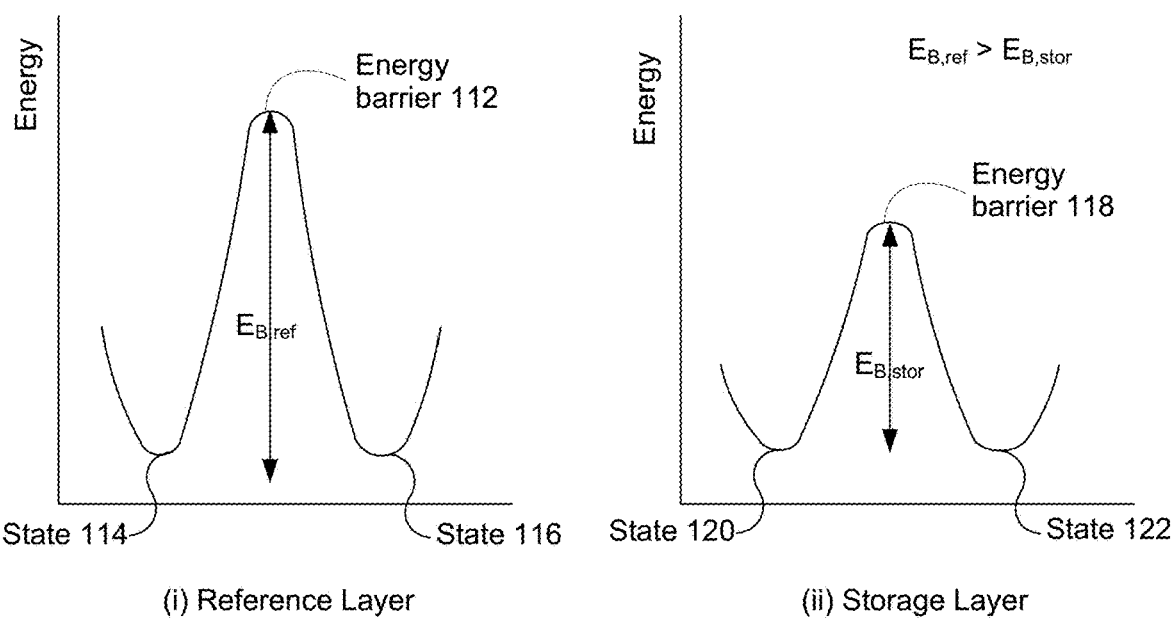
FIG. 1B illustrates representative energy barriers of the reference and storage layers of the MTJ of FIG. 1A in accordance with some implementations.
Figure 10B:
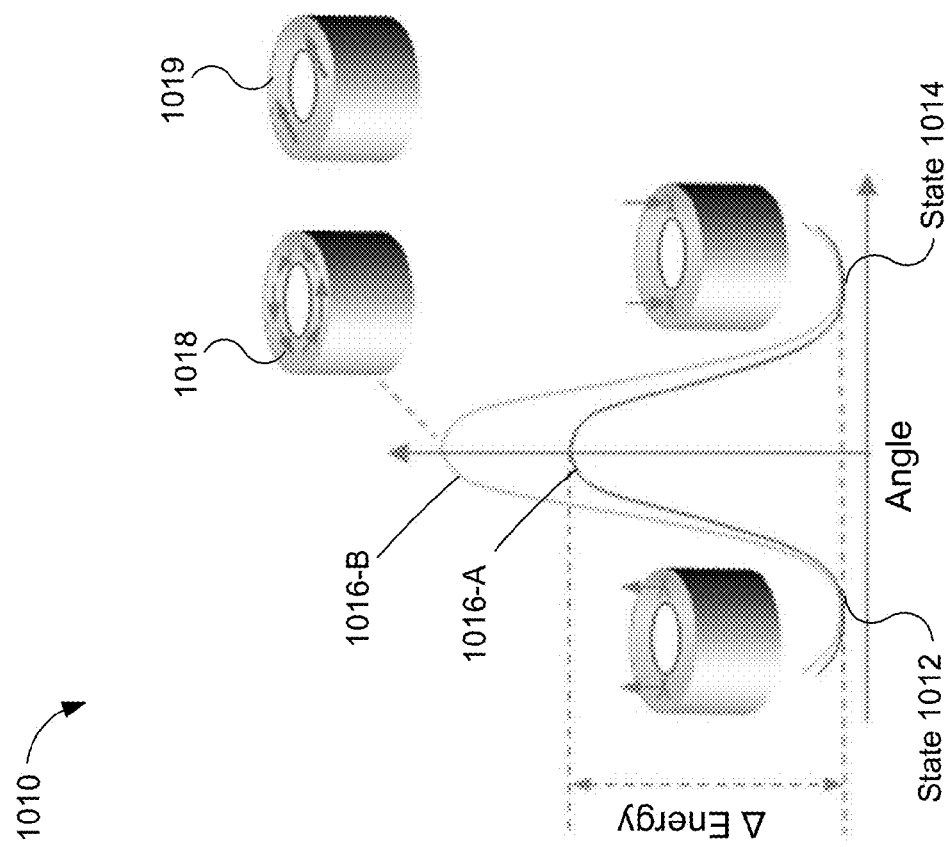
FIGS. 10A-10B illustrate energy barriers of the cylindrical MTJ structure based on magnetization orientations in accordance with some implementations.
Figure 10A:
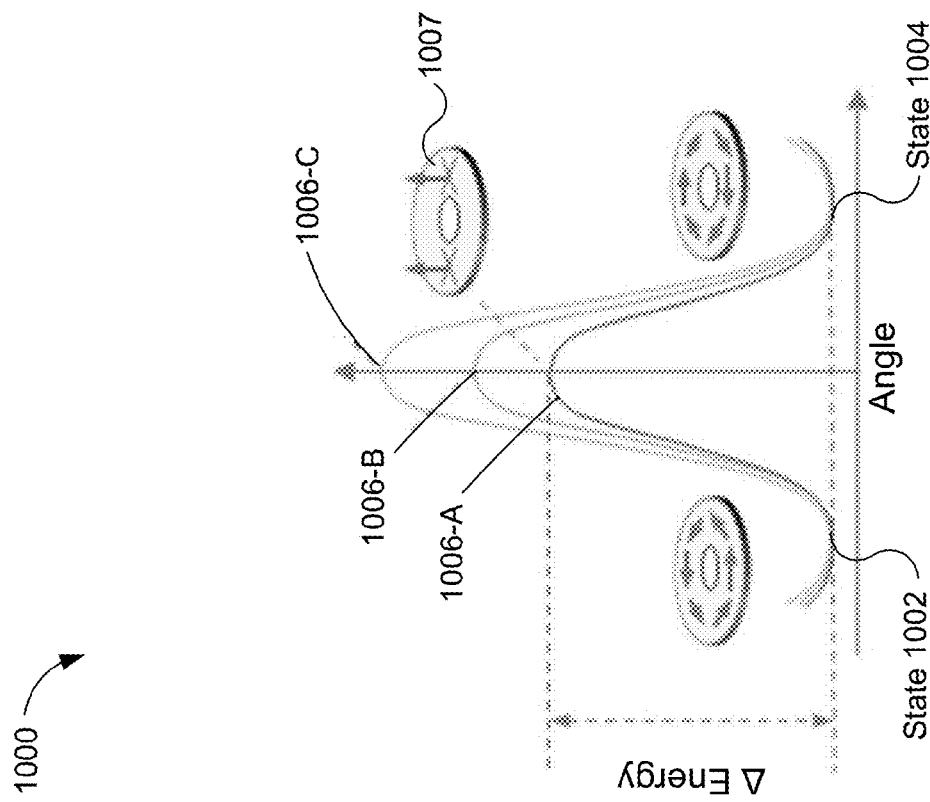

Magnetic anisotropy refers to the directional dependence of a material's magnetic properties. The magnetic moment of magnetically anisotropic materials will tend to align with an "easy axis," which is the energetically favorable direction of spontaneous magnetization. In some implementations and instances, the two opposite directions along an easy axis are equivalent, and the direction of magnetization can be along either of them (and in some cases, about them). For example, in accordance with some implementations, FIG. 1B shows low energy states 114 and 116 corresponding to opposite directions along an easy axis (additional examples are shown in FIGS. 10A-10B with reference to a cylindrical three-dimensional MTJ structure).

In some implementations, the MTJ structure 100 is an in-plane MTJ. In this instance, the magnetic moments of the reference layer 102 and the storage layer 106, and correspondingly their magnetization direction, are oriented in the plane of the ferromagnetic films of the reference layer 102 and the storage layer 106.

In some implementations, the MTJ structure 100 is a perpendicular (or out-of-plane) MTJ. In this instance, the magnetic moments of the reference layer 102 and the storage layer 106, and correspondingly their magnetization direction, are oriented perpendicular and out-of-plane to the ferromagnetic films of the reference layer 102 and the storage layer 106.

In some implementations, the MTJ structure 100 has preferred directions of magnetization at arbitrary angles with respect to the magnetic films of the reference layer 102 and the storage layer 106.

In accordance with some implementations, an MRAM device provides at least two states such that they can be assigned to digital signals "0" and "1," respectively. One storage principle of an MRAM is based on the energy barrier required to switch the magnetization of a single-domain magnet (e.g., switch the magnetization of the storage layer 106) from one direction to the other.

FIG. 1B shows representative energy barriers of the reference layer 102 and the storage layer 106 of the MTJ 100 in accordance with some implementations. In accordance with some implementations, the energy barrier refers the amount of energy the magnetic material must overcome in order to switch from one magnetization direction to its opposite (e.g., from the state 114 to the state 116). In an MRAM device, the magnetization direction of the reference layer 102 is generally considered fixed, while the magnetization direction of the storage layer 106 is varied to store the "0" and "1" states. Accordingly, the reference layer 102 is composed of materials such that an energy barrier 112 ($E_{B, ref}$) of the reference layer 102 is larger than the energy barrier 118 ($E_{B, stor}$) of the storage layer 106. In particular, FIG. 1B shows low energy states 114 and 116 for the reference layer 102 separated by the energy barrier 112, and shows low energy states 120 and 122 for the storage layer 106 separated by the energy barrier 118. In some implementations, the storage layer 106 is designed with materials that have a magnetic anisotropy that is high enough to store the magnetization over certain time duration (for e.g., 1 week, 1 month, 1 year, or 10 years).

For an MRAM device with the MTJ structure 100, the resistance states of the MRAM devices are different when the magnetization directions of the reference layer 102 and the storage layer 106 are aligned in a parallel (low resistance state) configuration or in an anti-parallel (high resistance state) configuration, as will be discussed with respect to FIGS. 2A and 2B.

Figure 2A:
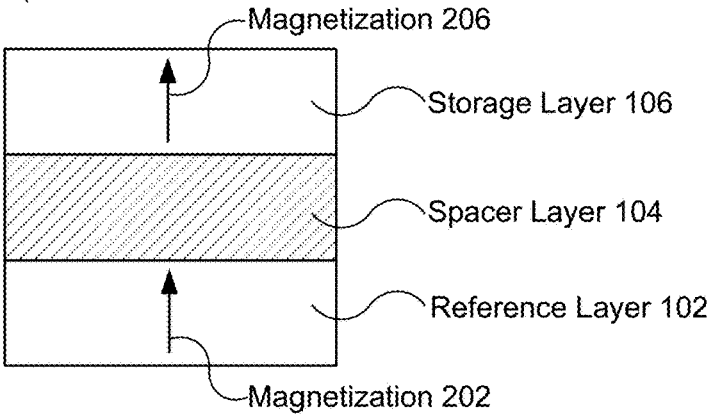
FIGS. 2A-2B illustrate magnetization orientations in a representative perpendicular magnetic tunnel junction (pMTJ) structure in accordance with some implementations.
Figure 2B:
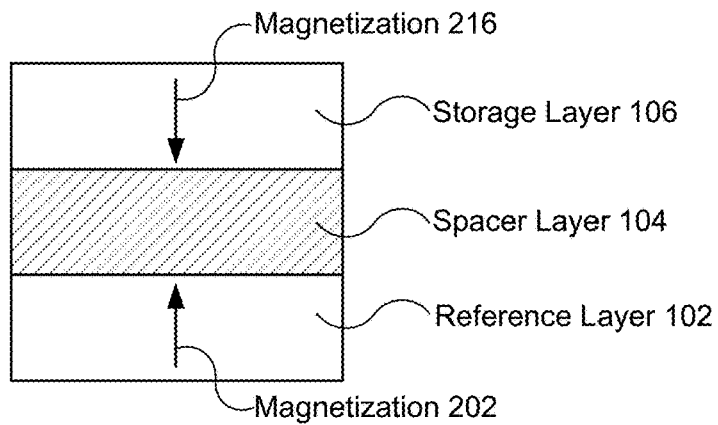

FIGS. 2A-2B illustrate magnetization orientations in a perpendicular magnetic tunnel junction (pMTJ) structure 200 in accordance with some implementations. In some implementations, the pMTJ structure 200 is the same as the MTJ structure 100 presented in FIG. 1A, comprising: the reference layer 102, the spacer layer 104, and the storage layer 106. In some implementations, the pMTJ structure 200 forms part of a MRAM device.

For the pMTJ structure 200 illustrated in FIGS. 2A and 2B, the fixed magnetization direction 202 for the reference layer 102 is chosen to be in an upward direction and is represented by an up arrow. In some implementations (not shown), the fixed magnetization direction of the reference layer 102 in the pMTJ structure 200 is in a downward direction.

FIG. 2A illustrates the magnetization directions of the storage and reference layers in a parallel configuration. In the parallel configuration, the magnetization direction 206 of the storage layer 106 is the same as the magnetization direction 202 of the reference layer 102. In this example, the magnetization direction 202 of the reference layer 102 and the magnetization direction 206 of the storage layer 106 are both in the upward direction. The magnetization direction of the storage layer 106 relative to the fixed layer 102 changes the electrical resistance of the pMTJ structure 200. In accordance with some implementations, the electrical resistance of the pMTJ structure 200 is low when the magnetization direction of the storage layer 106 is the same as the magnetization direction 202 of the reference layer 102. Accordingly, the parallel configuration is also sometimes referred to as a "low (electrical) resistance" state.

FIG. 2B illustrates the magnetization directions of the storage and reference layers in an anti-parallel configuration. In the anti-parallel configuration, the magnetization direction 216 of the storage layer 106 is opposite to the "fixed" magnetization direction 202 of the reference layer 102. In accordance with some implementations, the electrical resistance of the pMTJ structure 200 is high when the magnetization direction 216 of the storage layer 106 is the opposite of the magnetization direction 202 of the reference layer 102. Accordingly, the anti-parallel configuration is sometimes also referred to as a "high (electrical) resistance" state.

Thus, by changing the magnetization direction of the storage layer 106 relative to that of the reference layer 102, the resistance states of the pMTJ structure 200 can be varied between low resistance to high resistance, enabling digital signals corresponding to bits of "0" and "1" to be stored and read. Conventionally, the parallel configuration (low resistance state) corresponds to a bit "0," whereas the anti-parallel configuration (high resistance state) corresponds to a bit "1".

Although FIGS. 2A-2B show parallel and anti-parallel configurations with the pMTJ structure 200, in some implementations, an in-plane MTJ structure, or an MTJ structure with an arbitrary preferred angle, is used instead.

FIGS. 3A-3D illustrate representative processes for switching the pMTJ 200 between the parallel and anti-parallel configurations in accordance with some implementations. In accordance with some implementations, spin-transfer torque (STT) is used to modify the magnetization directions of an MTJ. STT is an effect in which the magnetization direction of a ferromagnetic layer in an MTJ is modified using a spin-polarized current.

In general, electrons possess a spin, a quantized number of angular momentum intrinsic to the electron. An electrical current is generally unpolarized, e.g., it consists of 50% spin up and 50% spin down electrons. When a current is applied though a ferromagnetic layer, the electrons are polarized with spin orientation corresponding to the magnetization direction of the ferromagnetic layer, thus producing a spin-polarized current (or spin-polarized electrons).

As described earlier, the magnetization direction of the reference layer 102 is "fixed" in an MTJ (e.g., the applied currents are insufficient to change the magnetization state of the reference layer). Therefore, spin-polarized electrons may be used to switch the magnetization direction of the storage layer 106 in the MTJ (e.g., switch between parallel and anti-parallel configurations).

As will be explained in further detail, when spin-polarized electrons travel to the magnetic region of the storage layer 106 in the MTJ, the electrons will transfer a portion of their spin-angular momentum to the storage layer 106, to produce a torque on the magnetization of the storage layer 106. When sufficient torque is applied, the magnetization of the storage layer 106 switches, which, in effect, writes either a "1" or a "0" based on whether the storage layer 106 is in the parallel or anti-parallel configuration relative to the reference layer.

Figure 3A:
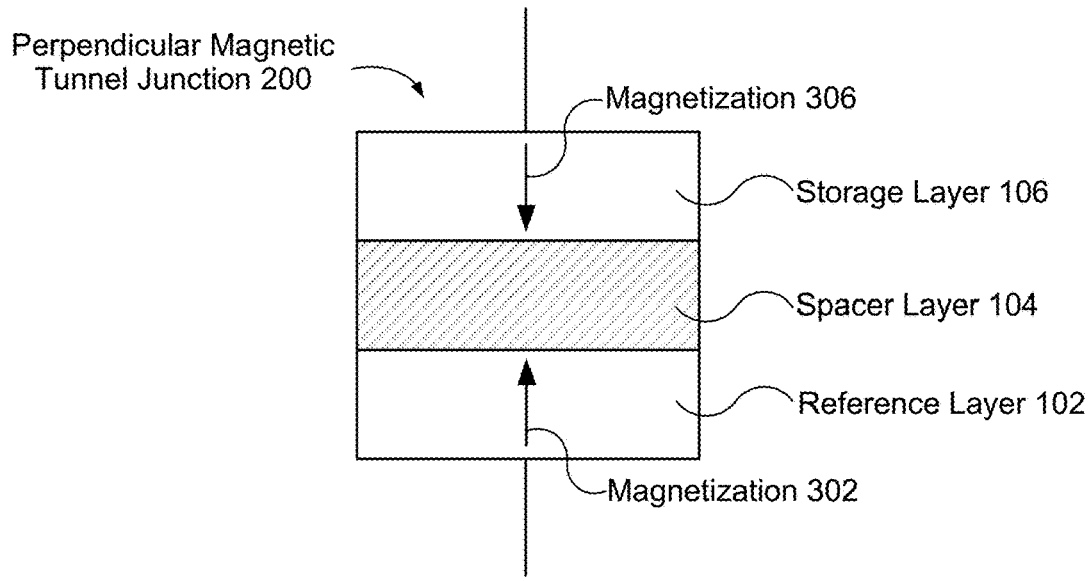
FIGS. 3A-3D illustrate representative processes for switching the pMTJ of FIGS. 2A-2B between the parallel and anti-parallel configurations in accordance with some implementations.
Figure 3B:
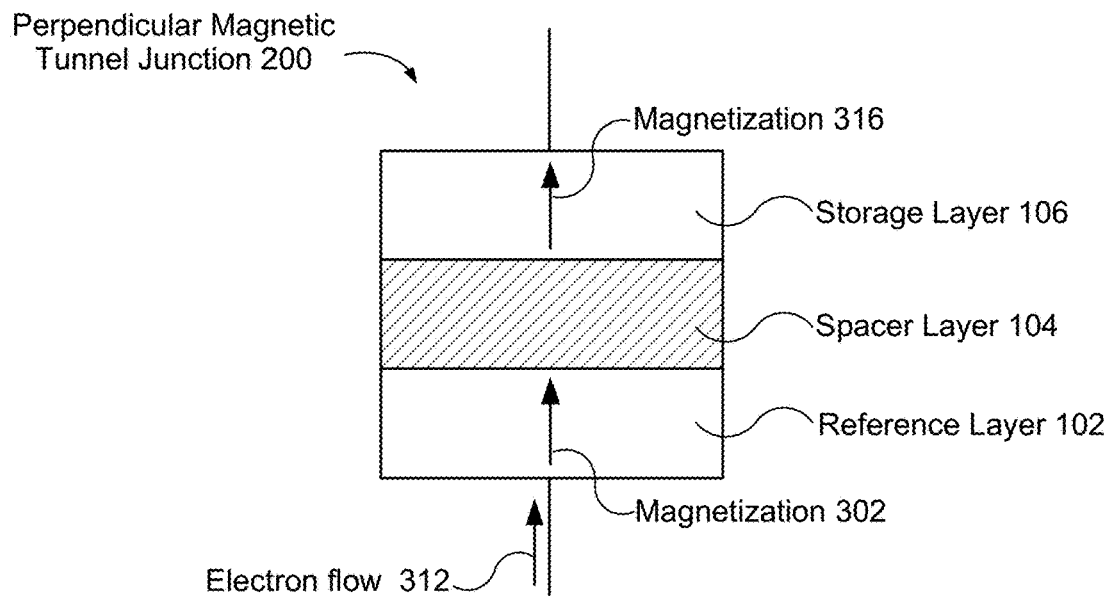

FIGS. 3A-3B illustrate the process of switching from the anti-parallel configuration to the parallel configuration. In FIG. 3A, the pMTJ structure 200 is in the anti-parallel configuration, e.g., the magnetization direction 302 of the reference layer 102 is opposite to the magnetization direction 306 of the storage layer 106.

FIG. 3B shows application of a current such that electrons flow through the pMTJ 200 in accordance with electron flow 312. The electrons are directed through the reference layer 102 which has been magnetized with the magnetization direction 302. As the electrons flow through the reference layer 102, they are polarized (at least in part) by the reference layer 102 and have spin orientation corresponding to the magnetization direction 302 of the reference layer 102. The majority of the spin-polarized electrons tunnel through the spacer layer 104 without losing their polarization and subsequently exert torque on the orientation of magnetization of the storage layer 106. When a sufficiently large current is applied (e.g., a sufficient number of polarized electrons flow into the storage layer 106), the spin torque flips, or switches, the magnetization direction of the storage layer 106 from the magnetization direction 306 in FIG. 3A to the magnetization direction 316 in FIG. 3B.

Thus, as shown in FIG. 3B, the magnetization direction 316 of the storage layer 106 is in the same (upward) direction as the magnetization direction 302 of the reference layer 102. Accordingly, the pMTJ structure 200 in FIG. 3B is in the parallel (low resistance state) configuration. In some implementations and instances, electrons that possess spins in the minority (opposite) direction are reflected at the barrier interfaces and exert torque on the magnetization direction 302 of the reference layer 102. However, the magnetization direction 302 of the reference layer 102 is not switched because the torque is insufficient to cause switching in the reference layer 102.

Figure 3C:
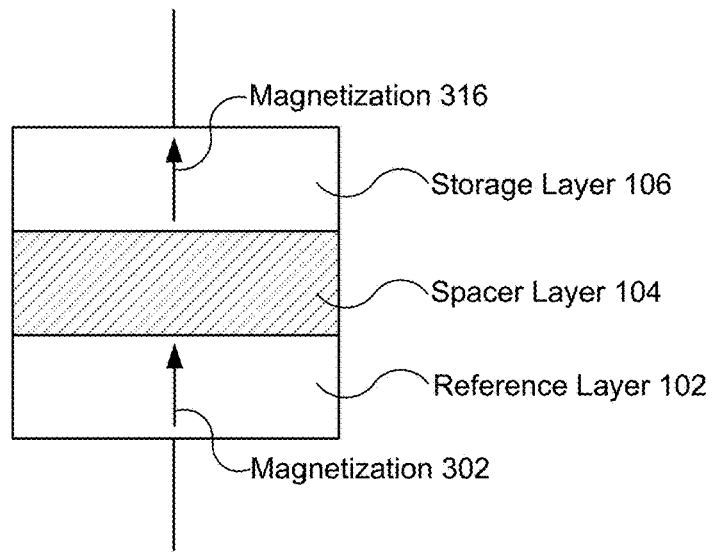
Figure 3D:
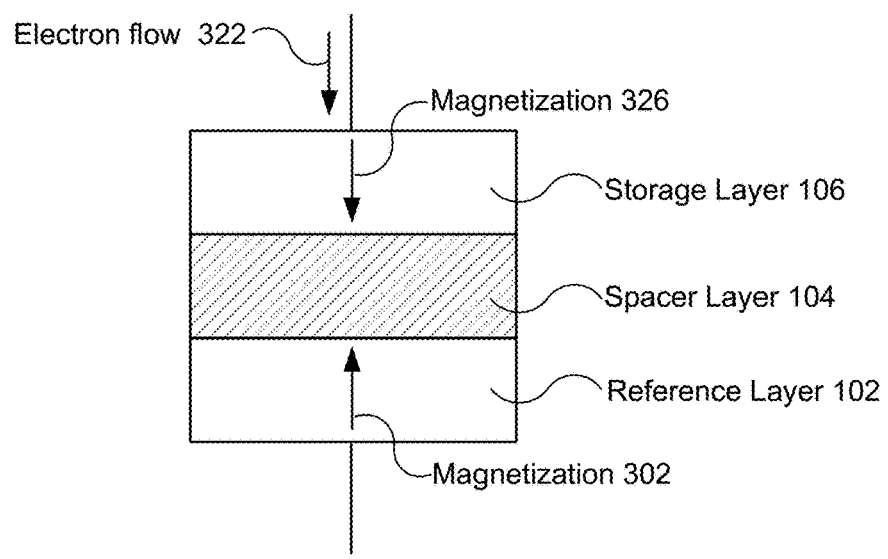

FIGS. 3C-3D illustrate the process of switching from the parallel configuration to the anti-parallel configuration. In FIG. 3C, the pMTJ structure 200 is in the parallel configuration. To initiate switching to the anti-parallel configuration, a current is applied such that electrons flow in accordance with electron flow 322 in FIG. 3D. The electrons flow from the storage layer 106 to the reference layer 102. As the electrons flow through the storage layer 106, they are polarized by the storage layer 106 and have spin orientation corresponding to the magnetization direction 316 of the storage layer 106.

The MTJ structure 200 in FIG. 3C is in the parallel (low resistance state) configuration and thus it has lower electrical resistance, therefore, in some implementations and instances, the majority of the spin-polarized electrons tunnel through the spacer layer 104. Minority spin electrons that are polarized with direction opposite to the magnetization direction 316 of the storage layer 106 are reflected at the barrier interfaces of the spacer layer 104. The reflected spin electrons then exert torque on the magnetization 316 of the storage layer 106, eventually leading to a switch of the magnetization direction 316 of the storage layer 106 in FIG. 3C to a magnetization direction 326 in FIG. 3D. Thus, the pMTJ structure 200 is switched from the parallel (low resistance state) configuration to the anti-parallel (high resistance state) configuration.

Accordingly, STT allows switching of the magnetization direction of the storage layer 106. MRAM devices employing STT (e.g., STT-MRAM) offer advantages including lower power consumption, faster switching, and better scalability, over conventional MRAM devices that use magnetic field to switch the magnetization directions. STT-MRAM also offers advantages over flash memory in that it provides memory cells with longer life spans (e.g., can be read and written to more times compared to flash memory).

Figure 4:
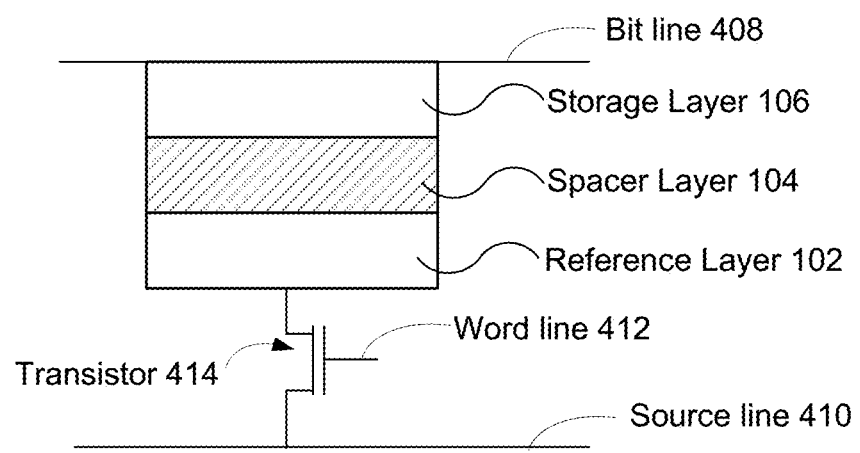
FIG. 4 is a schematic diagram of a representative spin transfer torque (STT) MRAM device in accordance with some implementations.

FIG. 4 is a schematic diagram of a spin transfer torque (STT) MRAM device 400 in accordance with some implementations. The includes an MTJ device with the reference layer 102, the spacer layer 104, the storage layer 106, and an access transistor 414. The MTJ device is coupled to a bit line 408 and a source line 410 via transistor 414, which is operated by a word line 412. The reference layer 102, the spacer layer 104, and the storage layer 106 compose the MTJ structure 100 and/or the pMTJ structure 200, as described above with reference to FIGS. 1-3. In some implementations, the STT-MRAM 400 includes additional read/write circuitry, one or more additional transistors, one or more sense amplifiers, and/or other components (not shown).

The MTJ structure 100 and/or the pMTJ structure 200 is also sometimes referred to as an MRAM cell. In some implementations, the STT-MRAM 400 contains multiple MRAM cells (e.g., hundreds or thousands of MRAM cells) arranged in an array coupled to respective bit lines and source lines. During a read/write operation, a voltage is applied between the bit line 408 and the source line 410 (e.g., corresponding to a "0" or "1" value), and the word line 412 enables current to flow between the bit line 408 to the source line 410. In a write operation, the current is sufficient to change a magnetization of the storage layer 106 and thus, depending on the direction of electron flow, bits of "0" and "1" are written into the MRAM cell (e.g., as illustrated in FIGS. 3A-3D). In a read operation, the current is insufficient to change the magnetization of the storage layer 106. Instead, a resistance across the MRAM cell is determined. e.g., with a low resistance corresponding to a logical "0" and a high resistance corresponding to a logical "1."

Figure 5:
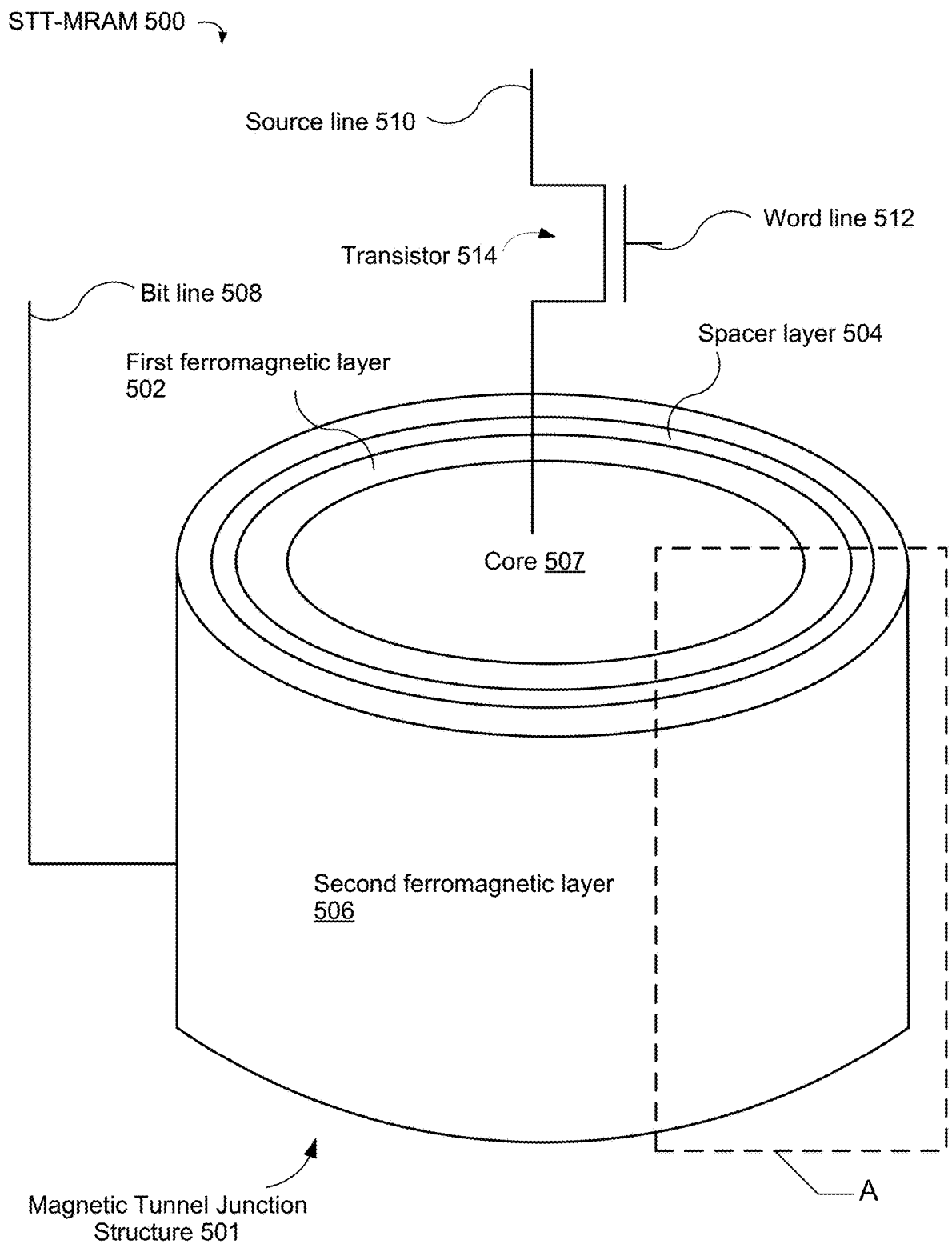
FIG. 5 shows an exemplary cylindrical three-dimensional MRAM device in accordance with some implementations.

FIG. 5 illustrates a three-dimensional STT MRAM device 500 in accordance with some implementations (also referred to herein as a cylindrical MRAM device or a conical MRAM device). The MRAM device 500 is similar to the MTJ structures and devices explained above with reference to FIGS. 1-4, except that the MRAM device 500 includes a plurality of layers (e.g., the reference layer 102, the spacer layer 104, and the storage layer 106, FIG. 1A) wrapped around a central core 507, thereby forming a three-dimensional cylindrical (or conical) MTJ structure 501. In some implementations, each of the plurality of layers, when wrapped around the central core 507, is a hollow cylinder (e.g., a cylindrical shell). Alternatively, in some implementations, each of the plurality of layers is a conical shell when wrapped around the central core 507.

The MTJ device 500 includes a core 507, a first cylindrical ferromagnetic layer 502, a spacer layer 504, and a second cylindrical ferromagnetic layer 506. The first cylindrical ferromagnetic layer 502 surrounds the core 507, the spacer layer 504 surrounds the first cylindrical ferromagnetic layer 502, and the second cylindrical ferromagnetic layer 506 surrounds the spacer layer 504. Collectively, the core 507 and the three layers 502, 504, and 506 form the MTJ structure 501. In some implementations, a diameter of the MTJ structure 501 is approximately 20 nm. Alternatively, in some implementations, the diameter of the MTJ structure 501 is greater than (or less than) 20 nm.

In some implementations, the core 507, the first cylindrical ferromagnetic layer 502, the spacer layer 504, and the second cylindrical ferromagnetic layer 506 are coaxial (e.g., concentric) with one another. Additionally, in some implementations, heights of the core 507 and the three layers 502, 504, and 506 substantially match one another (e.g., the core 507 and the three layers 502, 504, and 506 are coplanar with one another at a first end 605 of the MTJ structure 501 and also coplanar with one another at a second end 607 of the MTJ structure 501, FIG. 6A).

In some implementations, the first cylindrical ferromagnetic layer 502 is an example of the reference layer 102 and the second cylindrical ferromagnetic layer 506 is an example of the storage layer 106. Alternatively, in some implementations, the first cylindrical ferromagnetic layer 502 is an example of the storage layer 106 and the second cylindrical ferromagnetic layer 506 is an example of the reference layer 102. In some implementations, each of the ferromagnetic layers is composed of identical, or varying, thickness(es) and/or material(s). For example, each of the ferromagnetic layers is made of CoFeB with various compositions and each has a thickness ranging from 0.5 to 10 nm. In some implementations, the boron (B) component for the first and/or second ferromagnetic layers varies between 10% and 40%. In some implementations, the composition of the first cylindrical ferromagnetic layer 502 differs from the composition of the second cylindrical ferromagnetic layer 506. For example, when the first cylindrical ferromagnetic layer 502 is the storage layer 106, the first cylindrical ferromagnetic layer 502 may include at least one material (e.g., Tantalum and/or Tungsten) not included in the second cylindrical ferromagnetic layer 506. Furthermore, in some implementations, the reference layer 102 (which could be the first cylindrical ferromagnetic layer 502 or the second cylindrical ferromagnetic layer 506, depending on the circumstances) includes multiple sublayers making the reference layer 102 more thermally stable relative to a thermal stability of the storage layer 106. To achieve the increased thermal stability, in some implementations, the multiple sublayers include two ferromagnetic layers separated by a layer of Ruthenium (or the like). In some implementations, a thickness of the Ruthenium layer ranges from 4 to 8 angstroms. In some implementations, the multiple sublayers of the reference layer are coupled together using Ruderman-Kittel-Kasuya-Yosida coupling. It should be noted the ferromagnetic layers may have other thickness(es) and/or material(s), and the examples provided above are used to provide context.

The spacer layer 504 is an example of the spacer layer 104 (FIG. 1A). The spacer layer 504 is typically made from Magnesium Oxide (MgO) (or the like). However, in some implementations, the spacer layer 504 is made from $Mg_{1-x}Al_2$-$xO_4$. In some implementations, the materials used in the MRAM device 500 are stable at processing temperatures up to 400-425 Celsius and stable at operating temperatures up to 125 Celsius.

The reference layer 102, the spacer layer 104, and the storage layer 106 are discussed in greater detail above with reference to FIGS. 1A-3D.

The core 507 is disposed along a vertical axis and is used to provide structural support for the MTJ device 500. In some implementations, the core 507 is made from a metal (e.g., a non-magnetic metal) and serves as a current lead for the MRAM device 500. In some implementations, the core 507 is made from, at least partially, one or more of Tantalum (Ta), Tungsten (W), Copper (Cu), Ruthenium (Ru), and Niobium (Nb), or a combination thereof. In some implementations, the core 507 is conical (or elliptical) in shape (in those implementations, the core 507 is referred to as a conical core 507). Alternatively, in some implementations, the core 507 is cylindrical in shape (in those implementations, the core 507 is referred to as a cylindrical core 507). It is noted that a shape of the first cylindrical ferromagnetic layer 502, the spacer layer 504, and the second cylindrical ferromagnetic layer 506 conforms to an outer surface of the core 507. Thus, when the core 507 is conical in shape, the first cylindrical ferromagnetic layer 502, the spacer layer 504, and the second cylindrical ferromagnetic layer 506 are also conical in shape.

As explained in more detail below, in some implementations, the core 507 receives a current from a source (e.g., via a source line 510), and subsequently, the current (e.g., electron flow 615, FIG. 6A) flows radially from the core 507 through the first cylindrical ferromagnetic layer 502 and the spacer layer 504 towards the second cylindrical ferromagnetic layer 506. In doing so, the radial flow of the current imparts a torque on a magnetization of the first cylindrical ferromagnetic layer 502 and the second cylindrical ferromagnetic layer 506 via spin transfer torque. In those implementations where the first cylindrical ferromagnetic layer 502 is the storage layer 106, the radial flow of the current is able to flip a polarization of the storage layer 106 if the current reaches a threshold current (e.g., the energy barrier 118, FIG. 1B; the energy barriers 1006 and 1016, FIGS. 10A-10B). In those implementations where the second cylindrical ferromagnetic layer 502 is the storage layer 106, the radial flow of the current is able to flip a polarization of the storage layer 106 if the current reaches the threshold current. It is noted that, compared to conventional MTJs, the threshold current (i.e., a switching voltage) is substantially reduced in the MTJ device 500. For example, a typical switching voltage in conventional MTJs is approximately 1 volt, whereas the switching voltage typically used in the MTJ device 500 is approximately 0.3 volts. By reducing the switching voltage, less stress is applied to the layers of the MTJ device 500, especially the spacer layer 504 which is prone to voltage/current-based failures.

In some implementations, the second ferromagnetic layer 506 receives a current from a source (e.g., via a bit line 508), and subsequently the current (e.g., electron flow 617, FIG. 6A) flows from the second cylindrical ferromagnetic layer 502 through the spacer layer 504 towards the first cylindrical ferromagnetic layer 502 and the core 507. In doing so, the flow of the current imparts a torque on a magnetization of the first cylindrical ferromagnetic layer 502 and the second cylindrical ferromagnetic layer 506 via spin transfer torque.

The MRAM device 500 is also coupled to a bit line 508 and a source line 510 via transistor 514, which is operated by a word line 512. In some implementations, the source line 510 is connected to the core 507 and the bit line 508 is connected to the second cylindrical ferromagnetic layer 506. Alternatively, in some implementations, the source line 510 is connected to the second cylindrical ferromagnetic layer 506 and the bit line 508 is connected to the core 507 (not shown). In some implementations, the source line 510 is coupled to a top surface of the core 507. Alternatively, in some implementations (not shown), the source line 510 is coupled to a bottom surface of the core 507. These components are discussed in further detail above with reference to FIG. 4.

For ease of discussion with regards to FIGS. 6A-6D, the first cylindrical ferromagnetic layer 502 is the storage layer 502 and the second cylindrical ferromagnetic layer 506 is the reference layer 506. As such, a radius of the storage layer 502 is less than a radius of the reference layer 506. However, as noted above, a configuration of the storage layer 502 and the reference layer 506 may be reversed depending on the circumstances (e.g., a radius of the storage layer 502 is greater than a radius of the reference layer 506).

FIGS. 6A-6D illustrate cross-sectional views (taken along line A, FIG. 5) of magnetization orientations of the cylindrical MTJ structure 501 in accordance with some implementations. For ease of illustration and discussion, a width of each layer 502, 504, and 506 shown in FIGS. 6A-6D is the same. However, in some implementations, the width of one or more layers may differ, depending on the circumstances. For example, the width of the reference layer 506 is greater than the width of the storage layer 502 to increase the thermal stability (e.g., the energy barrier) of the reference layer 506.

FIGS. 6A-6B show cross-sectional views of the cylindrical MTJ structure 501 having a perpendicular magnetization orientation (also referred to herein as a perpendicular magnetic ground state). When the cylindrical MTJ structure 501 has the perpendicular magnetization orientation, the cylindrical MTJ structure 501 is classified as a perpendicular MTJ (e.g., similar to the perpendicular MTJ 200, FIGS. 2A-2B). FIGS. 6A-6B illustrate the process of switching from a parallel configuration (FIG. 6A) to an anti-parallel configuration (FIG. 6B) when the cylindrical MTJ structure 501 is a perpendicular MTJ. In cross-sectional views 600 and 610, the fixed magnetization direction 602 for the reference layer 506 is chosen to be in an upward direction and is represented by an up arrow. In some implementations (not shown), the fixed magnetization direction of the reference layer 506 is in a downward direction (e.g., a down arrow).

FIG. 6A illustrates the magnetization directions of the storage and reference layers in a parallel configuration. In the parallel configuration, the magnetization direction 604 of the storage layer 502 is the same as the magnetization direction 602 of the reference layer 506. In this example, the magnetization direction 602 of the reference layer 506 and the magnetization direction 604 of the storage layer 502 are both in the upward direction. The magnetization direction of the storage layer 502 relative to the fixed layer 506 changes the electrical resistance of the cylindrical MTJ structure 501. As discussed above with reference to FIG. 2A, the parallel configuration is also sometimes referred to as a "low (electrical) resistance" state.

FIG. 6B illustrates the magnetization directions of the storage and reference layers in an anti-parallel configuration. In the anti-parallel configuration, the magnetization direction 606 of the storage layer 502 is opposite to the "fixed" magnetization direction 602 of the reference layer 506. As discussed above with reference to FIG. 2B, the anti-parallel configuration is sometimes also referred to as a "high (electrical) resistance" state.

Thus, by changing the magnetization direction of the storage layer 502 relative to that of the reference layer 506, the resistance states of the cylindrical MTJ structure 501 can be varied between low resistance to high resistance, enabling digital signals corresponding to bits of "0" and "1" to be stored and read. Conventionally, the parallel configuration (low resistance state) corresponds to a bit "0," whereas the anti-parallel configuration (high resistance state) corresponds to a bit "1", as discussed above.

Changing the magnetization direction of the storage layer 502 relative to that of the reference layer 506 is described below with reference to FIGS. 6C-6D.

FIGS. 6C-6D show cross-sectional views of the cylindrical MTJ structure 501 having a vortex magnetization orientation (also referred to herein as a vortex magnetic ground state). When the cylindrical MTJ structure 501 has the vortex magnetization orientation, the cylindrical MTJ structure 501 is classified as a vortex MTJ. FIGS. 6C-6D illustrate the process of switching from a parallel configuration (FIG. 6C) to an anti-parallel configuration (FIG. 6D) when the cylindrical MTJ structure 501 is a vortex MTJ. With vortex MTJs, the magnetization of the cylindrical MTJ structure 501 wraps around the core 507 clockwise (e.g., a first chirality) or counterclockwise (e.g., a second chirality). In cross-sectional views 620 and 630, the fixed magnetization direction 612 for the reference layer 506 is chosen to be going into the page and is represented by a solid black dot (e.g., in a counterclockwise manner). In some implementations (not shown), the fixed magnetization direction of the reference layer 506 is coming out of the page and is represented by an "X" (e.g., in a clockwise manner).

FIG. 6C illustrates the magnetization directions of the storage and reference layers in a parallel configuration. In the parallel configuration, the magnetization direction 614 of the storage layer 502 is the same as the magnetization direction 612 of the reference layer 506 (e.g., the chirality of the storage layer 502 is the same as the chirality of the reference layer 506). In this example, the magnetization direction 612 of the reference layer 506 and the magnetization direction 614 of the storage layer 502 are both going into the page.

FIG. 6D illustrates the magnetization directions of the storage and reference layers in an anti-parallel configuration. In the anti-parallel configuration, the magnetization direction 616 of the storage layer 502 is opposite to the "fixed" magnetization direction 612 of the reference layer 506. For example, a chirality of the storage layer 502 differs from a chirality of the reference layer 506. Thus, by changing the magnetization direction of the storage layer 502 relative to that of the reference layer 506, the resistance states of the cylindrical MTJ structure 501 can be varied between low resistance to high resistance, enabling digital signals corresponding to bits of "0" and "1" to be stored and read.

As described above with reference to FIGS. 3B-3D, in order to change the cylindrical MTJ structure 501 from a parallel configuration to an anti-parallel configuration (or vice versa), a current (e.g., electron flow 312, FIG. 3B) is applied to the cylindrical MTJ structure 501. In some implementations, the current is applied through the core 507 (e.g., via the source line 510, FIG. 5). In those implementations, the received current (e.g., electron flow 615) flows radially from the core 507 through the storage and spacer layers toward the reference layer 506, and the current 615 imparts a torque on a magnetization of storage layer 502 (and also the reference layer 506). When a sufficiently large current is applied (e.g., a sufficient number of polarized electrons flow into the storage layer 502), the spin torque flips, or switches, the magnetization direction of the storage layer 502 from the magnetization direction 614 in FIG. 6C to the magnetization direction 616 in FIG. 6D. For example, the current 615 applied to the storage layer 502 from the core 507 switches a chirality of the storage layer's 502 magnetization from a counterclockwise chirality to a clockwise chirality. As a result of said switching, the MTJ structure 501 transitions from a parallel configuration to an anti-parallel configuration.

In some implementations, the current is applied through the reference layer 506, as described above with reference to FIGS. 3B and 5. When the current is applied through the reference layer 506 of the cylindrical MTJ structure 501, the current flows from the reference layer 506 through the MTJ structure 501 towards the core 507 (e.g., electron flow 617, FIG. 6A). When a sufficiently large current is applied (e.g., a sufficient number of polarized electrons flow into the storage layer 502), the spin torque flips, or switches, the magnetization direction of the storage layer 502 from the magnetization direction 614 in FIG. 6C to the magnetization direction 616 in FIG. 6D.

In some implementations, the current is applied through the reference layer 506 when the MTJ structure 501 is in the anti-parallel configuration, and the current is applied through the core 507 when the MTJ structure 501 is in the parallel configuration (or vice versa). In accordance with some implementations, switching configurations is performed by reversing the flow of the current. Switching from the parallel configuration to the anti-parallel configuration utilizes current in one polarity (direction) and switching from the anti-parallel configuration back to the parallel configuration utilizes current in the opposite polarity (e.g., current in the opposite direction). To put it in another way: to switch from the parallel configuration to the anti-parallel configuration, the electrons have to flow from the storage (e.g., free) layer to the reference layer, since it is the reflected electrons from the minority spin band that cause the storage layer to switch from the parallel configuration to the anti-parallel configuration. Accordingly, switching from the parallel configuration to the anti-parallel configuration requires the current to flow from the reference layer to the storage layer. To switch from the anti-parallel configuration to the parallel configuration, the electrons have to flow from the reference layer to the storage layer since it is the transmitted majority spin up band electrons from the reference layer that are going to thermalize in the storage layer and impart their angular momentum. In some implementations, the switch from the anti-parallel configuration to the parallel configuration requires the current to flow from the storage layer to the reference layer.

The discussion above applies equally to FIGS. 6A-6B, and for the sake of brevity it is not repeated here. Transitioning from parallel to anti-parallel resistance states (or vice versa) is discussed in greater detail above with reference to FIGS. 3A-3D.

Figure 7A:
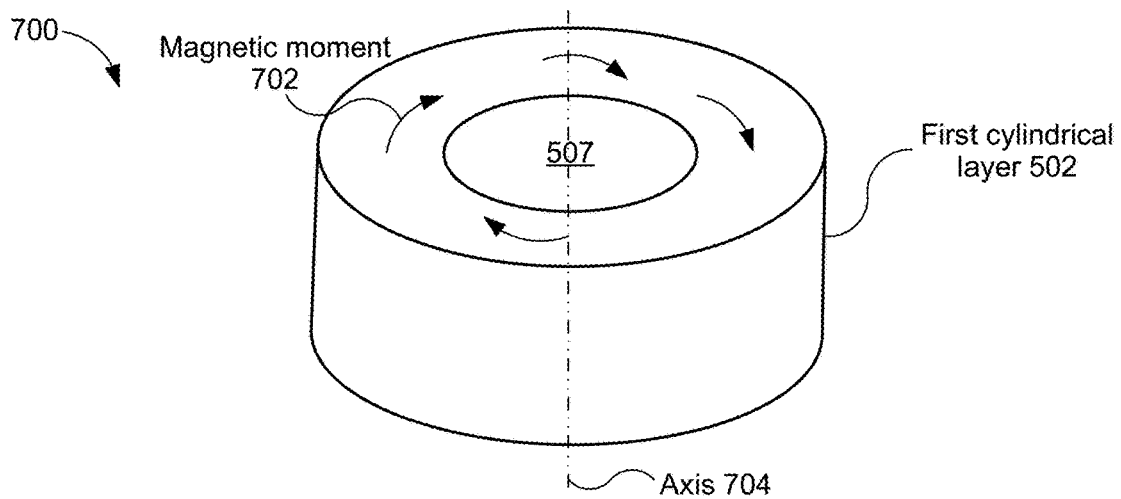
FIGS. 7A-7C illustrate various magnetization orientations for a cylindrical MTJ structure in accordance with some implementations.
Figure 7B:
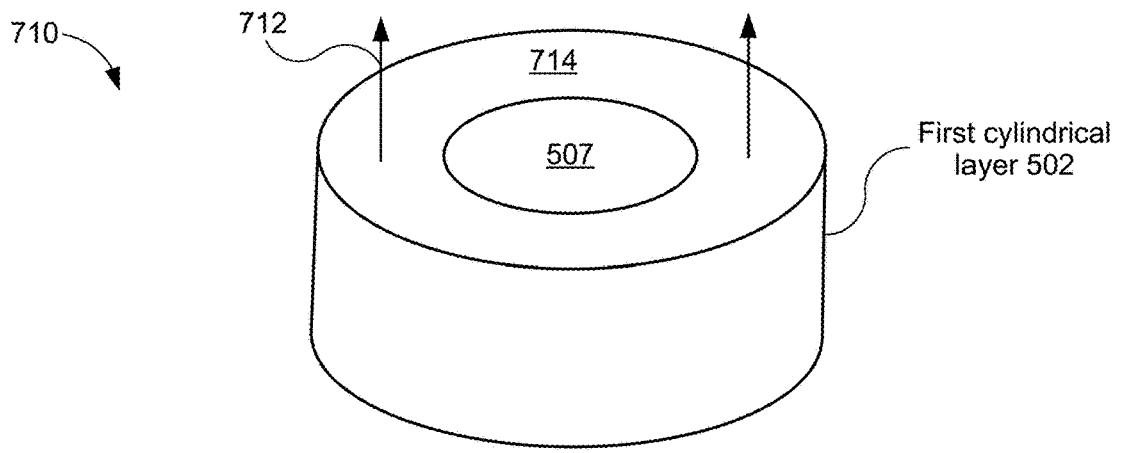
Figure 7C:
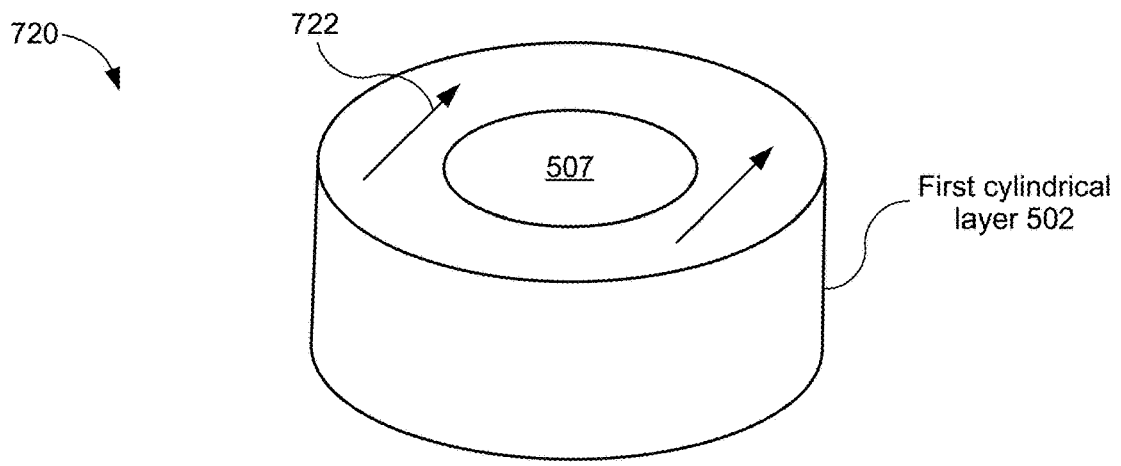

FIGS. 7A-7C illustrate various magnetic ground states for MRAM device 500 in accordance with some implementations. A magnetic ground state corresponds to the magnetic anisotropy of a ferromagnetic layer of the MRAM device 500. As explained above with reference to FIG. 1A, a magnetic moment of magnetically anisotropic materials will tend to align with an "easy axis," which is the energetically favorable direction of spontaneous magnetization. In some implementations and instances, the two opposite directions along (or about) an easy axis are equivalent, and the direction of magnetization can be along (or about) either of them. As will be described in more detail with reference to FIGS. 8A-8B, the magnetic ground state for a ferromagnetic layer is dictated by characteristics of the ferromagnetic layer (e.g., height, thickness, and material composition of the ferromagnetic layer) and the characteristics of the core 507 (e.g., height, radius, and material composition of the core 507). For ease of illustration and discussion, the spacer layer 504 and the second cylindrical ferromagnetic layer 506 are not shown in FIGS. 7A-7C. However, one skilled in the art will appreciate that the discussion below applies equally to the second cylindrical ferromagnetic layer 506.

Figure 12A:
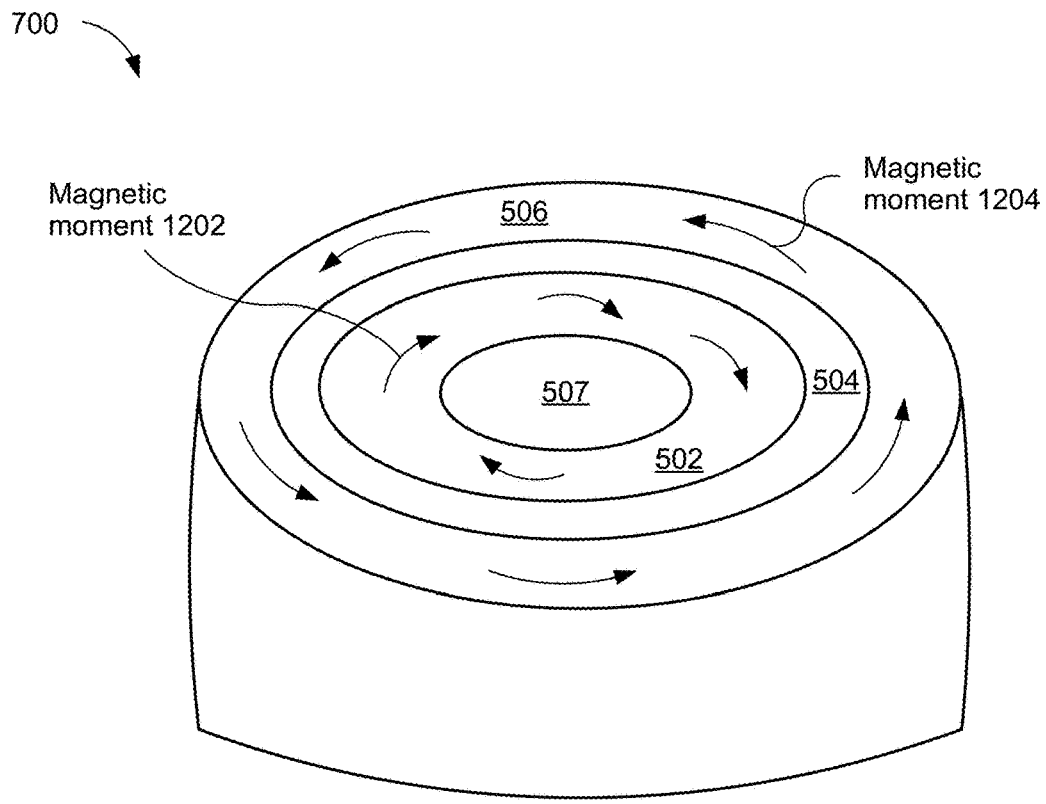
FIGS. 12A-12B illustrate various magnetization orientations for a complete cylindrical MTJ structure in accordance with some implementations.

FIG. 7A illustrates a vortex magnetic ground state 700 in accordance with some implementations. In the vortex magnetic ground state 700 (e.g., the vortex magnetization orientation), a magnetic moment 702 (e.g., direction of magnetization) of the first cylindrical ferromagnetic layer 502 rotates around the core 507. For example, the core 507 is positioned along an axis 704 and the magnetic moment 702 of first cylindrical layer 502 rotates around (e.g., about) the axis 704 within (e.g., in-plane) the first cylindrical layer 502. In some implementations, the magnetic moment 702 rotates around the core 507 in a clockwise direction. Alternatively, in some implementations, the magnetic moment 702 rotates around the core 507 in a counterclockwise direction. Although not shown in FIG. 7A, the magnetic moment 702 of the first cylindrical layer 502 rotates around the core 507 through a cross section of the first cylindrical ferromagnetic layer 502 (e.g., as shown in FIGS. 6C-6D). FIG. 12A illustrates the magnetic moments 1202, 1204 of the first cylindrical ferromagnetic layer 502 and the second cylindrical ferromagnetic layer 506, respectively, in an anti-parallel configuration when the first and second ferromagnetic layers have the vortex magnetic ground state 700.

Figure 12B:
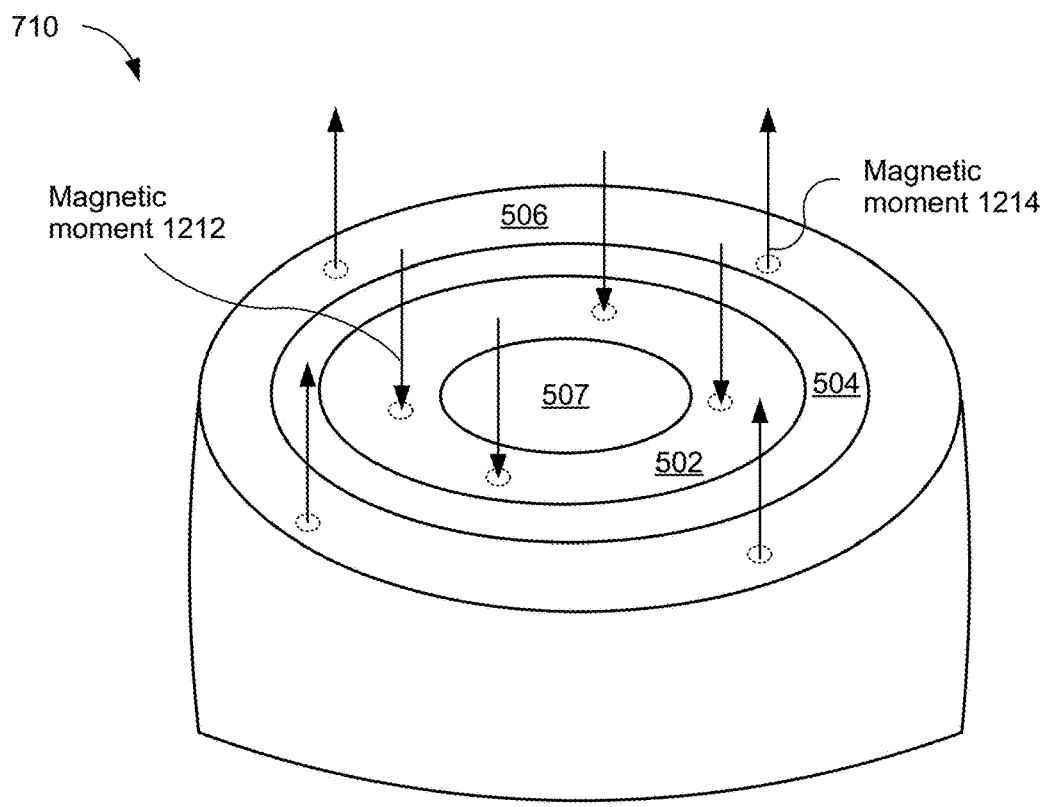

FIG. 7B illustrates a perpendicular magnetic ground state in accordance with some implementations. The arrows 712 represent a direction of the magnetic moment of the bulk material of the first cylindrical layer 512. In some implementations, the magnetic field lines (not shown) extend out of a planar surface 714 of the first cylindrical ferromagnetic layer 502 in the same direction represented by the arrows 712 (e.g., upwards) and in doing so, the magnetic moment 712 of the bulk material of the first cylindrical ferromagnetic layer 502 parallels the axis 704 of the core 507. In some implementations, the magnetic moment 712 of the bulk material of the first cylindrical ferromagnetic layer 502 parallels the axis 704 of the core 507 and the magnetic field in a first direction (e.g., upwards). Alternatively, in some implementations (not shown), the magnetic moment 712 of the bulk material of the first cylindrical ferromagnetic layer 502 parallels the axis 704 of the core 507 and the magnetic field in a second direction (e.g., downwards). Although not shown in FIG. 7B, the magnetic moment 712 of the bulk material of the first cylindrical ferromagnetic layer 502 extends through a cross section of the first cylindrical ferromagnetic layer 502 (e.g., as shown in FIGS. 6A-6B). FIG. 12B illustrates the magnetic moments 1212, 1214 of the bulk material of the first cylindrical ferromagnetic layer 502 and the bulk material of the second cylindrical ferromagnetic layer 506, respectively, in an anti-parallel configuration when the first and second ferromagnetic layers have the perpendicular magnetic ground state 710.

FIG. 7C illustrates an in-plane magnetic ground state 720 in accordance with some implementations. In the in-plane magnetic ground state, a magnetic moment 722 of the first cylindrical ferromagnetic layer 502 parallels the planar surface 714 of the first cylindrical ferromagnetic layer 502. In doing so, the magnetic moment 722 of the first cylindrical layer 502 is perpendicular to the axis 704 of the core 507. In some implementations, the magnetic moment 722 parallels the planar surface 714 of the first cylindrical ferromagnetic layer 502 in a first direction (e.g., rightwards). Alternatively, in some implementations, the magnetic moment 722 parallels the planar surface 714 of the first cylindrical ferromagnetic layer 502 in a second direction (e.g., leftwards). Although not shown in FIG. 7C, the magnetic moment 722 of the first cylindrical ferromagnetic layer 502 extends through the cross section of the first cylindrical ferromagnetic layer 502. Because the structure possesses radial symmetry, every magnetization direction is energetically equivalent in the radial plane in the in-plane ground state. Accordingly, the magnetization direction may be equally likely to be pointing rightwards or leftwards or in any other direction in the radial plane. In some implementations and situations, this ground state (e.g., having a reference layer with the in-plane magnetic ground state) is not preferred when it comes to encoding information as there is no energy barrier to overcome to go from the anti-parallel to the parallel configuration and the system could assume any angular configuration in-between which is not ideal for storing a bit.

In some implementations, material composition of a ferromagnetic layer is tailored to a specific magnetic ground state. For example, ferromagnetic layers with a lower exchange energy prefer the vortex magnetic ground state 700 (e.g., lower relative to a baseline). In some implementations, lowering the exchange energy of a ferromagnetic layer is achieved by increasing and/or decreasing a proportion of one or more elements/compounds that compose the ferromagnetic layer. For example, increasing a proportion of Fe (e.g., from a baseline) in the ferromagnetic layer decreases the exchange energy of the ferromagnetic layer. Alternatively or in addition, lowering the exchange energy of a ferromagnetic layer is achieved by using a combination (bilayer) of CoFeB and other layers, such as permalloy, which lowers the overall exchange stiffness of the layer.

Conversely, in some implementations, ferromagnetic layers with a high exchange energy prefer for the perpendicular magnetic ground state 710. For example, increasing a proportion of Co (e.g., from a baseline) in the ferromagnetic layer increases an exchange energy of the ferromagnetic layer. Other material properties, such as saturation magnetization and uniaxial anisotropy, are also considered for tailoring.

Figures 8A, 8B:
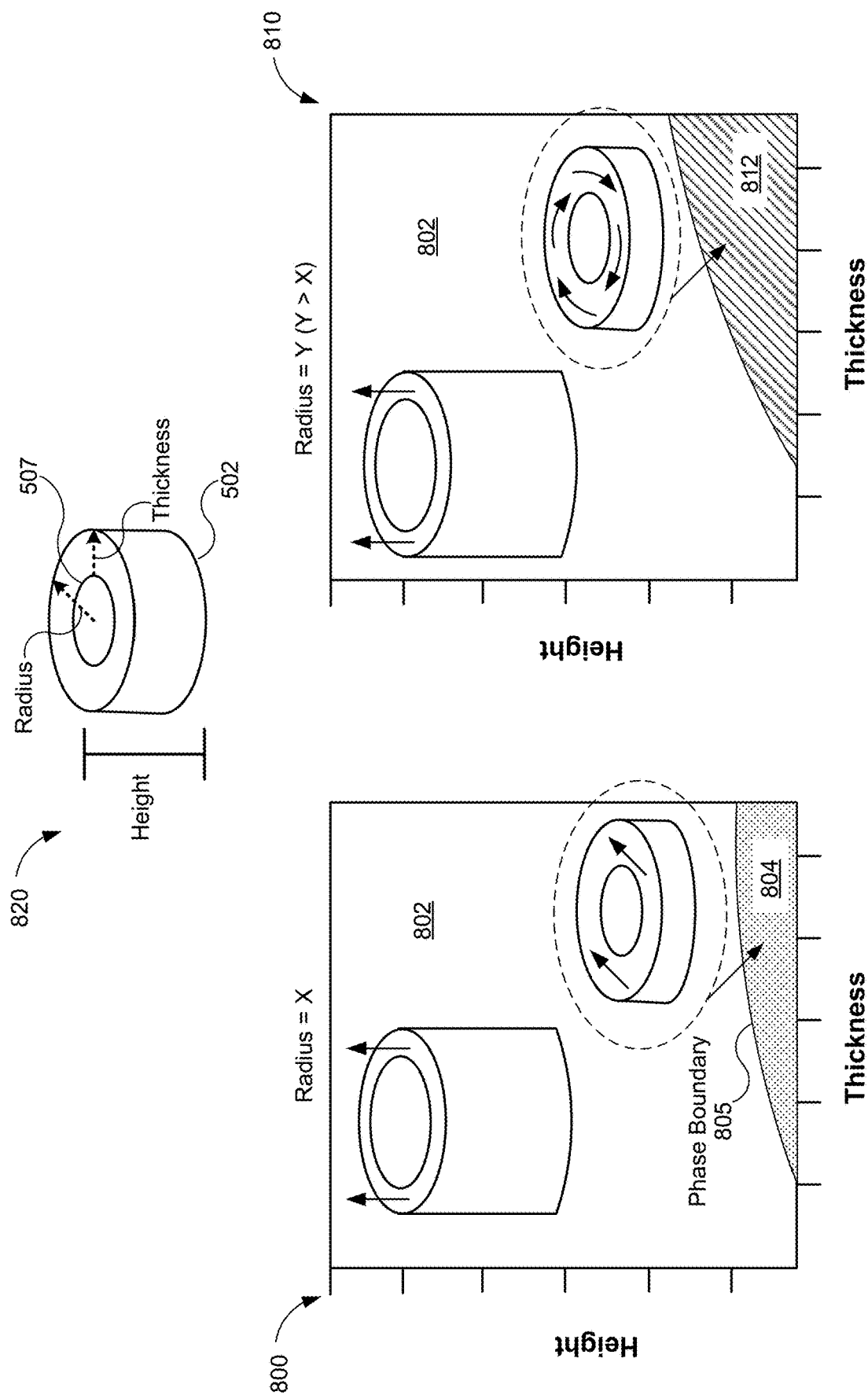
FIGS. 8A-8B are phase diagrams illustrating the relationship between dimensions of a cylindrical MTJ structure and magnetization orientations in accordance with some implementations.

FIGS. 8A-8B are phase diagrams showing the relationship between dimensions of the MRAM device 500 and magnetic ground states in accordance with some implementations. A magnetic ground state of a ferromagnetic layer is based, at least in part, on a set of characteristics of the ferromagnetic layer. In some implementations, the set of characteristics includes one or more of: (i) a thickness of the ferromagnetic layer, (ii) a height of the ferromagnetic layer, (iii) exchange energy of the ferromagnetic layer, (iv) saturation magnetization of the ferromagnetic layer, and (v) uniaxial anisotropy of the ferromagnetic layer. Additionally, in some implementations, the magnetic ground state of the ferromagnetic layer is further based on a set of characteristics of the core 507. In some implementations, the set of characteristics of the core 507 includes one or more of: (i) a radius of the core 507 relative to the thickness of the ferromagnetic layer and (ii) a height of the core 507.

A legend 820 illustrates dimensions discussed below with reference to the phase diagrams 800 and 810. For example, "Radius" is a radius of the core 507 combined with a thickness of the first cylindrical layer 502. The "Radius" is a fixed dimension (e.g., 5 nm, 7 nm, 10 nm, 15 nm, 20 nm, etc.), and therefore an increase in the thickness of the first cylindrical layer 502 results in a proportional decrease in the radius of the core 507 (and vice versa). The Y-axis corresponds to a height of the cylindrical MTJ structure (e.g., height of the core 507 and first cylindrical layer 502, also referred to as pillar height) and the X-axis corresponds to a thickness of the first cylindrical layer 502. In some implementations, the Y-axis ranges from 0 to 60 nm and the X-axis ranges from 0 to 5 nm (of course, these ranges could be increased or decreased). For ease of illustration and discussion, the spacer layer 504 and the second cylindrical layer 506 are not included in FIGS. 8A-8B. However, one skilled in the art will appreciate that the discussion below applies equally to the second cylindrical layer 506.

FIG. 8A is a phase diagram 800 showing the relationship between dimensions of cylindrical MTJ structures and two magnetic ground states: (i) the perpendicular magnetic ground state 802 and (ii) the parallel magnetic ground state 804. In this example, the illustrated cylindrical MTJ structures have a Radius of X (which is less than the Radius Y shown in phase diagram 810). The perpendicular magnetic ground state 802 tends to form in tall (e.g., elongated) cylindrical MTJ structures 501 with thin ferromagnetic layers (e.g., thin relative to a radius of the core 507 and/or the Radius of the MTJ structure). In some implementations or instances, the perpendicular magnetic ground state 802 tends to form when a ratio between the pillar height and the thickness of the first ferromagnetic layer 502 satisfies a threshold, where the ratio corresponds to an energetically favorable direction of spontaneous magnetization. For example, when the ratio between the pillar height and the thickness satisfies the threshold, meaning that the first ferromagnetic layer 502 is sufficiently tall and thin, the energetically favorable direction of spontaneous magnetization is along the height (e.g., in a height dimension, as shown by the upward arrows) of the first ferromagnetic layer 502. Such is the result because it is energetically more favorable for the magnetic moment of the first ferromagnetic layer 502 to lie along the axis of the core (in the height direction) than it is for the magnetic moment to lie in the plane (e.g., along the width), based on the dimensions of the first ferromagnetic layer 502 (e.g., the height dimension is the "easy axis").

In some implementations or instances, the parallel magnetic ground state 804 tends to form when the ratio between the pillar height and the thickness does not satisfy the threshold. The in-plane magnetic ground state 804 favors short cylindrical MTJ structures 501 with thick ferromagnetic layers (e.g., thick relative to a radius of the core 507 and/or the radius of the MTJ structure). In such cases, it is easier for the magnetic moment of the first ferromagnetic layer 502 to lie perpendicular to the axis of the core (in the thickness dimension) than it is for the magnetic moment to lie perpendicular to the axis of the core, based on the dimensions of the first ferromagnetic layer 502 (e.g., the thickness dimension is the "easy axis").

As shown, the perpendicular magnetic ground state 802 occupies a majority of the phase diagram 800.

FIG. 8B is a phase diagram 810 showing the relationship between dimensions of cylindrical MTJ structures and two magnetic ground states: (i) the perpendicular magnetic ground state 802 and (ii) the vortex magnetic ground state 812. In this example, the illustrated cylindrical MTJ structures have a Radius of Y (which is greater than the Radius X shown in phase diagram 800). The vortex magnetic ground state 812 tends to form in wider cylindrical MTJ structures 501 (e.g., Radius Y is greater than 10 nm) with thick ferromagnetic layers (e.g., thick relative to a radius of the core 507 and/or the Radius of the MTJ structure). Accordingly, when a ratio between the pillar height and the thickness of the first ferromagnetic layer 502 does not satisfy a threshold, meaning that the first ferromagnetic layer 502 is sufficiently short and thick, the energetically favorable direction of spontaneous magnetization is an in-plane rotation around the core 507 (e.g., the magnetic moment 702, FIG. 7A).

Figure 9A:
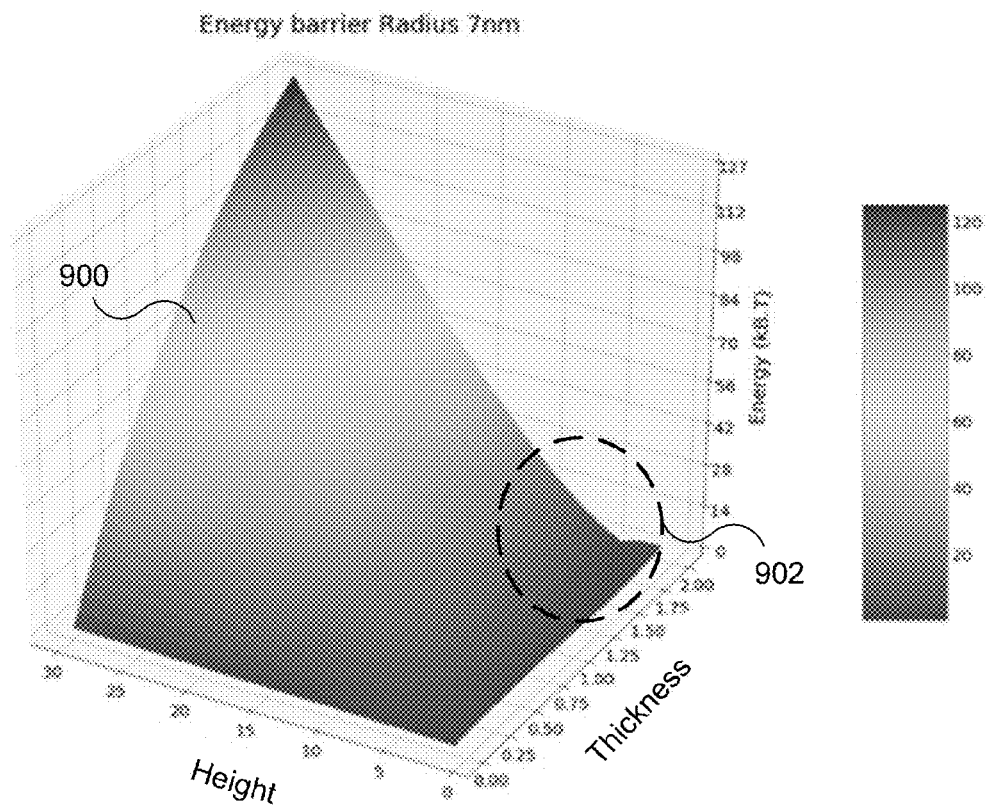
FIGS. 9A-9B illustrate various energy barrier diagrams for the cylindrical MTJ structure in accordance with some implementations.
Figure 9B:
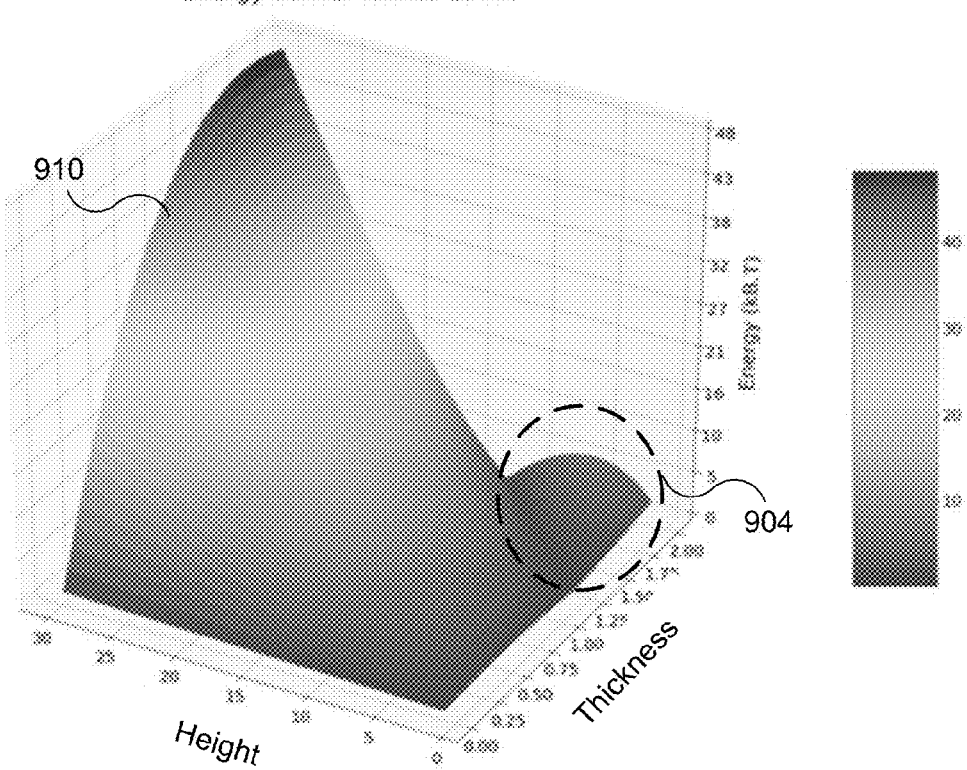

FIGS. 9A-9B shows representative energy barriers that at least partially correspond to the phase diagrams of FIGS. 8A-8B in accordance with some implementations. It should be noted that the dimensions for "Height" and "Thickness" shown in FIGS. 9A-9B are merely one set of possible dimensions.

FIG. 9A shows a representative energy barrier 900 that at least partially corresponds to the phase diagram 800 of FIG. 8A. An "energy barrier" refers to the amount of energy the magnetic material must overcome in order to switch from one magnetization direction to its opposite (e.g., from the state 114 to the state 116, FIG. 1B). Thus, as the energy barrier for a ferromagnetic layer increases, the ferromagnetic layer is said to become more thermally stable. Increasing the thermal stability of a ferromagnetic layer results in a greater energy input being required to switch the magnetization direction of the ferromagnetic layer. With reference in FIG. 9A, as pillar height and thickness of the ferromagnetic layer increases, the representative energy barrier 900 for the ferromagnetic layer also increases. In this particular example, the increase in thermal stability is fairly uniform.

In some implementations, the magnetic ground state of the ferromagnetic layer affects the thermal stability of the ferromagnetic layer. For example, if the ferromagnetic layer is in a first magnetic ground state (e.g., the vortex magnetic ground state), then the thermal stability of the ferromagnetic layer may differ from a thermal stability of a ferromagnetic layer in a second magnetic ground state (e.g., the perpendicular magnetic ground state). To illustrate, with reference to FIG. 9B, the region 904 (dotted circle) shows an energy barrier bulge in the representative energy barrier 910, which is not present in the representative energy barrier 900 (e.g., the region 902 (dotted circle) does not include a corresponding energy barrier bulge and instead continues uniformly upwards toward a peak energy barrier). The energy barrier bulge 904 shown in FIG. 9B, in some circumstances, is caused by the ferromagnetic layer being in the vortex magnetic ground state 812 (FIG. 8B). The energy barrier bulge 904 corresponds to the region 812 shown in FIG. 8B.

FIGS. 10A-10B show representative energy barriers of a ferromagnetic layer in different magnetic ground states in accordance with some implementations. As discussed above, the energy barrier refers the amount of energy the magnetic material must overcome in order to switch from one magnetization direction to its opposite (e.g., from the state 1002 to the state 1004). FIG. 10A shows low energy states 1002 and 1004 for a ferromagnetic layer in a vortex magnetic ground state and multiple energy barriers 1006-A, 1006-B, and 1006-C. In this example, the low energy state is achieved in both 1002 and 1004 magnetic configurations, 1002 corresponds to a counterclockwise chirality and 1004 corresponds to a clockwise chirality. 1002 and 1004 have equivalent energies at equilibrium without external perturbations.

FIG. 10B shows low energy states 1012 and 1014 for a ferromagnetic layer in a perpendicular magnetic ground state and multiple energy barriers 1016-A and 1016-B. In this example, the low energy state 1012 corresponds to a first magnetization direction of the perpendicular magnetic ground state (e.g., upwards) and the lower energy state 1014 corresponds to a second magnetization direction of the perpendicular magnetic ground state (e.g., downwards). In some implementations, a respective energy barrier for the ferromagnetic layer in the vortex magnetic ground state differs from a respective energy barrier for the ferromagnetic layer in the perpendicular magnetic ground state (e.g., less energy is required to overcome the energy barrier 1006 relative to an amount of energy required to overcome the energy barrier 1016, or vice versa). It is noted that the illustrated Δ Energies are not necessarily drawn to scale.

In some implementations or instances, a first ferromagnetic layer in a first magnetic ground state with a first set of characteristics has an energy barrier (e.g., energy barrier 1006-A) that differs from an energy barrier (e.g., energy barrier 1006-B) of a second ferromagnetic layer in the first magnetic ground state with a second set of characteristics. Put plainly, as discussed above with reference to FIGS. 8A-8B and 9A-9B, an energy barrier for a ferromagnetic layer will differ depending on a geometry of the ferromagnetic layer. To illustrate, FIG. 10A includes three different energy barriers 1006-A, 1006-B, and 1006-C, which gradually increase as a result of the geometry of the ferromagnetic layer changing (e.g., increase in layer thickness and/or decrease in layer height). Further, FIG. 10B includes two different energy barriers 1016-A and 1006-B, which gradually increase as a result of the geometry of the ferromagnetic layer changing (e.g., decrease in layer thickness and/or increase in layer height).

In some implementations, the magnetic ground state of the ferromagnetic changes momentarily from a first magnetic ground state in the low energy states (e.g., vortex magnetic ground state at low energy states 1002 and 1004) to a second magnetic ground state in a high energy state (e.g., perpendicular magnetic ground state at high energy state 1007). To illustrate this phenomenon, assume the "angle" of the low energy state 1002 is "0" degrees and further assume the angle of the low energy state 1004 is "180" degrees (e.g., the low energy state 1004 is opposite to the low energy state 1002). Thus, the midpoint between the two low energy states is "90" degrees (e.g., the angle at the high energy state is perpendicular to the respective angles at low energy states 1002 and 1004). Accordingly, as shown in FIG. 10A, the ferromagnetic layer momentarily has the perpendicular magnetic ground state 1007 when switching from the counterclockwise chirality to the clockwise chirality (e.g., at the high energy state). A similar result is illustrated in FIG. 10B. For example, the ferromagnetic layer momentarily has either the vortex magnetic ground state 1018 or the parallel magnetic ground state 1019 when switching from the upwards to downwards.

Figure 11:
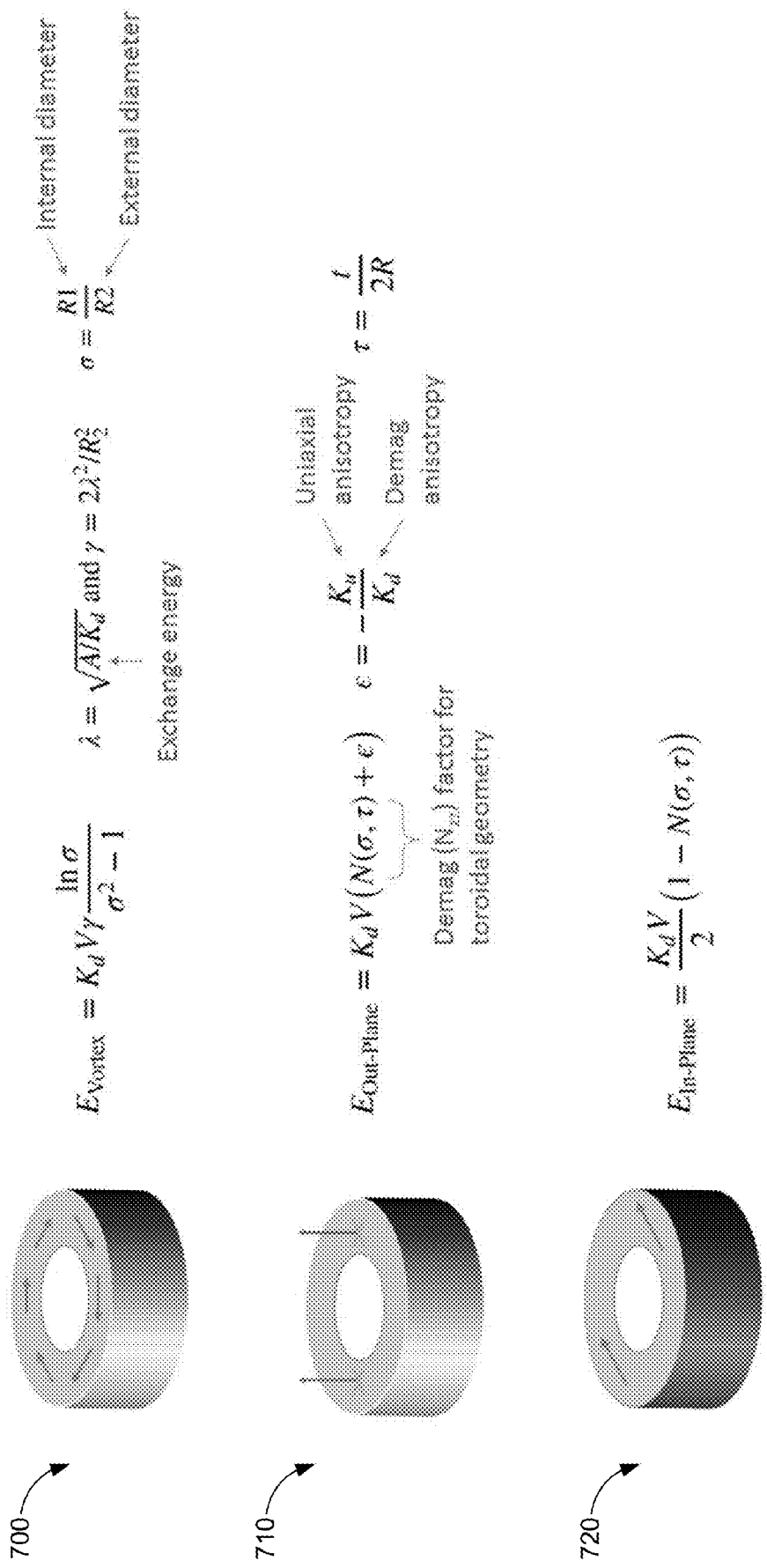
FIG. 11 provides representative energy barrier equations for various magnetization orientations in accordance with some implementations.

FIG. 11 provides representative energy barrier equations for various magnetization orientations in accordance with some implementations. The parameters labeled in FIG. 11 (e.g., exchange energy, demagnetization (demag) anisotropy, uniaxial anisotropy, inner diameter, and external diameter) relate to characteristics of the first ferromagnetic layer, as discussed above (e.g., magnetization orientation tailoring). Additionally, changing one or more of the parameters in the various equations may result in an energy barrier for the first ferromagnetic layer also changing (e.g., as shown in FIGS. 10A-10B). For ease of illustration and discussion, the barrier layer 504 and the second cylindrical layer 506 are not included in FIG. 11. However, one skilled in the art will appreciate that the equations apply equally to the second ferromagnetic layer 506.

Figure 13:
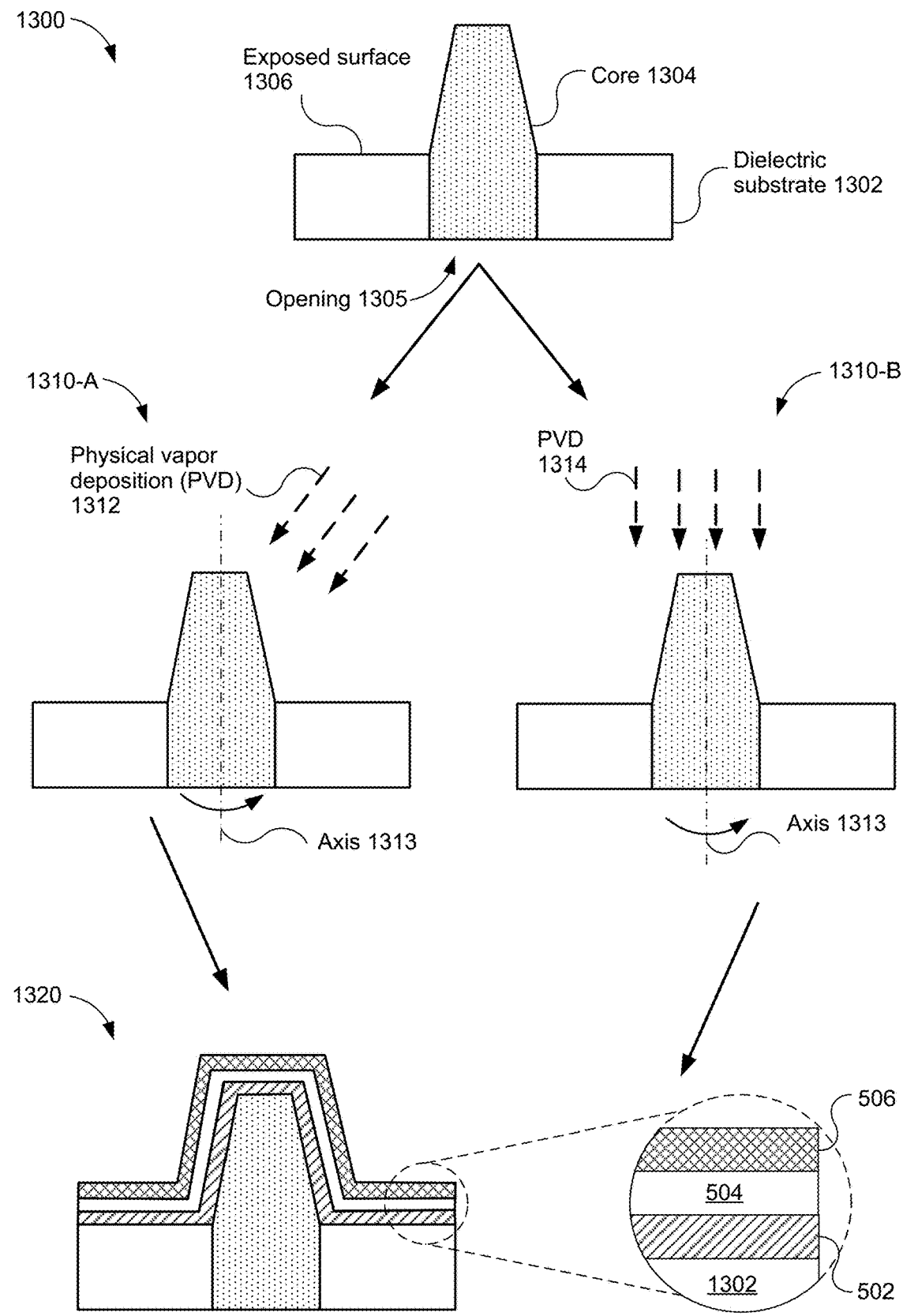

FIGS. 13-15 illustrate a process of fabricating the three-dimensional MRAM device in accordance with some implementations. Each of the views shown in FIGS. 13-15 is a cross-sectional view of the three-dimensional MRAM device during the fabrication process.

FIG. 13 illustrates several initial steps in the fabrication process. The process begins (at step 1300) with providing a dielectric substrate 1302 with a metallic core 1304 protruding from the dielectric substrate 1302. In some implementations, the metallic core 1304 is a CMOS plug made from Tantalum (Ta), Tungsten (W), Copper (Cu), Ruthenium (Ru), and Niobium (Nb), or a combination thereof. In some implementations, providing the dielectric substrate 1302 with the protruding metallic core 1304 includes forming the dielectric substrate (e.g., thermally formed silicon oxide, silicon nitride, silicon carbide, silicon oxide, or a combination thereof, deposited by plasma-enhanced chemical vapor deposition) and defining an opening 1305 in the underlying CMOS layers (e.g., by creating resist patterning via photolithography and/or selectively etching the dielectric substrate 1302 by using an anisotropic etching technique such as reactive ion etching (RIE)). In some implementations, the opening 1305 defined by the dielectric substrate 1302 is filled with a metal (e.g., by electrodeposition and/or a wet solution based deposition technique), thereby forming the metallic core 1304. In some implementations, a chemical mechanical polishing (CMP) operation removes excess metal deposited on the dielectric substrate 1306.

At this stage, the dielectric substrate defines an opening 1305 (e.g., circular, or some other shape) filled with metal (e.g., the metallic core 1304), which is polished flush with the dielectric substrate 1302. Next, portions of the dielectric substrate 1302 around the metallic core 1304 are removed (e.g., via selective etching and/or dry vacuum-based techniques such as RIE). In some implementations, a wet-based technique such as piranha etch is also used. Thereafter, the metallic core 1304 is left protruding out of the dielectric substrate 1302 (as shown at step 1300). In some implementations, providing the metallic core 1304 and the dielectric substrate 1302 further includes providing both in a vacuum chamber (e.g., a vacuum chamber used to during physical vapor deposition and/or sputtering processes). The protruding core 1304 is sometimes referred to herein as a plug.

Figure 16:
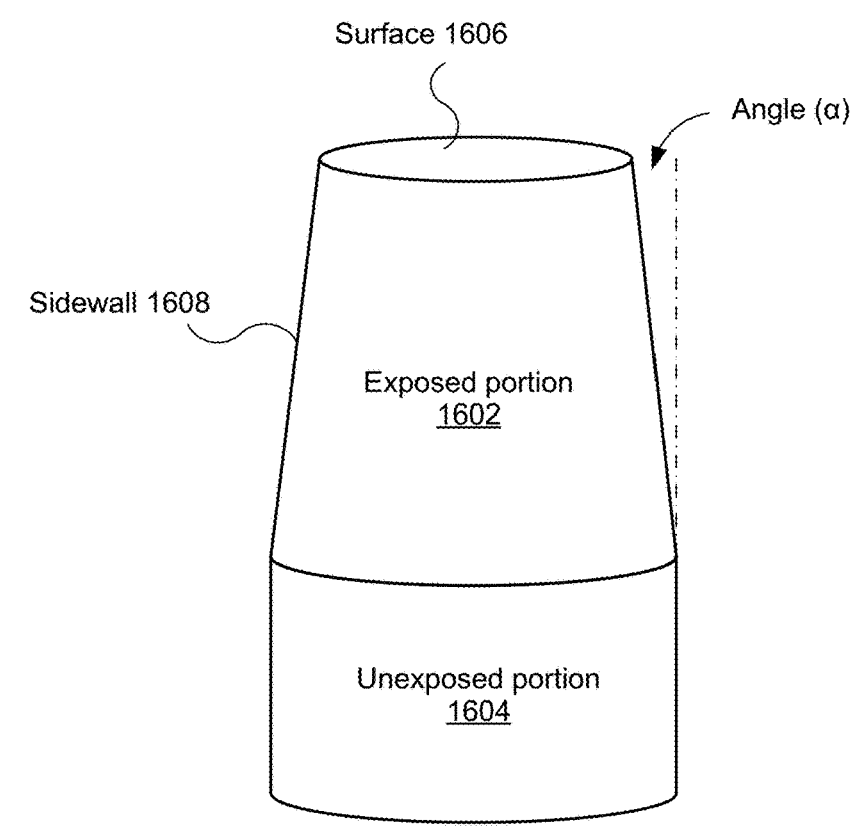
FIG. 16 illustrates an exemplary core used in fabricating the three-dimensional MRAM device of FIG. 5 in accordance with some implementations.

FIG. 16 illustrates an exemplary metallic core 1304 without the dielectric substrate 1302. The metallic core 1304 includes an exposed portion 1602 and an unexposed portion 1604. The unexposed portion 1604 is surrounded by the dielectric substrate 1302 (e.g., the portion that remains in the opening 1305) and the exposed portion 1602 is that protrudes away from the exposed surface 1306 of the dielectric substrate 1302 (the exposed surface 1306 is sometimes referred to as the field). The metallic core 1304 also includes (i) a surface 1606 offset from the exposed surface 1306 of the dielectric substrate 1302 and (ii) a sidewall 1608 extending away from the exposed surface 1306 of the dielectric substrate 1302 to the offset surface 1606. In some implementations (not shown), the sidewall 1608 is perpendicular to the exposed surface 1306 of the dielectric substrate 1302 (e.g., the core 1304 is a cylindrical core). Alternatively, in some implementations, the sidewall 1608 is angled/slanted (a) relative to the exposed surface 1306 of the dielectric substrate 1302 (e.g., the core 1304 is a conical core). In some implementations, the angle (a) ranges from about 5 to 20 degrees.

Turning back to FIG. 13, the process further includes depositing (1310-A or 1310-B) a plurality of layers onto the exposed portion 1602 of the metallic core 1304 and the exposed surface 1306 of the dielectric surface 1302. In some implementations, the depositing is performed using a physical vapor deposition (PVD) technique (e.g., via PVD sputtering and/or evaporation). In some implementations, the PVD 1310-A is an angled PVD 1312 (e.g., a glancing incidence) where the core 1304 and the substrate 1302 rotate about an axis 1313 during the PVD 1310-A. Alternatively, in some implementations, the PVD 1310-B is a direct PVD 1314 (e.g., a normal incidence) where the core 1304 and the substrate 1302 rotate about the axis 1313 so as to maintain a high uniformity throughout the wafer.

In some implementations, depositing the plurality of layers includes: depositing a first ferromagnetic layer 502 on the exposed portion 1602 of the metallic core 1304 and the exposed surface 1306 of the dielectric substrate 1302. After depositing the first ferromagnetic layer 502, the first ferromagnetic layer 502 has exposed surfaces. Accordingly, the process further includes depositing a spacer layer 504 on the exposed surfaces of the first ferromagnetic layer 502. After depositing the spacer layer 504, the spacer layer 504 has exposed surfaces. Accordingly, the process further includes depositing a second ferromagnetic layer 506 on the exposed surfaces of the spacer layer 504. In some implementations (not shown), the second ferromagnetic layer 506 consists of multiple sublayers. For example, the multiple sublayers include a layer of Ruthenium (or another element or compound with similar properties) sandwiched by two ferromagnetic layers. The sublayers of the second ferromagnetic layer 506 are discussed in further detail above with reference to FIG. 5.

The resulting structure after depositing (using either 1310-A or 1310-B) the plurality of layers is shown at step 1320. As shown, three layers 502, 504, and 506 have been deposited on the exposed surfaces of the metallic core 1304 and the dielectric substrate 1302 in succession. In some implementations, a thickness of each layer varies (or in some implementations the thickness of each layer is the same). For example, the first ferromagnetic layer 502 is thinner that the second ferromagnetic layer 506 (or vice versa). In another example, the spacer layer 504 in thinner than the two ferromagnetic layers (or vice versa). Additionally, in some implementations, a thickness of each layer varies along a length of the layer. For example, the spacer layer 504 is thicker on the exposed surface 1306 of the dielectric substrate 1302 and the offset surface 1606 of the core 1304, relative to a thickness of the spacer layer 504 along the sidewall 1608 of the core 1304 (in some implementations, the same is true for the two ferromagnetic layers). In those implementations where the spacer layer 504 is thinner along the sidewall 1608 of the core 1304, a tunneling current at the thicker regions of the spacer layer 504 is exponentially smaller relative to a tunneling current at the thinner regions of the spacer layer 504. As a result, the tunneling current at the thicker regions does not (substantially) contribute to the resistance of the MRAM device 500 as a majority of the tunneling current flows through the thinner sidewall region of the spacer layer 504.

In some other implementations (not shown), depositing the plurality of layers includes: depositing a metallic buffer layer (e.g., buffer layer 2304, FIG. 23) on the exposed portion 1602 of the metallic core 1304 and the exposed surface 1306 of the dielectric substrate 1302. Thereafter, the metallic buffer layer has exposed surfaces. Accordingly, the process further includes depositing a first ferromagnetic layer 502 on the exposed portion 1602 of the metallic buffer layer. After depositing the first ferromagnetic layer 502, the first ferromagnetic layer 502 has exposed surfaces. Accordingly, the process further includes depositing a spacer layer 504 on the exposed surfaces of the first ferromagnetic layer 502. After depositing the spacer layer 504, the spacer layer 504 has exposed surfaces. Accordingly, the process further includes depositing a second ferromagnetic layer 506 on the exposed surfaces of the spacer layer 504. Although not shown, the following steps may be applied to structures that include the metallic buffer layer.

Figure 14B:
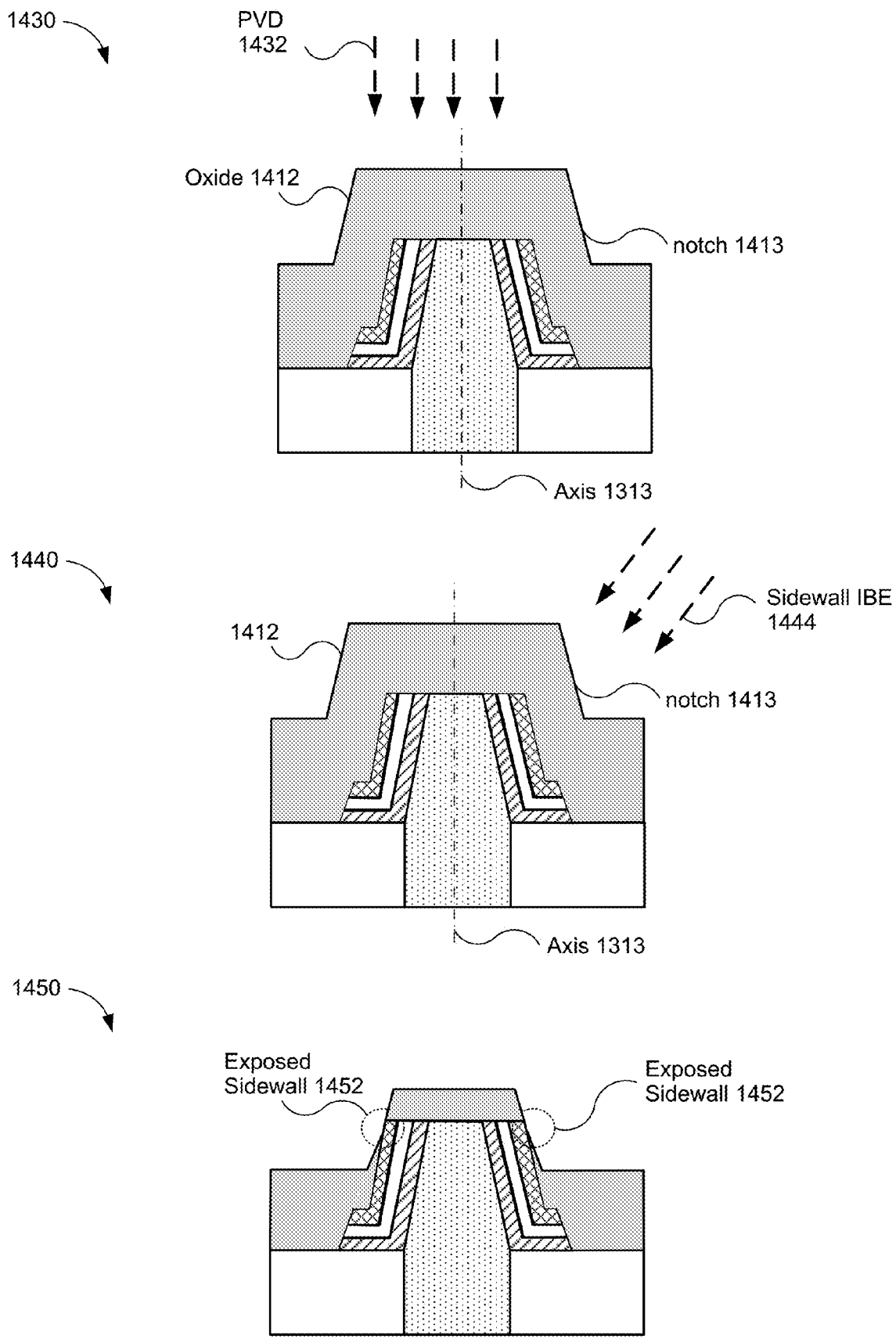
Figure 14C:
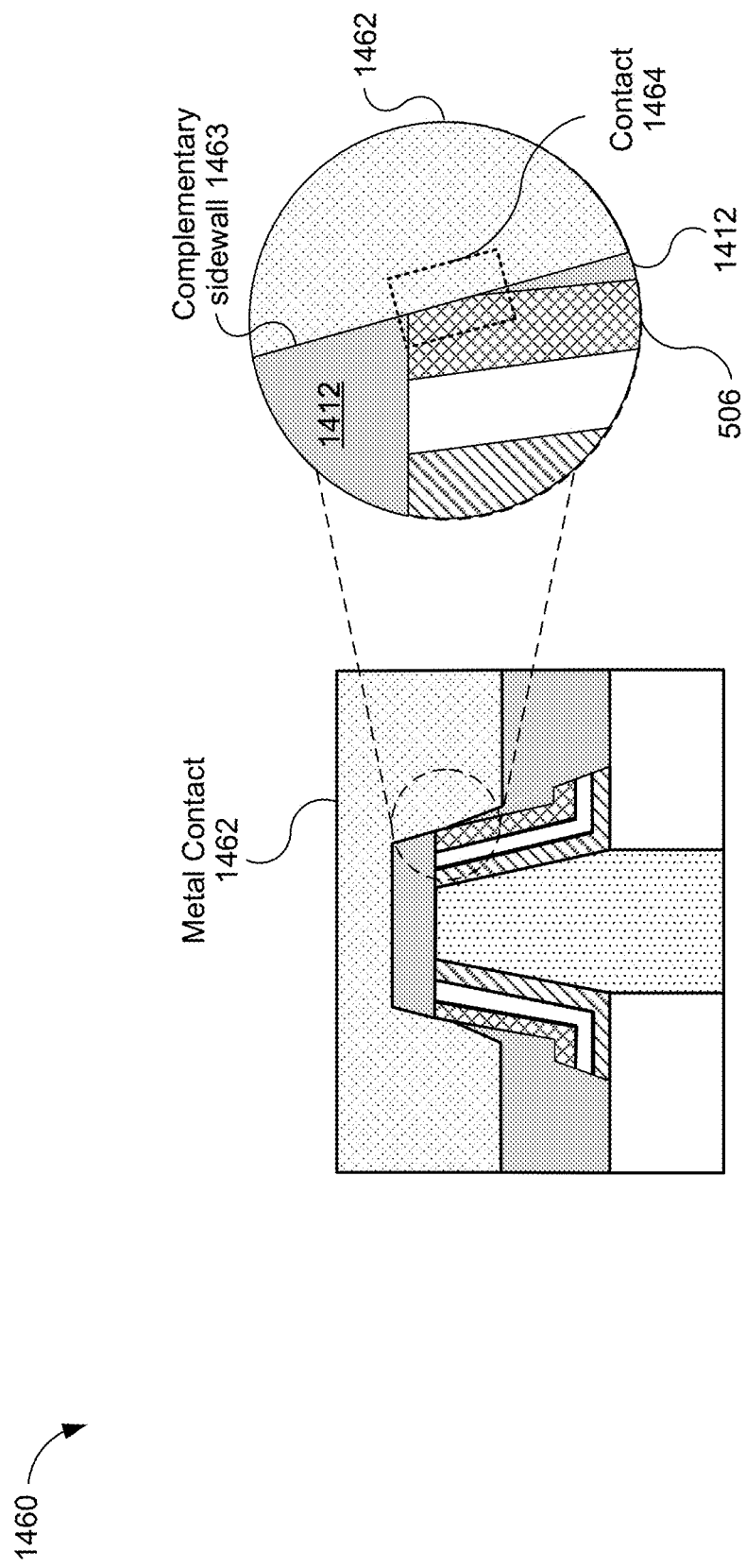

FIGS. 14A-14C illustrate a first option for finishing the MRAM device in accordance with some implementations. The first option corresponds to FIG. 17B.

In the first option, the process includes depositing 1400 an insulating layer (e.g., an oxide 1412) on exposed surfaces of the second ferromagnetic layer 506. In some implementations, the depositing 1400 is achieved using PVD 1402 (or the like). After the PVD 1402, the structure 1410 is achieved. Thereafter, the process further includes removing 1420 portions of the deposited layers at predetermined locations (e.g., selective removal). For example, the removing 1420 removes portions of the first ferromagnetic layer 502, the spacer layer 504, the second ferromagnetic layer 506, and the insulating layer 508 from the offset surface 1606 and the field 1306. In some implementations, the removing is achieved using ion beam etching (IBE) and/or RIE processes. In some implementations, the IBE and/or RIE processes is/are performed at a normal incidence.

In some implementations, the removing 1420 creates and exposes ends 1424 of the plurality of layers. For example, the removing 1420 at least: (i) creates and exposes an end of the first ferromagnetic layer 502, and (ii) creates and exposes an end of the second ferromagnetic layer 506. Moreover, the removing 1420 creates a structure that substantially mirrors a shape of the exposed portion 1602 of the core 1304 (e.g., the resulting structure shown in FIG. 14A is conical in shape). In some implementations, steps 1400 and 1420 are repeated one or more times until a desired result is achieved.

In some implementations, the process further includes depositing 1430 an additional insulating layer (e.g., additional dielectric 1412) on surfaces exposed by the removing 1420 (e.g., using PVD 1432). For example, the depositing 1430 includes at a minimum depositing 1432 the dielectric 1412 on the exposed ends of the first and second ferromagnetic layers, respectively, to electrically insulate the metallic core 1304, the first ferromagnetic layer 502, the spacer layer 504, and the second ferromagnetic layer 506 from one another. In some implementations. The dielectric 1412 is an oxide material (e.g., $SiO_2$, $Al_2O_3$). In some implementations, the dielectric is a nitride material (e.g., $Si_3N_4$, $SiN_x$, TiN etc.). In some implementations, the dielectric 1412 is any other applicable dielectric (e.g., DLC).

In some implementations, the process further includes removing 1440 (e.g., etching, ablating, etc.) portions of the newly deposited insulating layer 1412 to expose, at least partially, a sidewall 1442 of the second ferromagnetic layer 506. In some implementations, the removing is performed using IBE and/or RIE processes 1444 (shown with step 1430 for ease of illustration). In some implementations, the core 1304 and the substrate 1302 rotate about the axis 1313 during the IBE and/or RIE processes 1444. In some implementations, a direction of the ion beam 1444 is substantially perpendicular to the sidewall 1608 of the metallic core 1304 during the rotating (e.g., a glancing incidence). In some implementations, the etching 1444 is combined with a chemically sensitive endpoint technique such as a secondary mass ion spectroscopy technique.

In some implementations, processes 1430 and 1440 are repeated one or more times until a desired result is achieved. An exemplary desired result in shown at step 1450. There, a sidewall 1452 of the second ferromagnetic layer 506 is partially exposed.

The process further includes depositing 1460 (e.g., using PVD or the like) a metal contact 1462 on the insulator layer 1412, where a shape of the metal contact 1462 substantially complements a shape of the insulator layer 1412 (e.g., complements the shape of the oxide 1412 shown at step 1450). Moreover, complementary sidewall portions 1463 of the metal contact 1462 contact 1464 the partially exposed sidewall 1452 of the second ferromagnetic layer 506. In doing so, an electrical connection is made between the metal contact 1462 and the second ferromagnetic layer 506. Additionally, due to the remaining portions of the oxide 1412, the metal contact 1462 is insulated from other components of the MRAM device (e.g., electrically insulated from the first ferromagnetic layer 502, the spacer layer 504, and the metallic core 1304). Due to the successive arrangement of the layers, the metallic core 1304 only contacts the first ferromagnetic layer 502. In some implementations (not shown), the metal contact 1462 is connected to a terminal. For example, the metal contact 1462 is connected to the bit line 508. Alternatively, in a different example, the metal contact 1462 is connected to the source line 510. Although not shown, the metallic core 1304 is also connected to a terminal (e.g., the bit line 508 or the source line 510).

Figure 15A:
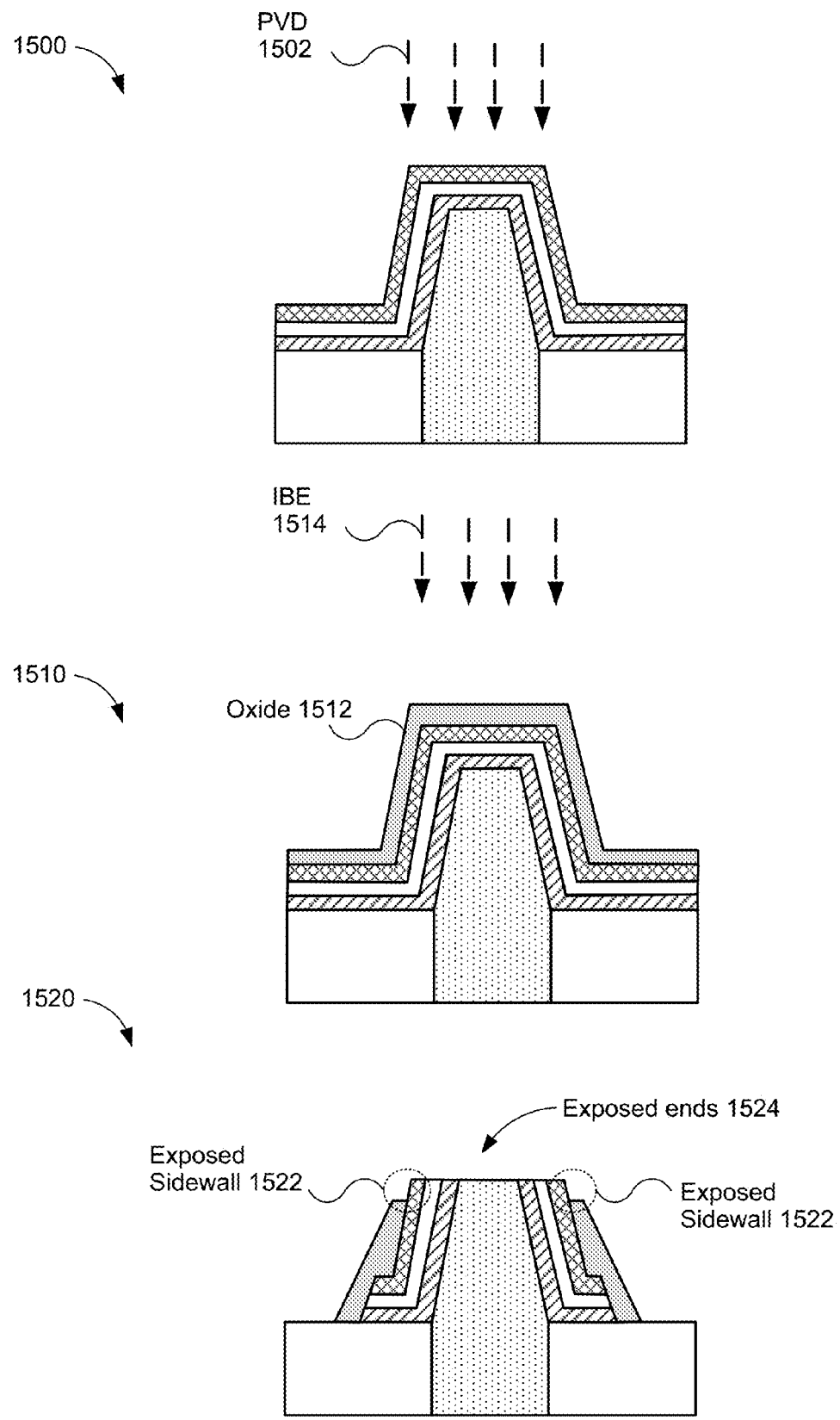

FIGS. 15A-15B illustrate a second option for finishing the MRAM device in accordance with some implementations. The second option corresponds to FIG. 17C.

In the second option, the process includes depositing 1500 an insulating layer (e.g., an oxide 1512) on exposed surfaces of the second ferromagnetic layer 506. In some implementations, the depositing 1500 is achieved using PVD 1502 or the like. Thereafter, the process further includes removing 1510 portions of the deposited layers. For example, the removing 1510 removes portions of the first ferromagnetic layer 502, the spacer layer 504, the second ferromagnetic layer 506, and the insulating layer 1512 from the offset surface 1606 and the field 1306 (result shown at 1520). In some implementations, the removing is performed using IBE and/or RIE processes, or the like (as discussed above with reference to FIG. 14A).

In some implementations, the removing 1510 creates and exposes ends 1524 of the plurality of layers. For example, the exposed ends include at least: (i) an end of the first ferromagnetic layer 502, and (ii) an end of the second ferromagnetic layer 506. Additionally, the removing 1510 removes portions of the insulating layer 1512 to expose, at least partially, a sidewall 1522 of the second ferromagnetic layer 506. The removing 1510 creates a structure that substantially mirrors a shape of the exposed portion 1602 of the core 1304 (e.g., the resulting structure shown at step 1520 is conical in shape). In some implementations, steps 1500 and 1510 are repeated one or more times until a desired result is achieved.

The process further includes depositing 1530 a metal layer 1532 on surfaces newly exposed by the removing 1510. In some implementations, the newly exposed surfaces include, at a minimum, (i) the offset surface 1606 of the core 1304, (ii) the partially exposed sidewall 1522 of the second ferromagnetic layer 506, and (iii) the respective ends 1524 of the first and second ferromagnetic layers. In some implementations, the metal layer 1532 substantially conforms to a shape of the newly exposed surfaces and the remaining oxide 1512. In some implementations, the structure is subsequently encapsulate using another dielectric layer and then the contact at the top of the pillar removed by polishing using chemical-mechanical planarization (CMP) and a possible IBE touch up.

The process further includes, removing 1540 portions of the metal layer 1532 that contact (i) the offset surface 1606 of the core 1304 and (ii) the respective ends 1524 of the first and second ferromagnetic layers. As shown, the metal layer 1532 remains in contact 1542 with the partially exposed sidewall 1522 of the second ferromagnetic layer 506. Moreover, due to the remaining portions of the oxide 1512, the metal layer 1532 is insulated from other components of the MRAM device (e.g., electrically insulated from the first ferromagnetic layer 502, the spacer layer 504, and the metallic core 1304). Due to the successive arrangement of the layers, the metallic core 1304 only contacts the first ferromagnetic layer 502.

In some implementations, the metallic core 1304 is connected to a first terminal (e.g., input terminal 1542), and the second ferromagnetic layer 506 is connected to a second terminal (e.g., output terminal 1544) via the metal layer 1532. Although the core 1304 in FIG. 15B is connected to the input terminal 1542 and the metal layer 1532 is connected to the output terminal 1544, in some implementations, the input terminal 1542 is connected to the metal layer 1532 and the core 1304 is connected to the output terminal 1544. Although not shown about with reference to FIGS. 13-15A, the overall structure shown in FIG. 15B may apply equally to the MRAM devices illustrated in FIGS. 13-15A. The elongated dielectric substrate 1302 is not shown in FIGS. 13-15A for ease of illustration. It is noted that the output terminal 1544 in some implementations is not within the dielectric substrate 1302, but may be connected to the metal layer 1532 at some other location.

In some implementations, the process illustrated and described above with reference to FIGS. 13-15 can be implemented to create an array (e.g., thousands or millions) of MRAM devices. For example, a single dielectric substrate (or multiple substrates positioned adjacent to one another) may be provided with multiple metallic cores (e.g., hundreds or thousands plugs) protruding in a grid-like fashion from the dielectric substrate. In such an arrangement, the steps described above are applied to the metallic cores to form the array. For example, the depositing operation (step 1310-A or 1310-B) would deposit a plurality of layers on each of the metallic cores and the removing operation (step 1420 or 1510) would remove portions of the deposited layers to isolate each core from one another. The remaining steps could then be implemented to finish the array. In some implementations, spacing (e.g., pitch) between each of the plugs ranges from 10 to 100 nm, and the lateral size/diameter of each finished MRAM devices ranges from about 7 to 20 nm.

Figure 17A:
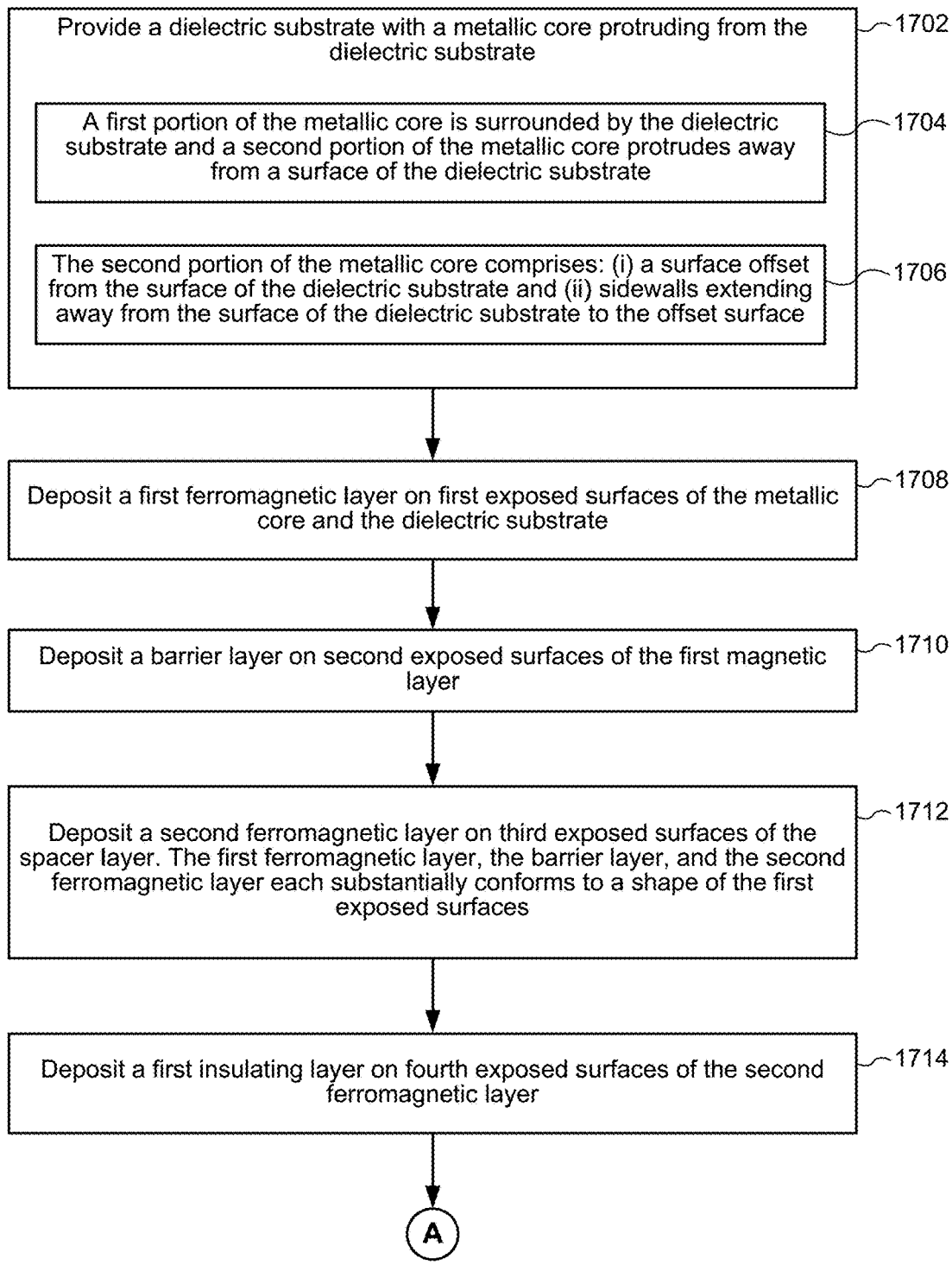
FIGS. 17A-17C are flow diagrams showing a method of fabricating a three-dimensional MRAM device, in accordance with some implementations.
Figure 17B:
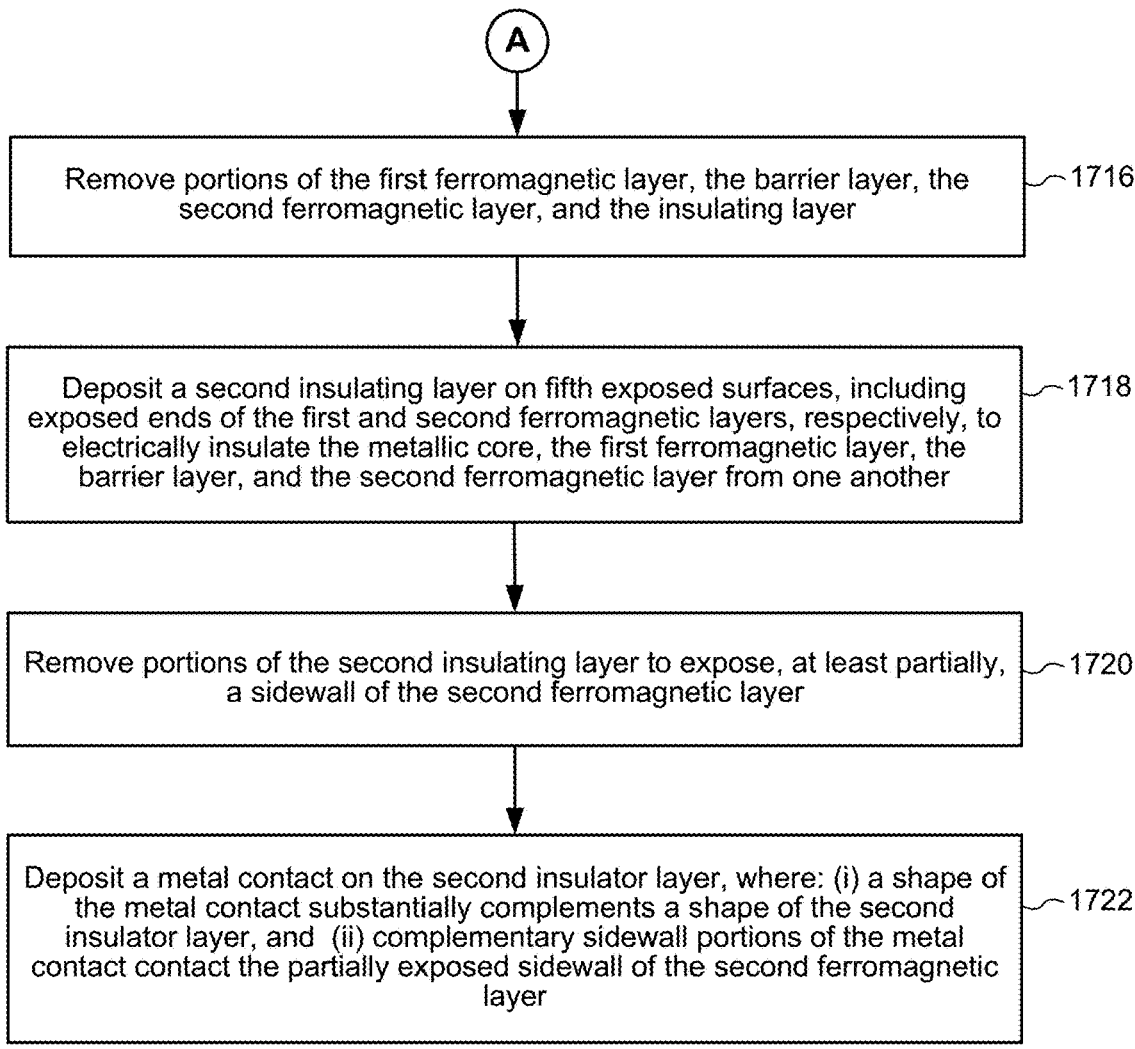
Figure 17C:
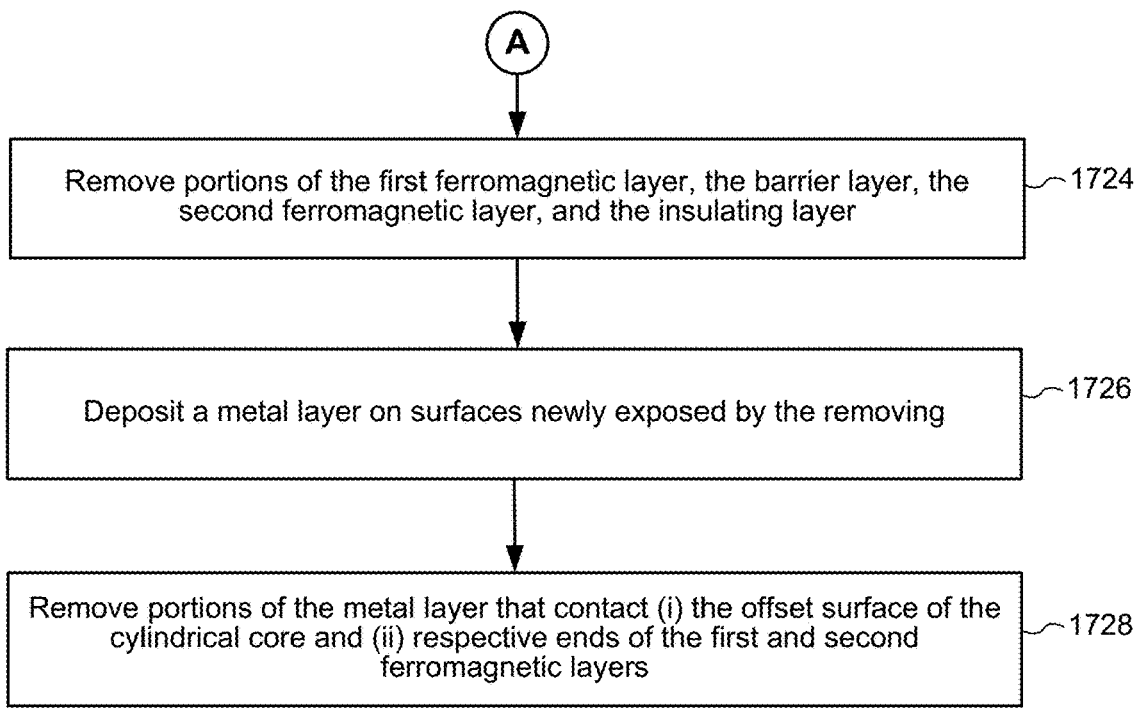

FIGS. 17A-17C are flow diagrams showing a method 1700 of fabricating a three-dimensional MRAM device, in accordance with some implementations. The three-dimensional MRAM device may be an example of the three-dimensional MRAM device 500 and/or the three-dimensional MRAM device 1800.

The method 1700 includes (1702) providing a dielectric substrate (e.g., dielectric substrate 1302, FIG. 13) with a metallic core (e.g., core 1304, FIG. 13) protruding from the dielectric substrate. A first portion (e.g., unexposed portion 1604, FIG. 16) of the metallic core is surrounded by the dielectric substrate and a second portion (e.g., exposed portion 1602, FIG. 16) of the metallic core protrudes away from a surface (e.g., exposed surface 1306, FIG. 13) of the dielectric substrate (1704). Additionally, the second portion of the metallic core comprises: (i) a surface (e.g., surface 1606, FIG. 16) offset from the surface of the dielectric substrate and (ii) sidewalls (e.g., sidewall 1608, FIG. 16) extending away from the surface of the dielectric substrate to the offset surface (1706). In some implementations, the second portion of the metallic core is conical or cylindrical in shape. Providing the dielectric substrate with the metallic core is described in further detail above with reference to step 1300 (FIG. 13).

In some implementations, the dielectric substrate is positioned along a first axis, the metallic core is positioned along a second axis, and the first axis is substantially orthogonal to the second axis. For example, with reference to FIG. 13, the core 1304 is positioned along the axis 1313, and the dielectric substrate 1302 is substantially orthogonal to the axis 1313, and is therefore positioned along a different axis (not shown).

In some implementations, the surface (e.g., exposed surface 1306, FIG. 13) of the dielectric substrate is a first surface, the dielectric substrate includes a second surface that is opposite to the first surface, and a bottom surface (e.g., a surface opposite the offset surface 1606, FIG. 16) of the metallic core and the second surface of the dielectric substrate are coplanar.

In some implementations, the sidewalls of the second portion of the metallic core are slanted relative to the surface of the dielectric substrate (e.g., slanted at angle (a), FIG. 16). Alternatively, in some implementations, the sidewalls of the second portion of the metallic core are perpendicular to the surface of the dielectric substrate.

The method 1700 further includes depositing (1708) a first ferromagnetic layer (e.g., the ferromagnetic layer 502, FIG. 13) on first exposed surfaces of the metallic core and the dielectric substrate. In some implementations, the first exposed surfaces comprise: (i) the offset surface of the metallic core, (ii) the sidewalls in the second portion of the metallic core, and (iii) the surface of the dielectric substrate. When the first ferromagnetic layer is deposited, a first surface of the layer contacts the first exposed surfaces of the metallic core and the dielectric substrate. Thus, the first surface of the first ferromagnetic layer is an unexposed surface. Further, when the first ferromagnetic layer is deposited, a second surface of the layer opposite the first surface becomes exposed, thereby forming the second exposed surfaces. Each deposited layer has the same exposed/unexposed configuration.

The method 1700 further includes depositing (1710) a spacer layer on second exposed surfaces of the first ferromagnetic layer. The spacer layer may be an example of the spacer layer 504 (FIGS. 5 and 13).

The method 1700 further includes depositing (1712) a second ferromagnetic layer (e.g., the ferromagnetic layer 506, FIG. 13) on third exposed surfaces of the spacer layer. After depositing the second ferromagnetic layer, the structure shown at step 1320 is achieved. As shown, the first ferromagnetic layer, the spacer layer, and the second ferromagnetic layer each substantially conforms to a shape of the first exposed surfaces.

The three depositing steps 1708, 1710, and 1712 are illustrated as a single operation at either step 1310-A or 1310-B. As described above with reference to FIG. 13, the depositing operation at step 1310-A involves depositing the respective layers at a glancing incidence while rotating the MRAM device about the axis 1313. In contrast, the depositing operation at step 1310-B involves depositing the respective layers at a normal incidence with no rotation. The result of either step 1310-A or 1310-B is shown at step 1320.

In some implementations, providing the metallic core and the dielectric substrate comprises providing the metallic core and the dielectric substrate in a vacuum chamber. Further, each depositing operation is performed using a physical vapor deposition process within the vacuum chamber.

The method 1700 further includes depositing (1714) an insulating layer (e.g., oxide 1412, FIG. 14A; oxide 1512, FIG. 15A) on fourth exposed surfaces of the second ferromagnetic layer. The result of step 1714 is shown at step 1410 (FIG. 14A) and step 1510 (FIG. 15). The following steps illustrate two different routes to finish fabrication of the MRAM device. The first route is provided in FIG. 17B and the second route is provided in FIG. 17C. FIG. 17B relates to FIGS. 14A-14C, while FIG. 17C relates to FIGS. 15A and 15B.

Turning to FIG. 17B, in some implementations, the method 1700 further includes removing (1716) portions of the first ferromagnetic layer, the spacer layer, the second ferromagnetic layer, and the insulating layer. In some implementations, the removing, at least: (i) creates and exposes an end of the first ferromagnetic layer, and (ii) creates and exposes an end of the second ferromagnetic layer. In some implementations, the removing comprises etching the first ferromagnetic layer, the spacer layer, the second ferromagnetic layer, and the insulating layer using an ion-beam etching and/or a chemically-reactive plasma. For example, with reference to FIG. 14A, at step 1420 the IBE 1422 is used to remove select portions of the deposited layers to expose ends 1424 of the layers adjacent to the offset surface 1606 of the core 1304. Additionally, the IBE 1422 removes select portions of the deposited layers on the exposed surface 1306 of the dielectric substrate 1302. This removal is particularly important when fabricating an array of MRAM devices because the removal isolates each of the MRAM devices in the array. In this way, each MRAM device in the array can be programmed individually as either a "0" or a "1."

In some implementations, steps 1714 and 1716 are repeated one or more times until a desired result is achieved.

Continuing, in some implementations, the method 1700 further includes depositing (1718) a second insulating layer on fifth exposed surfaces, including the exposed ends of the first and second ferromagnetic layers, respectively, to electrically insulate the metallic core, the first ferromagnetic layer, the spacer layer, and the second ferromagnetic layer from one another. In some implementations, a thickness of the second insulating layer paralleling the sidewalls of the second portion of the metallic core is less than other thicknesses of the second insulating layer. For example, with reference to FIG. 14B, at step 1430 a PVD process 1432 deposits the oxide 1412 onto the structure that resulted from step 1420. The oxide 1412 includes a notch 1413 making a thickness of the oxide 1412 paralleling the sidewall of the metallic core be less than other thicknesses of the oxide 1412.

In some implementations, the method 1700 further includes removing (1720) portions of the second insulating layer to expose, at least partially, a sidewall of the second ferromagnetic layer. For example, at step 1440 a sidewall IBE 1444 (or the like) removes portions of the oxide 1412 to expose the sidewall 1452 of the second ferromagnetic layer 506. In some implementations, the method 1700 further includes rotating the metallic core while removing (1720) the portions of the second insulating layer to partially expose the sidewall of the second ferromagnetic layer (e.g., rotate about the axis 1313, FIG. 14B). Moreover, in some implementations, the removing comprises etching (e.g., ablating) the second insulating layer using ion-beam etching and/or a chemically-reactive plasma, where a direction of the ion beam is substantially perpendicular to the sidewalls of the second portion of the metallic core during the rotating (e.g., a glancing incidence). In some implementations, steps 1718 and 1720 are repeated one or more times until a desired result is achieved.

In some implementations, the method 1700 further includes, after the removing (1720), depositing (1722) a metal contact on the second insulator layer, as shown at step 1460 (FIG. 14C). As shown in FIG. 14C, a shape of the metal contact 1462 substantially complements a shape of the second insulator layer 1412. Moreover, complementary sidewall portions 1463 of the metal contact 1462 contact 1464 the partially exposed sidewall 1452 of the second ferromagnetic layer 506. In doing so, an electrical connection is made between the metal contact 1462 and the second ferromagnetic layer 506. Additionally, due to the remaining portions of the oxide 1412, the metal contact 1462 is insulated from other components of the MRAM device (e.g., electrically insulated from the first ferromagnetic layer 502, the spacer layer 504, and the metallic core 1304).

Turning to FIG. 17C, in some implementations, the method 1700 further includes removing (1724) portions of the first ferromagnetic layer, the spacer layer, the second ferromagnetic layer, and the insulating layer, where the removing at least (i) exposes the offset surface of the metallic core and (ii) partially exposes a sidewall of the second ferromagnetic layer (e.g., exposed sidewall 1522, FIG. 15A). For example, the IBE process 1514 (or the like) removes select portions of the deposited layers to expose ends 1524 of the layers adjacent to the offset surface 1606 of the core 1304. Additionally, the IBE 1514 removes select portions of the deposited layers on the exposed surface 1306 of the dielectric substrate 1302.

In some implementations, steps 1714 and 1724 are repeated one or more times until a desired result is achieved.

In some implementations, the method 1700 further includes depositing (1726) a metal layer on surfaces newly exposed by the removing. In some implementations, the newly exposed surfaces includes: (i) the offset surface of the cylindrical core, (ii) the partially exposed sidewall of the second ferromagnetic layer, and (iii) the respective ends of the first and second ferromagnetic layers. For example, the metal layer 1532 is deposited on the structure at step 1530. As shown in FIG. 15B, the metal layer 1532 substantially conforms to a shape of the newly exposed surfaces.

In some implementations, the method 1700 further includes removing (1728) portions of the metal layer 1530 that contact (i) the offset surface of the cylindrical core and (ii) the respective ends of the first and second ferromagnetic layers. For example, the portions removed during step 1728 can be determined by comparing the structures shown at steps 1530 and 1540 (FIG. 15B). Importantly, the metal layer 1532 remains in contact 1542 with the partially exposed sidewall 1522 of the second ferromagnetic layer 506. Moreover, the oxide 1512 prevents the metal layer 1532 from contacting the spacer layer 504, the first ferromagnetic layer 502, and the core 1304.

Further, as shown in FIG. 15B, the metallic core is connected to a first terminal (e.g., input terminal 1542) and the second ferromagnetic layer is connected to a second terminal (e.g., output terminal 1544) via the metal layer 1532.

In some implementations, the steps of the method 1700 may be repeated such that additional three-dimensional MRAM devices are fabricated. In addition, in some implementations, the method 1700 further includes forming an array of three-dimensional MRAM devices. Moreover, in some implementations, the dielectric substrate is a dielectric substrate associated with each three-dimensional MRAM devices in the array of three-dimensional MRAM devices. Alternatively, in some implementations, each three-dimensional MRAM device includes a distinct dielectric substrate.

The array of three-dimensional MRAM devices may be interconnect via busing (or other forms of electrical contacts and terminals) and may further be connected to one or more processors (not shown).

Figure 18:
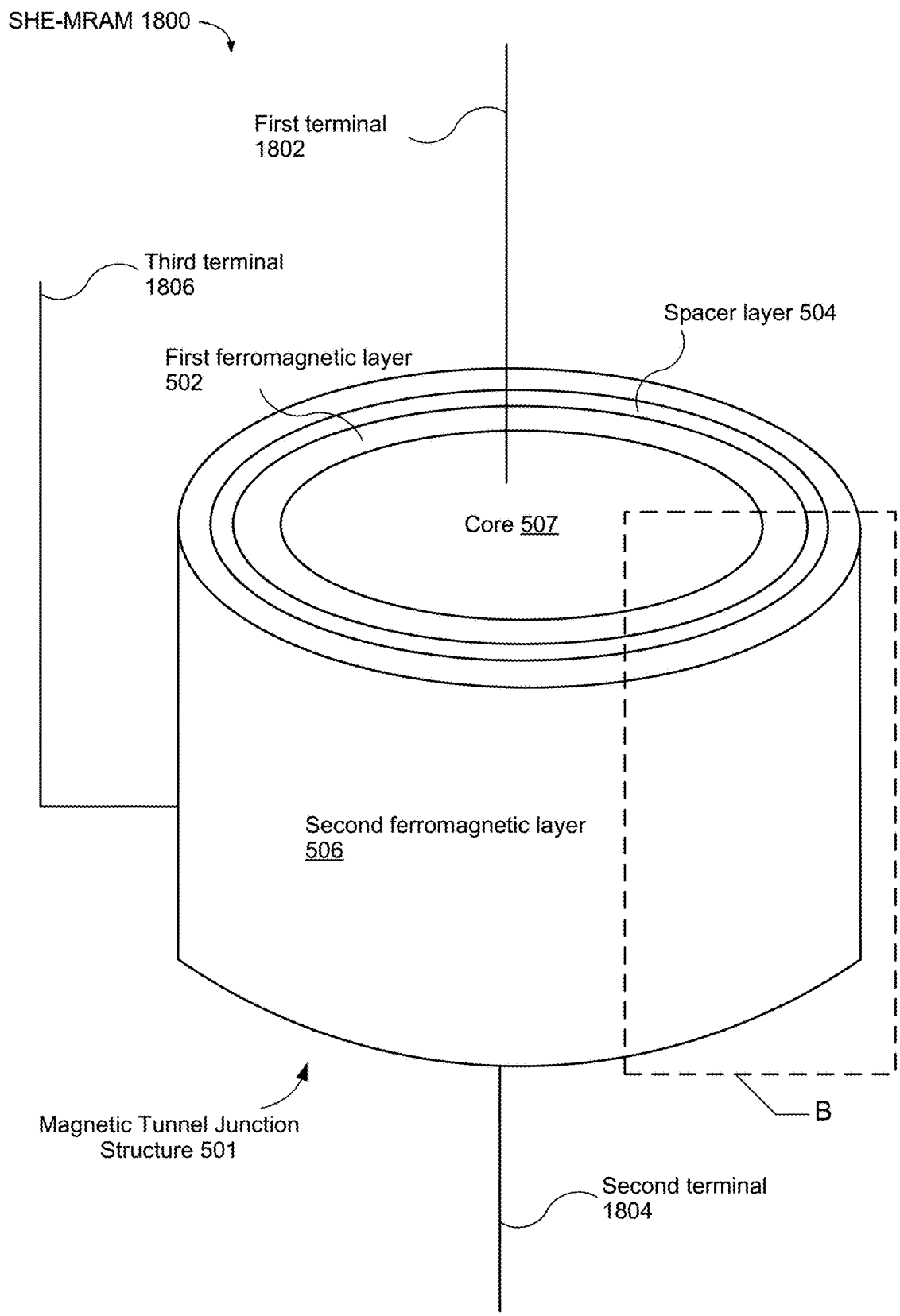
FIG. 18 illustrates an exemplary cylindrical Spin Hall Effect (SHE) three-dimensional MRAM device in accordance with some implementations.

FIG. 18 illustrates a three-dimensional Spin Hall Effect (SHE) MRAM device 1800 in accordance with some implementations. The SHE MRAM device 1800 is similar to the STT MRAM device 500 explained above, except that the SHE MRAM device 1800 includes three terminals 1802, 1804, and 1806, whereas the STT MRAM device 500 includes two terminals (e.g., the bit line 508 and the source line 510, FIG. 5). Like the STT MRAM device 500, the SHE device 1800 includes a plurality of layers (e.g., the reference layer 102, the spacer layer 104, and the storage layer 106, FIG. 1A) wrapped around a central core 507, thereby forming a three-dimensional cylindrical (or conical) MTJ structure 501. The MTJ structure 501 is discussed in further detail above with reference to FIG. 5 and will not be repeated here.

The SHE MRAM device 1800 includes a first terminal 1802 and a second terminal 1804 connected to opposing ends of the core 507, respectively. The first and second terminals are used to create the SHE. A "Spin Hall Effect" is a spin accumulation on lateral surfaces of an electric current-carrying sample, where signs of the spin directions are opposite on opposing boundaries of the electric current-carrying sample. However, a cylindrical electric current-carrying sample (e.g., core 507) does not have opposing boundaries. Because of this, the current-induced surface spins wind around a perimeter of the cylindrical electric current-carrying sample. Moreover, when the current direction is reversed, the directions of spin orientation is also reversed (e.g., switches from a clockwise chirality to a counterclockwise chirality, or vice versa). Accordingly, when the current passes from the first terminal 1802 to the second terminal 1804, the SHE winds around the perimeter of the core 507 in a first direction (e.g., a first chirality), and when the current passes from the second terminal 1804 to the first terminal 1802, the SHE winds around the perimeter of the core 507 in a second direction (e.g., a second chirality).

The third terminal 1806 receives (or provides) a STT current, which is the current discussed above with reference to FIGS. 5-12. For example, in a first flow direction (e.g., inside out), the STT current (e.g., electron flow 615, FIGS.

6A and 6C) flows radially from the core 507 through the plurality of layers. In doing so, the STT current imparts a torque on, at least, a magnetization of an inner layer of the plurality of layer (e.g., the storage layer 502, FIG. 6C). In another example, in a second flow direction (e.g., outside in), the STT flows from the outer layer 506 through the plurality of layers towards the core 507. As discussed above, the flow of the STT current through the MTJ structure 501 imparts a torque on magnetizations of the two ferromagnetic layers. In some implementations, the third terminal 1806 is also used to readout the resistance state or stored memory state of the SHE MRAM device.

Additionally, the first terminal 1802 (or the second terminal 1804, depending on the circumstances, such as the magnetic ground state of the storage layer 502) provides the SHE current to the core 507, and the SHE current imparts the SHE around a perimeter of the core 507. In doing so, the SHE imparted around the perimeter of the core 507 contributes to the torque imparted on the magnetization of the first ferromagnetic layer 502 by the STT current.

In some implementations, the STT current has a first magnitude and the SHE current has a second magnitude that is different from (e.g., greater than) the first magnitude. In addition, in some implementations, a magnitude of the SHE current changes depending on the magnetic ground state of the SHE MRAM device 1800. For example, when the SHE MRAM device 1800 is in the perpendicular magnetic ground state, the SHE current is increased relative to the SHE current when the SHE MRAM device 1800 is in the vortex magnetic ground state (or vice versa). Moreover, in some implementations, a pulse duration of the SHE current changes depending on the magnetic ground state of the SHE MRAM device 1800. For example, when the SHE MRAM device 1800 is in the perpendicular magnetic ground state, a pulse duration of the SHE current is decreased relative to a pulse duration of the SHE current when the SHE MRAM device 1800 is in the vortex magnetic ground state (or vice versa).

Figure 19A:
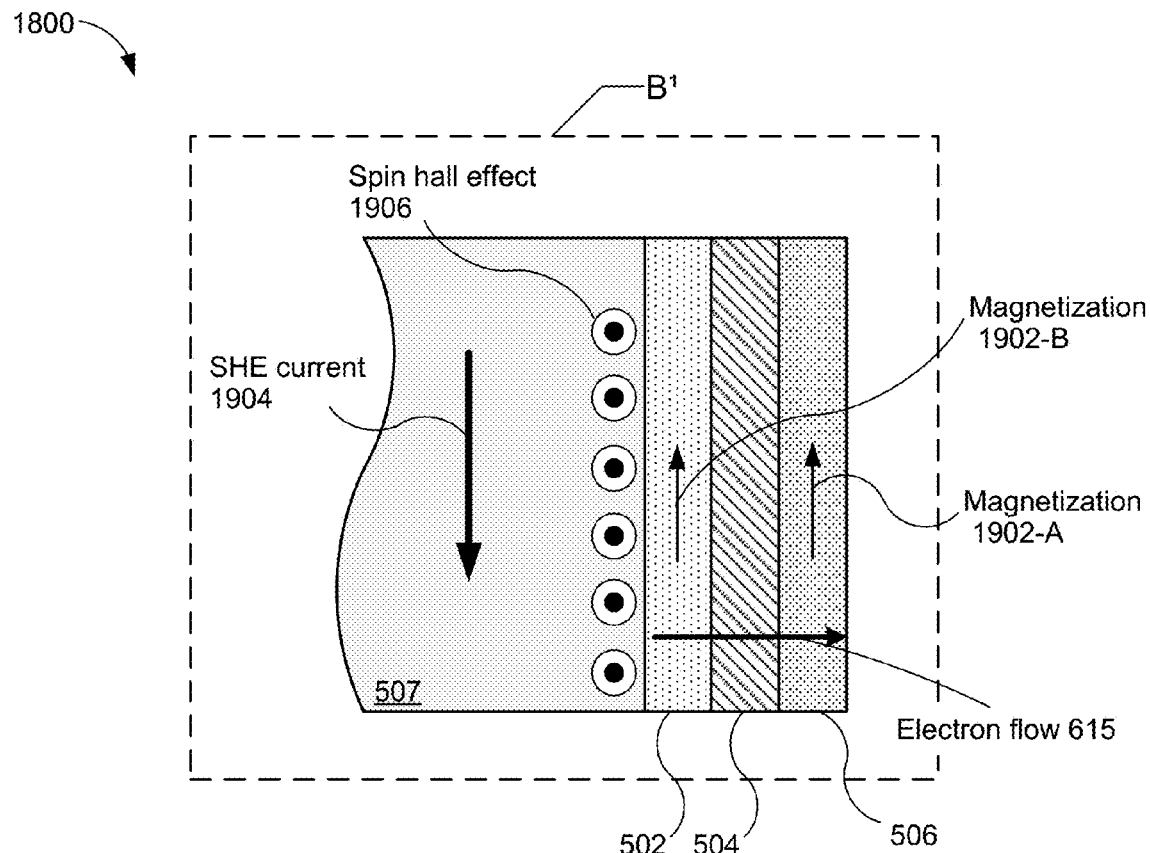
FIGS. 19A-19C are cross-sectional views of the cylindrical SHE three-dimensional MRAM device of FIG. 18 having different magnetization orientations in accordance with some implementations.
Figure 19B:
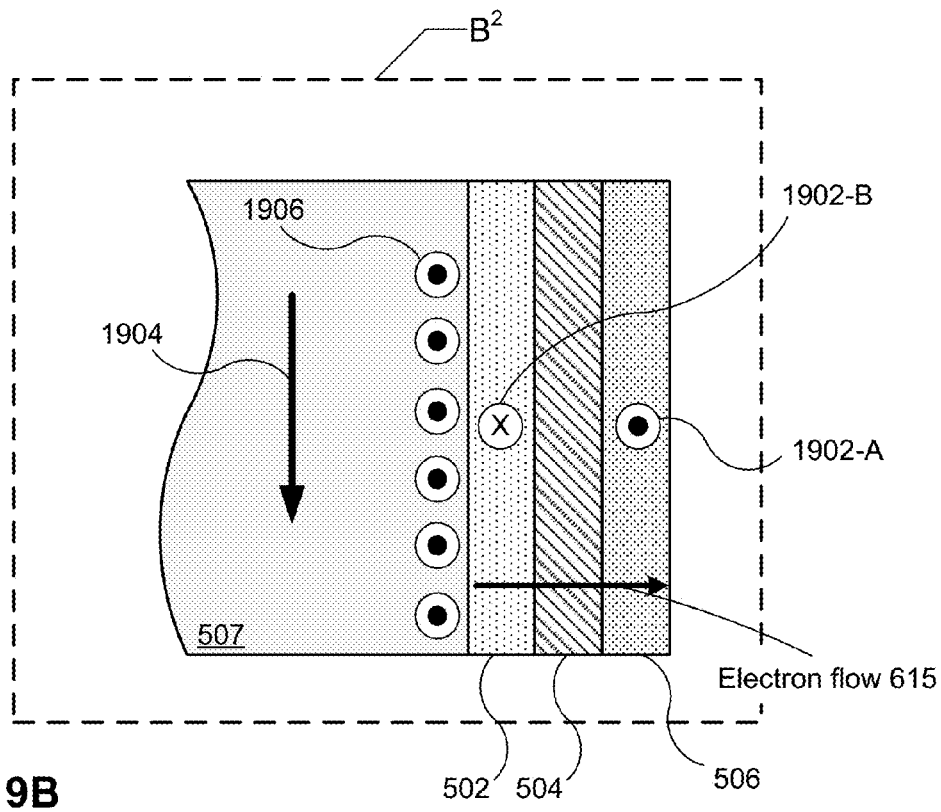
Figure 19C:
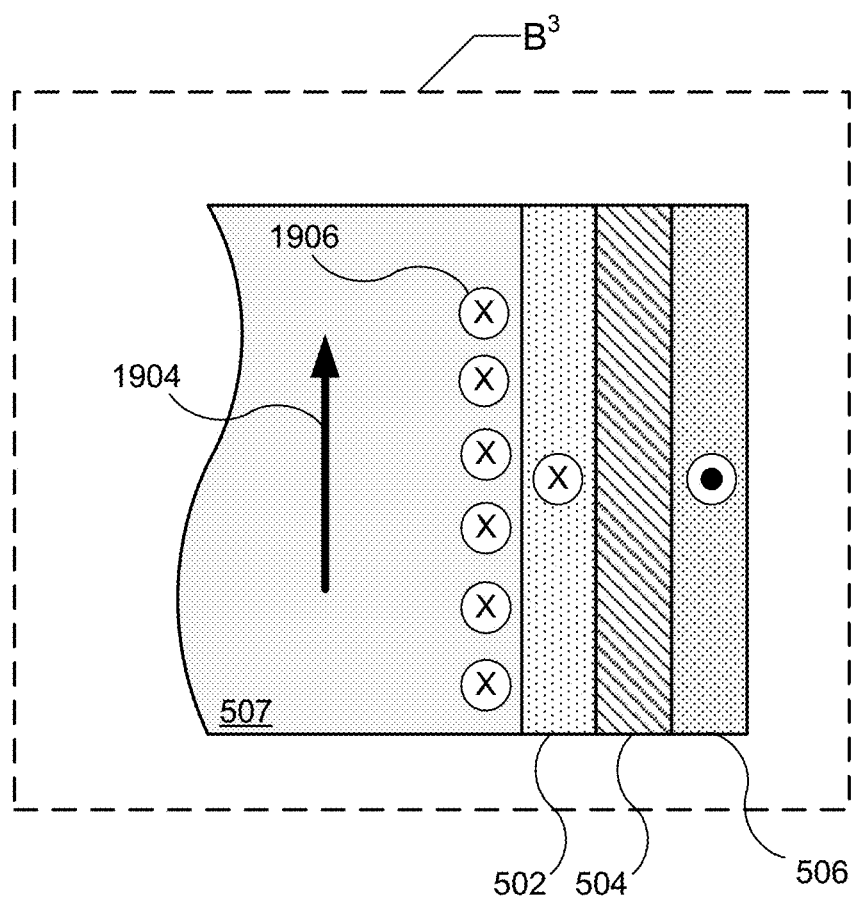

For ease of discussion with regards to FIGS. 19A-19C, the first cylindrical ferromagnetic layer 502 is the storage layer 502 (also referred to as an inner layer) and the second cylindrical ferromagnetic layer 506 is the reference layer 506 (also referred to as an outer or outermost layer). However, as noted above, a configuration of the storage layer 502 and the reference layer 506 may be reversed depending on the circumstances.

FIGS. 19A-19C illustrate cross-sectional views (taken along line B, FIG. 18) of magnetization orientations of the cylindrical MTJ structure 501 in accordance with some implementations.

Figure 20:
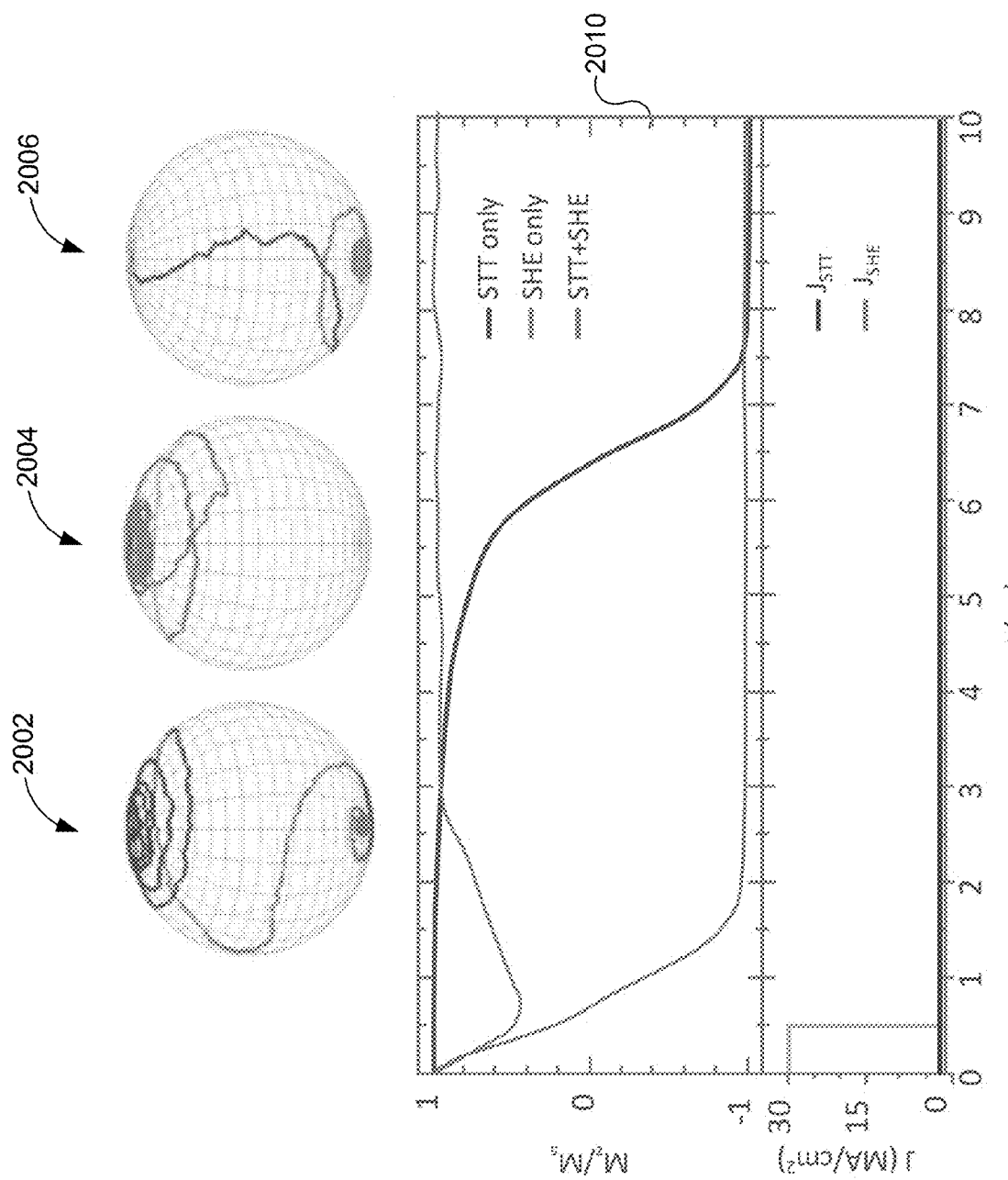
FIG. 20 illustrates representations of switching a ferromagnetic layer from a first polarization to a second polarization in accordance with some implementations.

FIG. 19A illustrates a cross-sectional view of the cylindrical MTJ structure 501 having a perpendicular magnetization orientation (e.g., perpendicular magnetization orientation 710, FIG. 7). Further, FIG. 19A illustrates the magnetization directions 1902-A, 1902-B of the storage and reference layers in a parallel configuration (although not shown, the magnetization directions 1902-A, 1902-B of the storage and reference layers could also be in an anti-parallel configuration). FIG. 19A illustrates a SHE current 1904 passing through the core 507 from the first terminal 1802 to the second terminal 1804 (e.g., from top to bottom). The STT current is also being applied, which results in the electron flow 615 (shown going left to right, but could also go right to left, depending on the circumstances). The SHE current 1904 creates a SHE 1906 that winds around the perimeter of the core 507. In this example, the SHE 1906 (e.g., SHE-electrons) is shown going into the page, and therefore the SHE 1906 is rotating around the perimeter of the core 507 in a counterclockwise direction. Accordingly, the rotation of the SHE-electrons 1906 is orthogonal to the magnetization 1902 of the storage layer 502 and the reference layer 506. In such a configuration, the SHE-electrons 1906 provide a spike of orthogonal spin-polarized electrons to the storage layer 502 that jumpstart the storage layer's 502 precession (e.g., transition) from a first direction of magnetization (e.g., upwards) to a second direction of magnetization (e.g., downwards). In some implementations, to maximize the effect of the jumpstart, the SHE current 1904 is a short pulse relative to the precession period of the storage layer 502. For example, the pulse spans from approximately 0.1 to 1 nanoseconds. It is noted that the STT current continues to be applied after the SHE current pulse ceases, as shown in FIG. 20. The SHE current 1904 and the STT current with respect the perpendicular magnetization orientation is discussed in further detail below with reference to FIGS. 20 and 21.

FIG. 19B illustrates a cross-sectional view of the cylindrical MTJ structure 501 having a vortex magnetization orientation (e.g., vortex magnetization orientation 700, FIG. 7). Further, FIG. 19B illustrates the magnetization directions 1902-A, 1902-B of the storage and reference layers in an anti-parallel configuration. For example, the magnetization 1902-A of the reference layer 506 is in a first direction (e.g., a counterclockwise chirality) and the magnetization 1902-B of the storage layer 502 is in a second direction opposite the first directions (e.g., a clockwise chirality). FIG. 19B illustrates a SHE current 1904 passing through the core 507 from the first terminal 1802 to the second terminal 1804. In this example, the majority spin polarization of the SHE current 1906 or SHE spin polarization is shown coming going into the page, and therefore the magnetic moment of the SHE-electrons 1906 are rotating around the perimeter of the core 507 in a counterclockwise direction. Accordingly, the rotation of the magnetic moment resulting from the SHE-electrons 1906 is (i) aligned with and parallel to the magnetization 1902-A of the reference layer 506, and (ii) opposite and parallel to the magnetization 1902-B of the storage layer 502.

In the vortex magnetic ground state, the SHE spin polarization 1906 stabilize a ferromagnetic layer when the SHE spin polarization 1906 is aligned with and parallel to the magnetization of the layer (e.g., if both have the same chirality), or the SHE spin polarization 1906 tend to switch a magnetization direction of a ferromagnetic layer when the spin of the SHE-electrons 1906 are opposite and parallel to the magnetization of the layer (e.g., if both have opposite chiralities). It is noted that, in some implementations, the SHE current is not a short pulse when the ferromagnetic layer is in the vortex magnetization orientation.

FIG. 19C illustrates a cross-sectional view of the cylindrical MTJ structure 501 having the vortex magnetization orientation. FIG. 19C illustrates a SHE current 1904 passing through the core 507 from the second terminal 1804 to the first terminal 1802. In this example, the SHE spin polarization 1906 is shown coming out of the page, and therefore the spin of the SHE electrons 1906 is rotating around the perimeter of the core 507 in a clockwise direction. Accordingly, the rotation of the SHE-spin polarization 1906 is (i) opposite and parallel to the magnetization 1902-A of the reference layer 506, and (ii) aligned with and parallel to the magnetization 1902-B of the storage layer 502. It is noted that the results shown in FIGS. 19B-19C are merely two of the resulting spin hall effects. One skilled in the art will appreciate that in some instances the resulting spin hall effects shown in FIGS. 19B-19C may be reversed.

Figure 21:
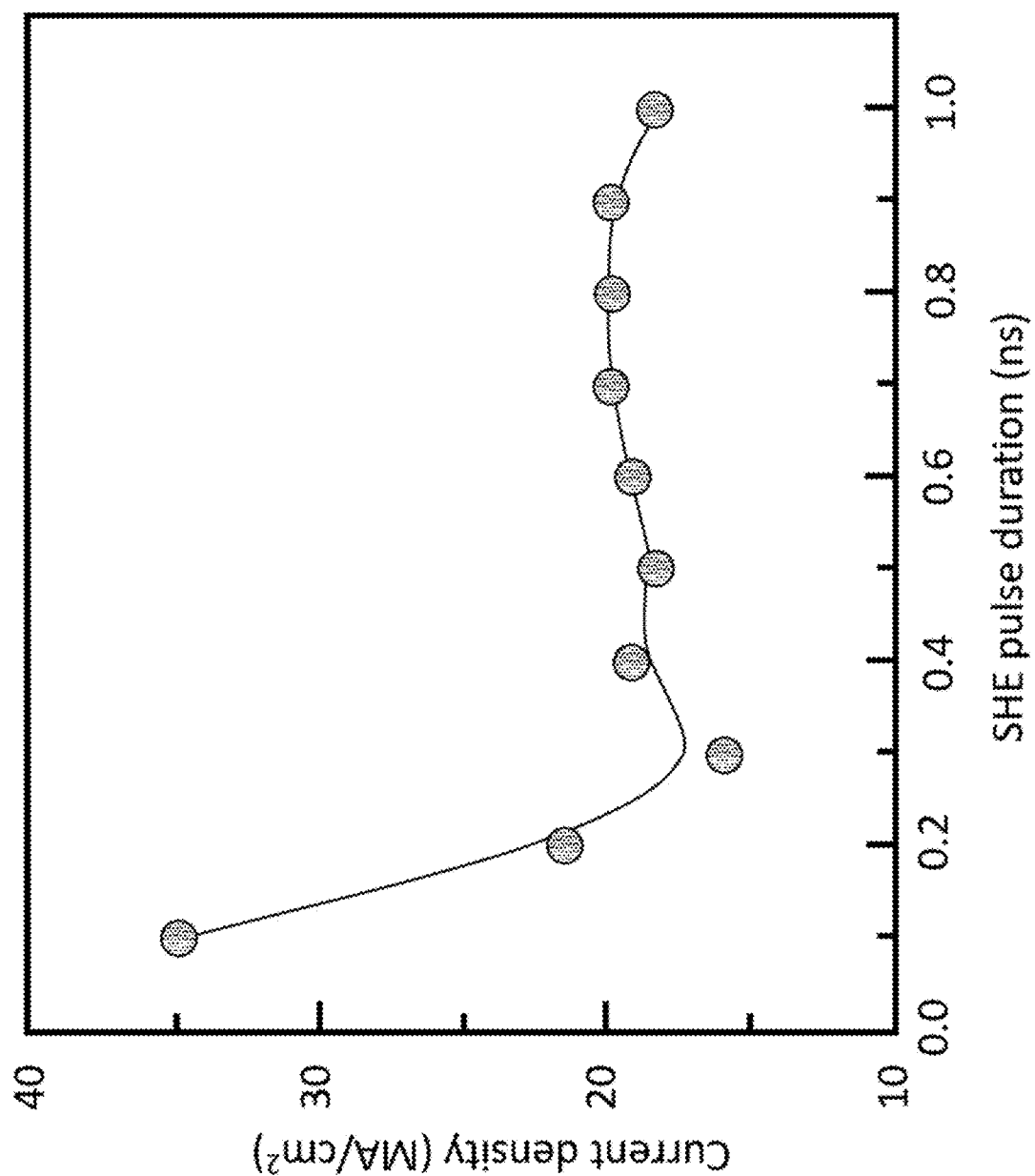
FIG. 21 provides a diagram showing a relationship between SHE current density and SHE pulse duration.

For convenience, FIGS. 20 and 21 have been reproduced from A. Van den Brink et al. "Spin-Hall-assisted magnetic random access memory," Appl. Phys. Lett. 104, 012403 (2014).

FIG. 20 illustrates representations of a ferromagnetic layer (e.g., storage layer 106, FIG. 1A) switching from a first magnetization direction to a second magnetization direction in accordance with some implementations ("1" to "−1") (e.g., switching from a first magnetization direction (e.g., upwards) to a second magnetization direction (e.g., downwards)). FIG. 20 includes three different magnetization representations 2002, 2004, and 2006 of a ferromagnetic layer in a perpendicular magnetic ground state. Polarization representation 2002 shows a polarization (e.g., magnetization) of the ferromagnetic layer switching from "1" to "−1" using only STT current (shown as $J_{STT}$). In diagram 2010, the polarization of the ferromagnetic layer using $J_{STT}$ alone remains initially near "1." After approximately 4-5 nanoseconds of applying the STT current to the ferromagnetic layer, the polarization gradually switches from "1" to "4." In total, the switch from "1" to "−1" spans approximately 8 nanoseconds when using $J_{STT}$ alone. The result illustrated in polarization representation 2002 in some instances corresponds to the STT MRAM device 500 (FIG. 5) and the transition from FIG. 6A to FIG. 6B (e.g., a transition from a parallel configuration to an anti-parallel configuration).

Polarization representation 2004 shows a polarization of the ferromagnetic layer attempting to switch from "1" to "−1" using only SHE current (shown an $J_{SHE}$). In diagram 2010, the polarization of the ferromagnetic layer remains near "1," and is unable to switch from "1" to "−1." The SHE current alone is generally unable to switch the polarization of the ferromagnetic layer from "1" to "−1" because, in the perpendicular magnetic ground state, the SHE current creates a SHE around the perimeter of the core 507 that is orthogonal to a magnetization of the ferromagnetic layer, as illustrated and described above with reference to FIG. 19A. Thus, after an initial brief period of time in which the SHE facilitates switching, the SHE begins to impede the switching process or simply does nothing.

Polarization representation 2006 shows a polarization of the ferromagnetic layer switching from "1" to "−1" using STT current and the SHE current simultaneously, at least initially. In diagram 2010, the SHE current and the STT current are initially applied to the ferromagnetic layer simultaneously. As discussed above with reference to FIG. 19A, the SHE current is applied as a pulse, whereas the STT current is continuously applied. The SHE current pulse jumpstarts the switching processes, as shown by the polarization of the ferromagnetic layer almost immediately moving downwards away from "1." Even after the SHE current pulse is stopped, the polarization of the ferromagnetic continues downwards, and the switch from "1" to "−1" spans approximately 2 nanoseconds. Accordingly, the switching time for the polarization representation 2006 is substantially less than the switching time for the polarization representation 2002. Moreover, in some implementations (not shown), the current density of the STT current in the polarization representation 2006 is less than the current density of the STT current in the polarization representation 2002. Thus, in some implementations, using the STT current and the SHE current simultaneously, at least initially, to switch the polarization of the ferromagnetic layer (i) reduces a current density of the STT current, and (ii) facilitates faster switching of the ferromagnetic layer from a first polarization to a second polarization.

In some implementations, a current density of the SHE current is changed depending on a pulse length of the applied SHE current. FIG. 21 provides a diagram showing a relationship between SHE current density and SHE pulse duration.

Figure 22:
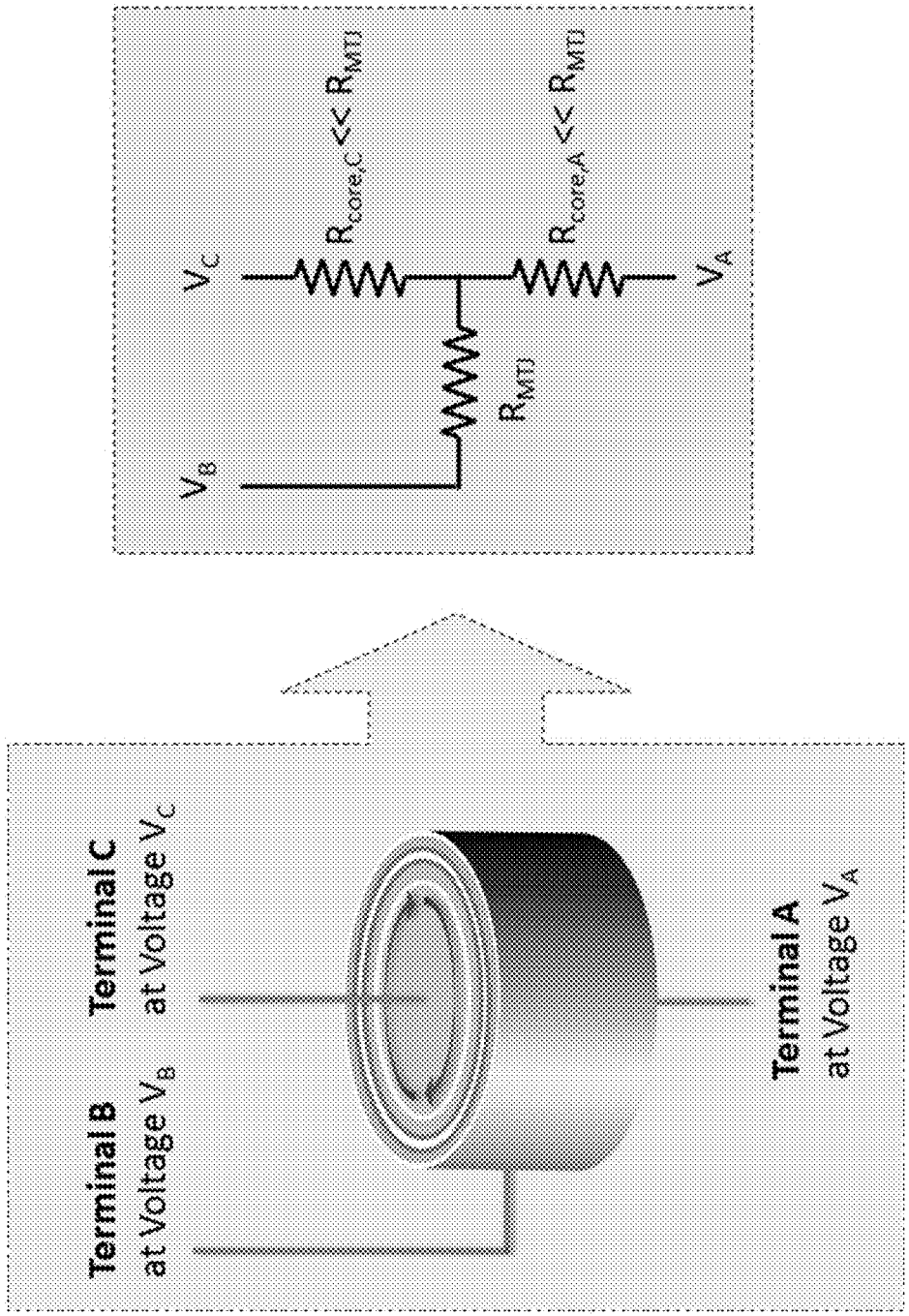
FIG. 22 is a schematic diagram of relative resistances for the SHE-MRAM device of FIG. 18 in accordance with some implementations.

FIG. 22 is a schematic diagram of relative resistances for the SHE-MRAM device of FIG. 18 in accordance with some implementations. Terminal C corresponds to the first terminal 1802, terminal A corresponds to the second terminal 1804, and terminal B corresponds to the third terminal 1806. As shown, each terminal is at a voltage (e.g., terminal C is at voltage $V_C$, terminal A is at voltage $V_A$, and terminal B is at voltage $V_B$). In some implementations, one or more of the voltages differ from each other.

The schematic diagram further provides relative resistances for different portions of the MRAM device (e.g., a resistance through the MTJ structure ($R_{MTJ}$), and two resistances through the core ($R_{CORE,A}$ and $R_{CORE,C}$). As shown, the $R_{MTJ}$ is far greater than both $R_{CORE,A}$ and $R_{CORE,C}$. This occurs because voltage passing through the MTJ has to pass through the plurality of layers, including the spacer layer which is an insulator. In contrast, the core is a conductive metal, which provides little resistance to a current passing through it. Consequently, the current/voltage passed through the $R_{MTJ}$ is small compared to the currents passed through $R_{CORE,A}$ and $R_{CORE,C}$. Thus, from Kirkhoff's law, $I_{CORE,A} \approx I_{CORE,C}$, and therefore, $I_{CORE,A}$ and $I_{CORE,C}$ can be treated as if they are the same current: the "Spin Hall current" (e.g., $I_{SHE} \gg I_{STT}$). In this example, one assumes a current source at terminal A and terminals B and C are grounded. Accordingly, $I_{SHE}$ and $I_{STT}$ are not independently set up. Further, in this example, to first approximation, $I_C \gg I_B$, $R_{MTJ} \gg R_{coreA}$ and $R_{MTJ} \gg RcoreB$. $I_{STT} \sim I_B$ and $I_{SHE} \sim I_C$ because $I_B$ is much smaller.

In some implementations, terminal A is grounded and two current sources, one each at terminals B ($I_B$) and C ($I_C$), are used (e.g., each power supply supplies a fixed current with the voltage at terminal B and C floating). Accordingly, the current going through $R_{CORE,A}$ would be the sum of the currents $I_B$ and $I_C$. In this example, $I_{STT}=I_B$. In some implementations, there is no well-defined ABC node and $I_{SHE}$ is a continuous function of the position along the core. Accordingly, determining $I_{SHE}$ would be more complicated since $I_{SHE}=I_C$ above the node connecting ABC and $I_{SHE}=I_C+I_B$ below the node connecting ABC.

Referring to FIG. 21, as an example, $J_{SHE} \sim 30$ MA/cm$^2$ and $J_{STT} \sim 1$ MA/cm$^2$. In this example, using a Ta core with resistivity 1.3E-5 Ω·cm, a width of 10 nm and a height of ~30 nm, the resistance of the Ta core would be ~12Ω. Further, in this example, using a MgO barrier with an RA product of 10 Ω·μm$^2$, the resistance of the barrier would be ~10 kΩ. According to this example, in order to obtain an $I_{SHE}$ of ~7.4E-5 A ($J_{SHE}$ multiplied by the cross section of the core) voltages of ~1 mV to terminal C and ~100 mV to terminal B are applied. The timing of those pulses could be less than ~10 ns. An example pulse would be 1 mV SHE pulse for ~2 ns and a simultaneous 10 ns STT 100 mV pulse.

Figure 23:
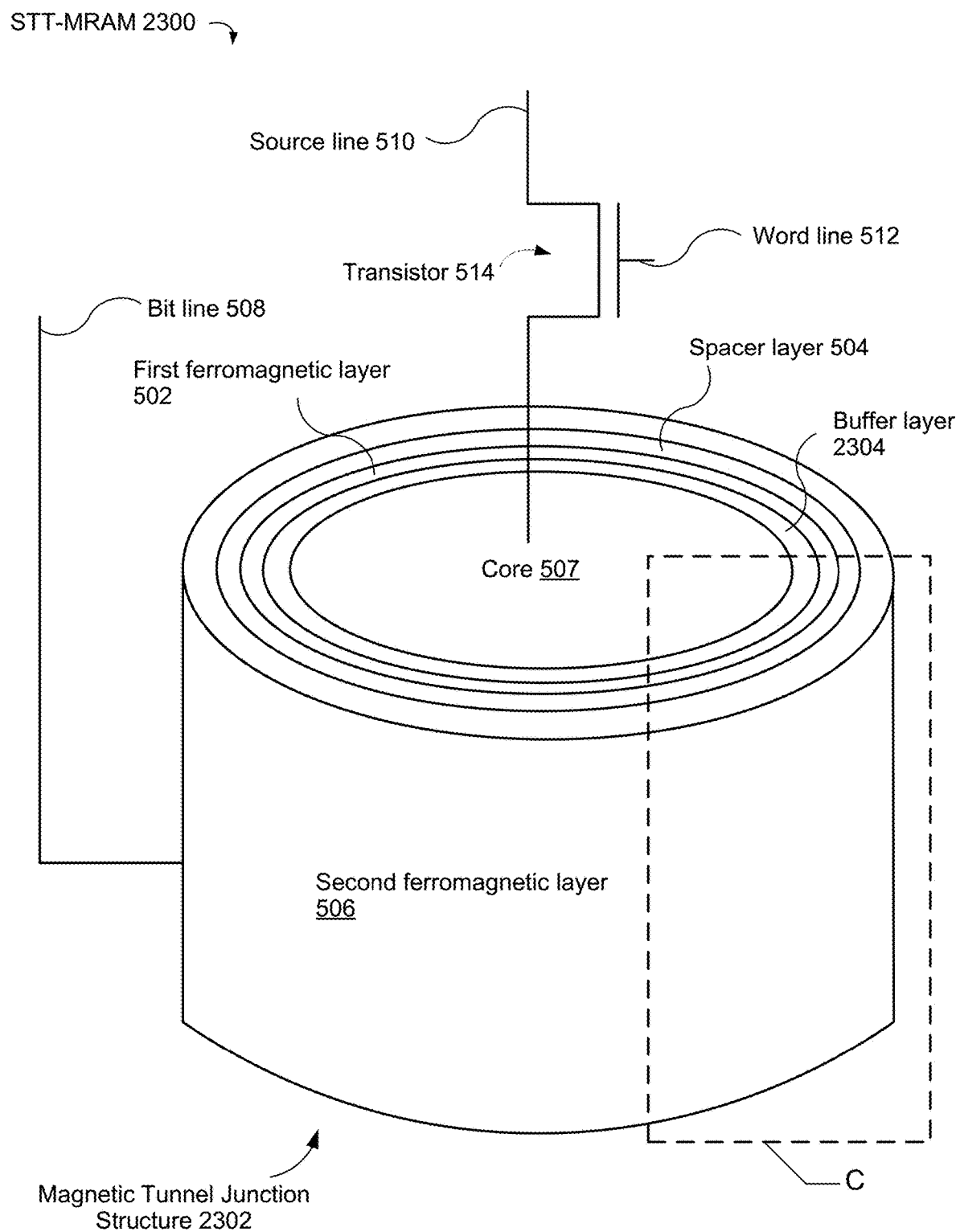
FIG. 23 illustrates a three-dimensional MRAM device with a metallic buffer layer in accordance with some implementations.

FIG. 23 illustrates a three-dimensional STT MRAM device 2300 with a metallic buffer layer 2304 in accordance with some implementations. The MRAM device 2300 is similar to the STT MRAM device 500 explained above, except that the MRAM device 2300 includes a metallic buffer layer 2304 disposed between the core 507 and the first ferromagnetic layer 502. Additionally, like the STT MRAM device 500, the MRAM device 2300 includes multiple additional layers, including a spacer layer 504 (also called a "barrier layer") and a second ferromagnetic layer 506, wrapped around the central core 507, thereby forming a three-dimensional cylindrical (or conical) MTJ structure 2302. MTJ structures are discussed in further detail above with reference to FIG. 5 and for the sake of brevity, duplicative description is not repeated below.

The metallic buffer layer 2304 is implemented in the MRAM device 2300 to reduce interfacial anisotropy, and in turn, increase the thermal stability of the MRAM device 2300. To provide some context, interfacial anisotropy is an energy created from the interface, or contact area, between two materials (e.g., the interface between the cylindrical core 507 and the first ferromagnetic layer 502, or in the case of FIG. 23, the interface between the metallic buffer layer 2304 and the first ferromagnetic layer 502). Interfacial anisotropy may be measured by the amount of energy created per area of interface (e.g., millijoules per square meter (mJ/m2)), and the interfacial anisotropy between two materials varies based on the materials selected. In addition, interfacial anisotropy can be cumulative, so the interfacial anisotropy of a ferromagnetic layer can be the sum of the individual interfacial anisotropies for each interface in contact with the said ferromagnetic layer.

With conventional stacked perpendicular MTJ (pMTJ), such as the pMTJ shown in FIGS. 2A-2B, the interfacial anisotropy parallels a direction of magnetization of the stacked pMTJ. Because the interfacial anisotropy parallels the direction of magnetization of the stacked pMTJ, the interfacial anisotropy contributes in a preferred manner to an anisotropy of the free layer (e.g., storage layer 106), and in doing so, a greater thermal stability is achieved. Therefore, alignment of interfacial anisotropy and magnetization is sought after with conventional stacked pMTJs.

Figure 24A:
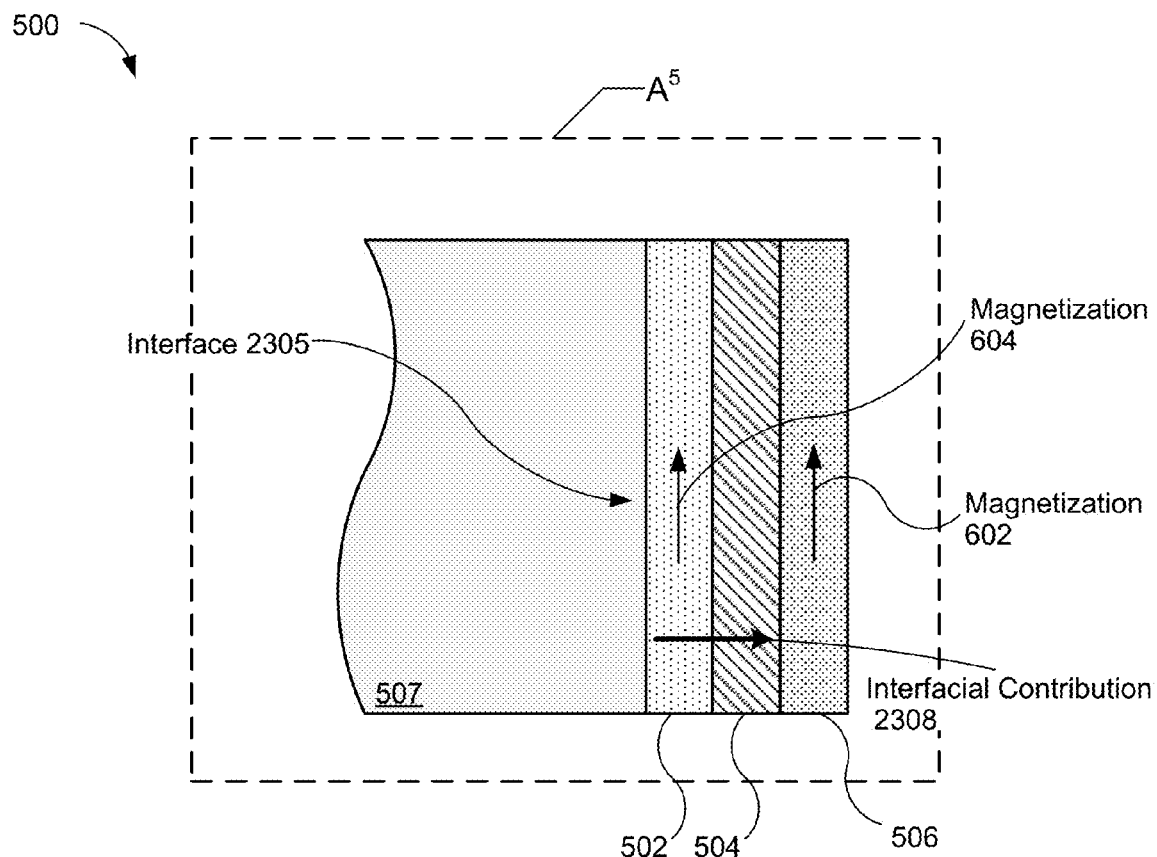
FIGS. 24A and 24B are cross-sectional views of the cylindrical three-dimensional MRAM device having different layer structures in accordance with some implementations.
Figure 24B:
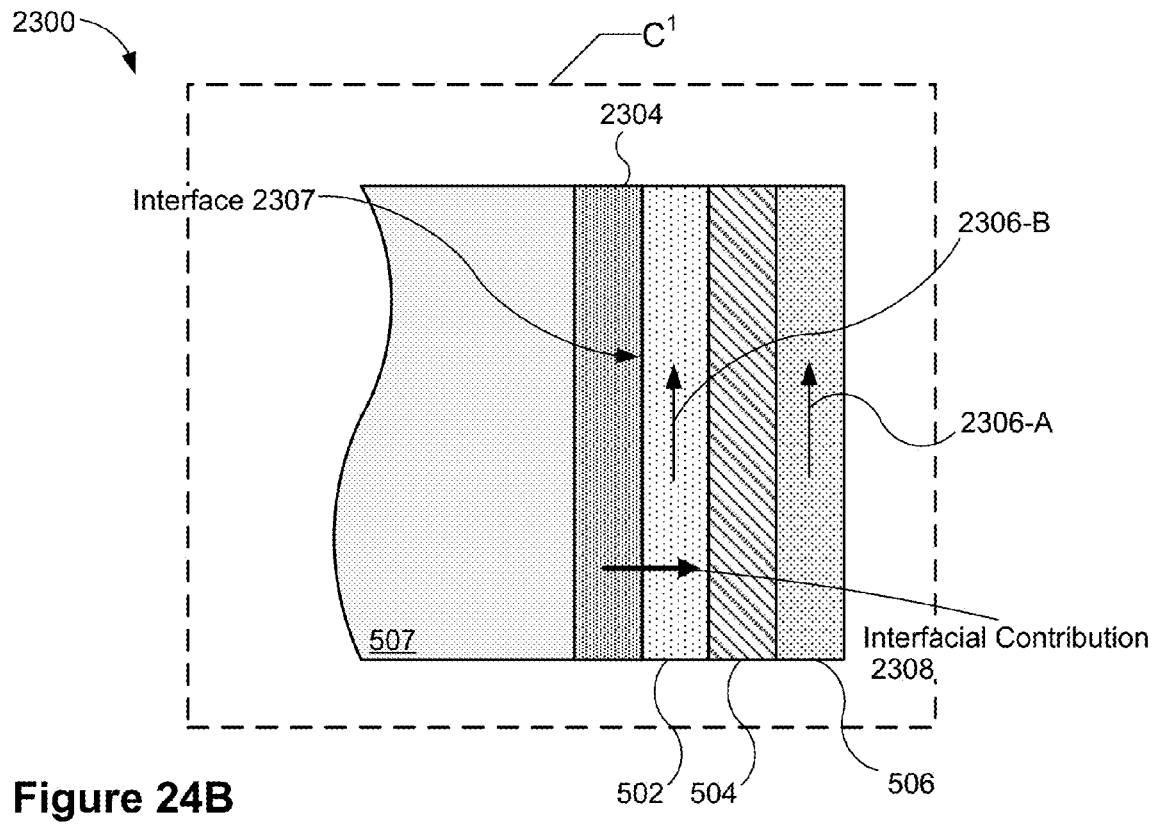

In contrast, with the cylindrical MTJ's described herein, the interfacial anisotropy is perpendicular to the easy axis direction of magnetization of the cylindrical pMTJ (or cylindrical vortex MTJ), which causes a thermal stability of the cylindrical pMTJ to be lowered (i.e., the interfacial anisotropy contribution to an anisotropy of the free layer is detrimental to the performance of the cylindrical MTJ). Furthermore, in some cases, interfacial anisotropy causes a direction of the cylindrical pMTJ's magnetization to switch due to the misalignment between magnetization and interfacial anisotropy. Thus, with cylindrical MTJ's (e.g., MTJ structure 501, MTJ structure 2302), a lesser overall interfacial anisotropy of the MTJ leads to a greater thermal stability in the first ferromagnetic layer (i.e., the free layer). FIGS. 24A and 24B help illustrate the discussion above.

FIG. 24A illustrates a cross-sectional view (taken along line A, FIG. 5) of magnetization orientations of the cylindrical MTJ structure 501 in accordance with some implementations. FIG. 24B illustrates a cross-sectional view (taken along line C, FIG. 23) of magnetization orientations of the cylindrical MTJ structure 2302 in accordance with some implementations. For ease of illustration and discussion, a width of each layer 2304, 502, 504, and 506 shown in FIGS. 24A-24B is the same. However, in some implementations, the width of one or more layers may differ, depending on the circumstances.

FIG. 24A shows a cross-sectional view of the cylindrical MTJ structure 501 having a perpendicular magnetization orientation (also referred to herein as a perpendicular magnetic ground state). When the cylindrical MTJ structure 501 has the perpendicular magnetization orientation, the cylindrical MTJ structure 501 is classified as a perpendicular MTJ, as noted above. However, unlike the perpendicular MTJ 200 of FIGS. 2A-2B where a magnetization of the reference layer 102 is perpendicular to its interface with the spacer layer 104, a magnetization 604 of the first ferromagnetic layer 502 parallels an interface 2305 (vertical line) between the core 507 and the first ferromagnetic layer 502. Furthermore, an interfacial anisotropy contribution 2308 created between the core 507 and the first ferromagnetic layer 502 is perpendicular to the interface 2305 between the core 507 and the first ferromagnetic layer 502, and in turn, perpendicular to the magnetization 604 of the first ferromagnetic layer 502. In such a configuration, the interfacial anisotropy contribution 2308 causes the thermal stability of the free layer of the cylindrical MTJ structure 501 to be lowered.

In other words, the interfacial anisotropy contribution 2308 can cause the magnetization 604 of the first ferromagnetic layer 502 to switch from paralleling the interface 2305 (as shown) to being perpendicular to the interface 2305. To illustrate said switching, with reference to FIGS. 7B and 7C, the interfacial anisotropy contribution 2308 can cause the first ferromagnetic layer 502 to switch from the perpendicular magnetic ground state 710 to the in-plane magnetic ground state 720. Such a result is undesirable when the perpendicular magnetic ground state 710 is the preferred ground state (e.g., the dimensions of the cylindrical MTJ structure 501 are selected so that the first ferromagnetic layer 502 and the second ferromagnetic layer 506 have the perpendicular magnetic ground state 710, as described above with reference to FIGS. 8A and 8B).

Figure 25B:
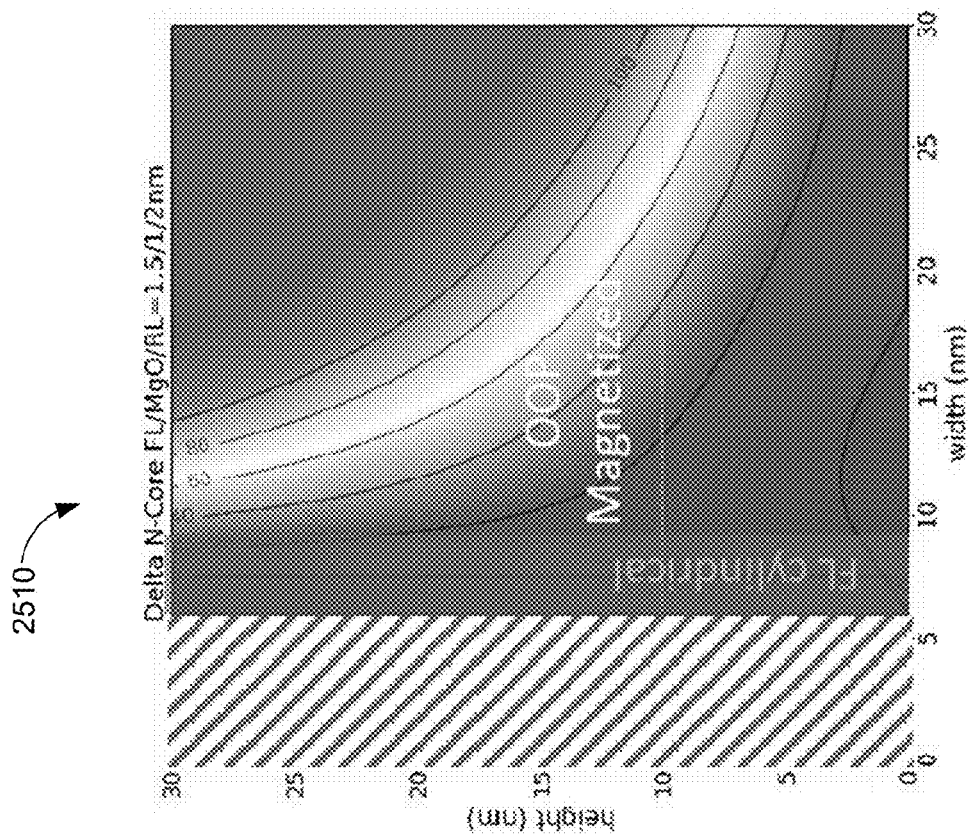
FIG. 25B shows a representative energy barrier that at least partially corresponds to the situation shown in FIG. 24B.
Figure 25A:
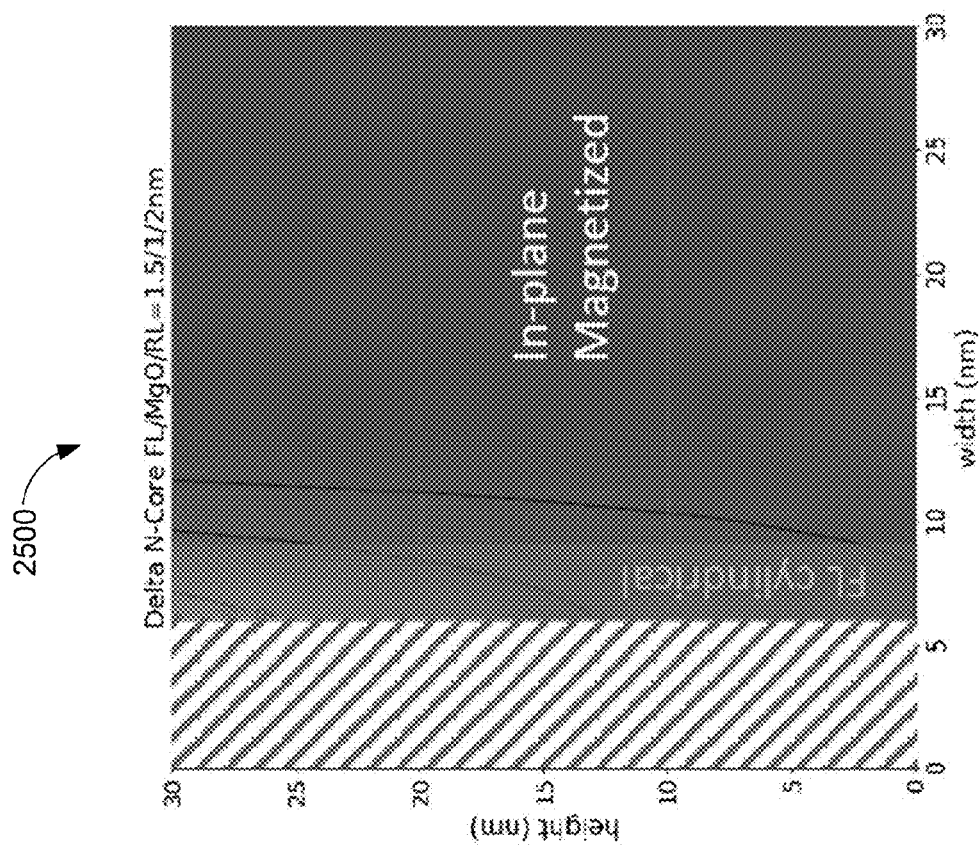
FIG. 25A shows a representative energy barrier that at least partially corresponds to the situation shown in FIG. 24A.

FIG. 25A shows a representative energy barrier 2500 that at least partially corresponds to the situation shown in FIG. 24A. As a result of the interfacial anisotropy contribution 2308 causing the magnetization 604 of the first ferromagnetic layer 502 to switch, the first ferromagnetic layer 502 is "in-plane magnetized" (e.g., in-plane magnetic ground state 720). In such a state, the thermal stability of the first ferromagnetic layer 502 can be substantially reduced, as indicated by the dark blue colors. Furthermore, the magnetic ground state of the first ferromagnetic layer 502 would no longer match the magnetic ground state of the second ferromagnetic layer 506, and a result, the cylindrical MTJ structure 501 would not properly store data.

While not shown, a similar result occurs when the cylindrical MTJ structure 501 (i.e., the ferromagnetic layers therein) is (are) designed to have a vortex magnetization orientation. For example, when the first ferromagnetic layer 502 has the vortex magnetic ground state 700 (FIG. 7A), the interfacial anisotropy contribution 2308 created between the core 507 and the first ferromagnetic layer 502 would also be perpendicular to the magnetization 614 (FIG. 6C) of the first ferromagnetic layer 502. As such, the interfacial anisotropy contribution 2308 would also cause the magnetization 614 (or magnetization 616) of the first ferromagnetic layer 502 to switch from a configuration where the magnetization rotates around the core 507 to a configuration where the magnetization is perpendicular to the interface 2305. Such a result is undesirable when the vortex magnetic ground state 700 is the preferred ground state (e.g., the dimensions of the cylindrical MTJ structure 501 are selected so that the first ferromagnetic layer 502 and the second ferromagnetic layer 506 have the vortex magnetic ground state 700, as described above with reference to FIG. 8B).

FIG. 24B shows a cross-sectional view of the cylindrical MTJ structure 2302 having a perpendicular magnetization orientation. The cylindrical MTJ structure 2302 is similar to the cylindrical MTJ structure 501 in FIG. 24A, except that the cylindrical MTJ structure 2302 includes a metallic buffer layer 2304 that surrounds the core 507. The metallic buffer layer 2304 is used to separate the core 507 from the first ferromagnetic layer 502. In such an arrangement, the metallic buffer layer 2304 reduces an interfacial anisotropy contribution 2308, resulting from the interface 2307 between the metallic buffer layer 2304 and the first ferromagnetic layer 502 (vertical line separating the metallic buffer layer 2304 and the first ferromagnetic layer 502), to an anisotropy of the first ferromagnetic layer 502 (i.e., the metallic buffer layer 2304 insulates the first ferromagnetic layer 502 from the effects of the interfacial anisotropy contribution 2308). In doing so, the metallic buffer layer 2304 maintains (and in some instances increases) a thermal stability of the cylindrical MTJ structure 2302. As a result, the interfacial anisotropy contribution 2308 does not switch the magnetization 2306-B of the first ferromagnetic layer 502 from the perpendicular magnetic ground state 710 (as shown FIG. 24B) to the in-plane magnetic ground state 720.

While not shown, a similar result occurs when the cylindrical MTJ structure 501 (i.e., the ferromagnetic layers therein) is (are) designed to have a vortex magnetization orientation. For example, by incorporating the metallic buffer layer 2304, the interfacial anisotropy contribution 2308 would not switch the magnetization of the first ferromagnetic layer 502 from the vortex magnetic ground state 700 to the in-plane magnetic ground state 720. The interfacial contribution 2308 shown in FIG. 24B is provided more for ease of illustration and discussion. In practice, an interfacial contribution may be non-existent when the metallic buffer layer 2304 is used.

FIG. 25B shows a representative energy barrier 2510 that at least partially corresponds to the situation shown in FIG. 24B. For example, because the interfacial anisotropy contribution 2308 is reduced/eliminated/reversed by the metallic buffer layer 2304, the first ferromagnetic layer 502 remains in the desired out-of-plane ground state (the perpendicular magnetic ground state 710). In such an arrangement, the thermal stability of the first ferromagnetic layer 502 is maintained, and perhaps increased (as indicated by the lighter blues and dark red colors). As a result, the first ferromagnetic layer 502 can be used to store data, even at small sizes (i.e., the first ferromagnetic layer 502 is a variable free layer).

As explained above, with conventional stacked pMTJs, such as the MTJ shown in FIGS. 2A-2B, the interfacial anisotropy parallels a direction of magnetization of the stacked pMTJ. Because the interfacial anisotropy parallels the direction of magnetization of the stacked pMTJ, a greater thermal stability is achieved, and therefore alignment of interfacial anisotropy and magnetization is sought after with conventional stacked pMTJs. Further, to maximize the thermal stability, conventional stacked pMTJs sometimes include metallic buffer layers of their own that are strong sources of interfacial anisotropy contribution. To achieve this, the metallic buffer layers are made from specific materials, such as tantalum and tantalum nitride, that have been shown to create interfacial anisotropy.

Conversely, some materials are poor sources of interfacial anisotropy (e.g., materials that reduce, eliminate, or even trigger a change in the sign of the interfacial anisotropy contribution), and therefore, these materials are avoided when designing metallic buffer layers for conventional stacked pMTJs. Examples materials that are poor sources of interfacial anisotropy include but are not limited to aluminum, magnesium, ruthenium, and rhodium. Other examples include alkali metals, alkaline earth metals, and some of the poor metals.

Accordingly, because the metallic buffer layer 2304 described herein reduces the interfacial anisotropy contribution 2308, the metallic buffer layer 2304 is made from a material (or materials) that is (are) poor sources of interfacial anisotropy. Put another way, if the metallic buffer layer 2308 was made from a material that amplified interfacial anisotropy (i.e., a strong source of interfacial anisotropy), then the cylindrical MTJ structure 2302 would tend to have the in-plane magnetic ground state 720 (FIG. 7C), as opposed to the other ground states (e.g., the vortex magnetic ground state 700 and the perpendicular magnetic ground state 710), even though the dimensions of the cylindrical MTJ structure are selected so that the first ferromagnetic layer 502 and the second ferromagnetic layer 506 have the other ground states. Further, as explained above with reference to FIG. 7C, the plane magnetic ground state 720 is not preferred when it comes to encoding information in cylindrical MTJ structures as there is no energy barrier to overcome when going from the anti-parallel to the parallel configuration and the system could assume any angular configuration in-between, which is not ideal for storing a bit. Thus, by using materials that are poor sources of interfacial anisotropy, the metallic buffer layer 2304 prevents the cylindrical MTJ structure 2302 from having the in-plane magnetic ground state 720.

In some implementations, the core 507 of the STT MRAM device 2300 is also made from, at least partially, a material (or materials) that is (are) poor sources of interfacial anisotropy. In this way, an overall interfacial anisotropy of the cylindrical MTJ structure 2302 can be reduced further. Additionally, in some instances, the metallic buffer layer 2304 is not needed when the core 507 is made from a material (or materials) that is (are) poor sources of interfacial anisotropy. It is also noted that, on those implementations where the second ferromagnetic layer 506 is the free (storage) layer, then the metallic buffer layer 2304 is positioned between the barrier layer 504 and the second ferromagnetic layer 506.

In light of these principles, we now turn to certain implementations.

In accordance with some implementations, a magnetic memory device is provided (e.g., STT-MRAM device 500, FIG. 5). The magnetic memory device includes a cylindrical core (e.g., core 507, FIG. 5), a first cylindrical ferromagnetic layer (e.g., ferromagnetic layer 502, FIG. 5) that surrounds the cylindrical core, a spacer layer (e.g., spacer layer 504, FIG. 5) that surrounds the first cylindrical ferromagnetic layer, and a second cylindrical ferromagnetic layer (e.g., ferromagnetic layer 506, FIG. 5) that surrounds the spacer layer. The cylindrical core, the first cylindrical ferromagnetic layer, the spacer layer, and the second cylindrical ferromagnetic layer collectively form a magnetic tunnel junction (e.g., magnetic tunnel junction structure 501, FIG. 5).

In some implementations, the cylindrical core, the first cylindrical ferromagnetic layer, the spacer layer, and the second cylindrical ferromagnetic layer are coaxial with one another (e.g., as shown in FIG. 5). Additionally, in some implementations, heights of the cylindrical core, the first cylindrical ferromagnetic layer, the spacer layer, and the second cylindrical ferromagnetic layer substantially match one another (e.g., as shown in FIG. 5).

In some implementations, the magnetic memory device further includes a first terminal lead connected to the cylindrical core (e.g., source line 510, FIG. 5) and a second terminal lead connected to the second cylindrical ferromagnetic layer (e.g., bit line 508, FIG. 5), or vice versa.

In some implementations, the first cylindrical ferromagnetic layer has a first set of characteristics and the second cylindrical ferromagnetic layer has a second set of characteristics that at least partially differ from the first set of characteristics. In some implementations, a magnetic ground state of the first and second cylindrical ferromagnetic layers is based, at least in part, on characteristics of the first and second cylindrical ferromagnetic layers, respectively. Examples of magnetic ground states are provided above with reference to FIGS. 7A-7C.

In some implementations, the first and second sets of characteristics include: (i) thicknesses of the first and second cylindrical ferromagnetic layers and (ii) heights of the first and second cylindrical ferromagnetic layers, respectively. In some implementations, the first and second sets of characteristics further include layer composition (e.g., single layer versus multiple sublayers), exchange energy, saturation magnetization, and uniaxial anisotropy. Further, in some implementations, the magnetic ground state of the first and second cylindrical ferromagnetic layers are further based on characteristics of the cylindrical core. For example, the characteristics of the cylindrical core include: (i) a radius of the cylindrical core and (ii) a height of the cylindrical core. FIGS. 8A-8B provide phase diagrams 800 and 810 showing the relationship between certain characteristics and various magnetic ground states.

In some implementations, the first cylindrical ferromagnetic layer is a storage layer (e.g., storage layer 106, FIG. 1A) and the second cylindrical ferromagnetic layer is a reference layer (e.g., reference layer 102, FIG. 1A). Alternatively, in some implementations, the first cylindrical ferromagnetic layer is the reference layer and the second cylindrical ferromagnetic layer is the storage layer.

In some implementations, a magnetization direction of the first cylindrical ferromagnetic layer mirrors a magnetization direction of the second cylindrical ferromagnetic layer when the magnetic memory device is in a first resistance state (e.g., parallel resistance states shown in FIGS. 6A and 6C). Alternatively, in some implementations, a magnetization direction of the first cylindrical ferromagnetic layer is opposite the magnetization direction of the second cylindrical ferromagnetic layer when the magnetic memory device is in a second resistance state (e.g., anti-parallel configurations shown in FIGS. 6B and 6D).

Additionally, in some implementations, the first and second cylindrical ferromagnetic layers are magnetized along an axis (e.g., axis 704) when each layer is in a first magnetic ground state (e.g., in the perpendicular magnetic ground state, magnetizations 602, 604, and 606 point upwards or downwards in FIGS. 6A-6B). Alternatively, in some implementations, the first and second cylindrical ferromagnetic layers are magnetized about the axis when each layer is in a second magnetic ground state different from the first magnetic ground state (e.g., in the vortex magnetic ground state, magnetizations 612, 614, and 616 either have a clockwise chirality or a counterclockwise chirality).

In some implementations, the first and second cylindrical ferromagnetic layers are in a first magnetic state (e.g., the perpendicular magnetic ground state) when a ratio between respective heights and thicknesses of the two layers satisfy a threshold, and the first and second cylindrical ferromagnetic layers are in a second magnetic state (e.g., the vortex magnetic ground state) when the ratio between the respective heights and thicknesses of the two layers do not satisfy the threshold. FIGS. 8A-8B provide phase diagrams 800 and 810 showing the relationship between heights and thicknesses, and various magnetic ground states.

In some implementations, the cylindrical core is a non-magnetic metal and the cylindrical core is configured to receive a current. For example, the core 507 may receive a current from the source line 510 (FIG. 5). Further, in some implementations, received current flows radially through the first cylindrical ferromagnetic layer and the spacer layer towards the second cylindrical ferromagnetic layer. For example, the current (e.g., electron flow 615) starts in the core 507 and moves radially to the second ferromagnetic layer 506 (FIG. 6C). Moreover, radial flow of the current imparts a torque at least on a magnetization of the first cylindrical ferromagnetic layer (and in some implementations imparts a torque on the second cylindrical ferromagnetic layer). In some implementations, the magnetization of the first cylindrical ferromagnetic layer changes from a first direction to a second direction when the current satisfies a threshold. For example, FIGS. 6A-6B illustrate the magnetization of the first cylindrical ferromagnetic layer 502 changing from a first direction (e.g., upwards) to a second direction (e.g., downwards) when the current satisfies the threshold (e.g., energy barrier 1016, FIG. 10B). In doing so, the first and second ferromagnetic layers in FIG. 6B are in an anti-parallel state. In another example, FIGS. 6C-6D illustrate the magnetization of the first cylindrical ferromagnetic layer 502 changing from a first direction (e.g., counterclockwise chirality) to a second direction (e.g., clockwise chirality) when the current satisfies the threshold (e.g., energy barrier 1006, FIG. 10A). In doing so, the first and second ferromagnetic layers in FIG. 6D are in an anti-parallel state. It is noted that in some implementations the threshold corresponding to FIGS. 6A-6B differs from the threshold corresponding to FIGS. 6C-6D.

The STT-MRAM device 500 is discussed in further detail above with reference to FIGS. 5-12.

In accordance with some implementations, another magnetic memory device is provided (e.g., SHE-MRAM device 1800, FIG. 18). The magnetic memory device includes a core (e.g., core 507, FIG. 18) and a plurality of layers that surround the core in succession. For example, with reference to FIG. 18, the plurality of layers includes a first ferromagnetic layer 502, followed by a spacer layer 504, followed by a second ferromagnetic layer 506. The first ferromagnetic layer 502 is sometimes referred to below as the "inner layer," and the second ferromagnetic layer 506 is sometimes referred to below as the "outer layer." In some implementations, the inner layer is the storage layer 106. Additionally, the core, the first ferromagnetic layer, the spacer layer, and the second ferromagnetic layer collectively form a magnetic tunnel junction (e.g., magnetic tunnel junction structure 501, FIG. 18).

The magnetic memory device further includes a first input terminal coupled to the core. The first input terminal is configured to receive a first current (also referred to herein as STT current and $J_{STT}$). In some implementations, the first current flows radially from the core through the plurality of layers and the radial flow of the first current imparts a torque on, at least, a magnetization of an inner layer of the plurality of layers (e.g., electron flow 615, FIG. 6C). The STT current is described in further detail above with reference to FIGS. 1-12.

The magnetic memory device further includes a second input terminal coupled to the core. The second input terminal is configured to receive a second current (also referred to herein as SHE current and $J_{SHE}$). The second current imparts a Spin Hall Effect (SHE) around a perimeter of the core, and the SHE imparted around the perimeter of the core contributes to the torque imparted on the magnetization of the inner layer by the first current. For example, with reference to FIG. 19A, the SHE current 1904 flows from the first terminal 1802 to the second terminal 1804 (or vice versa), and in doing so, imparts the SHE 1906 around the perimeter of the core 507. Further, the SHE 1906 is adjacent to the inner layer 502, and as a result, SHE-electrons of the SHE 1906 contribute to the torque imparted on the magnetization of the inner layer by the first current.

In some implementations, the first and second input terminals are the same terminal. For example, with reference to FIG. 18, the first and second input terminals may be examples of the first terminal 1802 (or the second terminal 1804). Alternatively, in some implementations, the first and second inputs terminals are not the same terminal. For example, with reference to FIG. 18, the first input terminal may be an example of the first terminal 1802 and the second input terminal may be an example of the second terminal 1804 (or vice versa). In another example, the first input terminal may be an example of the third terminal 1806 and the second input terminal may be an example of the first terminal 1802 or the second terminal 1804.

In some implementations, when the magnetic memory device is in a first magnetic ground state (e.g., a perpendicular magnetic ground state 710, FIG. 7B), the inner layer is magnetized in a first direction and the SHE imparted around the perimeter of the core flows in a second direction that is substantially orthogonal to the first direction. For example, with reference to FIG. 19A, the magnetization 1902-B of the inner layer 502 is upwards and the SHE spin polarization 1906 flows around the perimeter of the core 507 with a clockwise chirality, which is substantially orthogonal to the upwards direction of the magnetization 1902-B.

Further, in some implementations, when the magnetic memory device is in the first magnetic ground state: (i) the first input terminal receives the first current for a first period of time and (ii) the second input terminal receives the second current for a second period of time. In some implementations, the second period of time is less than the first period of time. For example, with reference to FIG. 20, the $J_{SHE}$ (the second current) is applied for approximately 0.5 nanoseconds and the $J_{STT}$ (the first current) is applied for some period of time greater than 0.5 nanoseconds. In some implementations, the second current is applied as a pulse. FIG. 21 provides additional examples of the second period of time.

In some implementations, the first input terminal is further configured to receive the first current at a first time and the second input terminal is also configured to receive the second current at the first time. For example, with reference again to FIG. 20, the $J_{SHE}$ (the second current) and the $J_{STT}$ (the first current) are, at least initially, applied simultaneously.

In some implementations, when the magnetic memory device is in the first magnetic ground state, the magnetization of the inner layer switches from the first direction to a second direction after a third period of time when the SHE is not imparted around the perimeter of the core at all. For example, with reference again to FIG. 20, when only the $J_{STT}$ (the first current) is applied, the magnetization of the inner layer switches from the first direction to a second direction after approximately 8 nanoseconds.

In contrast, when the magnetic memory device is in the first magnetic ground state, the magnetization of the inner layer switches from the first direction to the second direction after a fourth period of time when the SHE is imparted around the perimeter of the core for the second period of time. For example, with reference again to FIG. 20, when both the $J_{STT}$ and the $J_{SHE}$ are applied, the magnetization of the inner layer switches from the first direction to the second direction after approximately 2 nanoseconds. Thus, the fourth period of time is less than the third period of time.

In some implementations, when the magnetic memory device is in a second magnetic ground state (e.g., the vortex magnetic ground state 700, FIG. 7A): (i) the inner layer is magnetized in a first chirality, (ii) the SHE imparted around the perimeter of the core has a second chirality that is opposite to the first chirality; and (iii) the SHE is combined with the torque imparted on the magnetization of inner layer by the first current. For example, with reference to FIG. 19B, a magnetization 1902-B of the inner layer 502 is coming out of the page (e.g., a clockwise chirality) and the SHE spin polarization 1906 is going into the page (e.g., a counter-clockwise chirality). In such a configuration, the SHE spin polarization 1906 is combined with the torque imparted on the magnetization of the inner layer by the first current. FIG. 19C provides an example of the SHE polarization 1906 coming out of the page, which is caused by switching a direction of the current 1904 (as discussed above). In FIG. 19C, the magnetization of the inner layer 502 is also coming out of the page (e.g., the inner layer is magnetized in a first chirality and the SHE torque imparted around the perimeter of the core also has the first chirality). In such a configuration, the SHE stabilizes the magnetization of inner layer.

In some implementations, when the magnetic memory device is in the second magnetic ground state, the magnetization of the inner layer switches from the first chirality to a second chirality when the combined torque imparted on the magnetization of the inner layer satisfies a threshold (e.g., energy barrier 1006, FIG. 10A).

In some implementations, the first current has a first magnitude and the second current has a second magnitude. In some implementations, the second magnitude is greater than the first magnitude (e.g., $J_{SHE}$ is greater than $J_{STT}$, FIG. 20). Alternatively, in some implementations, the second magnitude is substantially equal to the first magnitude.

In some implementations, the magnetic memory device further includes an output terminal coupled to an outer layer of the plurality of layers, where the output terminal is configured to provide a current readout to a readout component of the magnetic memory device.

In accordance with some implementations, another magnetic memory device is provided (e.g., STT-MRAM device 2300, FIG. 23). The magnetic memory device includes a cylindrical core (e.g., core 507, FIG. 23), a metallic buffer layer (e.g., buffer layer 2304, FIG. 23) that surrounds the cylindrical core, a first ferromagnetic layer (e.g., ferromagnetic layer 502, FIG. 23) that surrounds the metallic buffer layer, a barrier layer (e.g., spacer layer 504, FIG. 23) that surrounds the first ferromagnetic layer, and a second ferromagnetic layer (e.g., ferromagnetic layer 506, FIG. 23) that surrounds the barrier layer. The cylindrical core, the metallic buffer layer, the first ferromagnetic layer, the barrier layer, and the second ferromagnetic layer collectively form a magnetic tunnel junction (e.g., magnetic tunnel junction structure 2302, FIG. 23).

In some implementations, a magnetization (e.g., magnetization 2306-B) of the first ferromagnetic layer parallels an interface (e.g., the interface 2307, FIG. 24B) of the metallic buffer layer and the first ferromagnetic layer. Further, the metallic buffer layer is to (at least) reduce an interfacial anisotropy contribution (e.g., interfacial anisotropy contribution 2308, FIG. 24A), resulting from the interface between the metallic buffer layer and the first ferromagnetic layer, to an anisotropy of the first ferromagnetic layer. Accordingly, the metallic buffer layer is configured to maintain a magnetic ground state of the magnetic memory device. For example, if the magnetic memory device is dimensioned for a first magnetic ground state (e.g., the perpendicular magnetic ground state 710 or the vortex magnetic ground state 700), then the metallic buffer layer prevents an interfacial anisotropy contribution from switching the magnetic memory device (e.g., the free layer) to some other undesired magnetic ground state. To provide some context, with reference to FIG. 24B, the interfacial anisotropy 2308 is in a direction that is perpendicular to the magnetization 2306-B of the first ferromagnetic layer 502.

In some implementations, the interfacial anisotropy is magnetic anisotropy. For example, the interfacial anisotropy contribution 2308 (FIG. 24A) is magnetic anisotropy.

In some implementations, when the metallic buffer layer is a first material, the first ferromagnetic layer has a first thermal stability. Further, when the metallic buffer layer is a second material different from the first material, then the first ferromagnetic layer has a second thermal stability greater than the first thermal stability. For example, as discussed above, some materials provide a large source of interfacial anisotropy contribution between two materials, which is not preferred in cylindrical MTJs for the reasons discussed above with reference to FIGS. 23 and 24A-24B, whereas some other materials reduce, eliminate, or reverse the interfacial anisotropy contribution between two materials, which is preferred in cylindrical MTJs for the reasons discussed above with reference to FIGS. 23 and 24A-24B. Accordingly, in some implementations, the first material is a material that reduces the interfacial anisotropy contribution to the anisotropy of the first ferromagnetic layer by a first amount, and the second material is a material that reduces the interfacial anisotropy contribution to the anisotropy of the first ferromagnetic layer by a second amount greater than the first amount. Thus, by making the metallic buffer layer from the second material, the first ferromagnetic layer has a second thermal stability that is greater than the first thermal stability.

In some implementations, the second material is selected from the group consisting of: aluminum, magnesium, ruthenium, and rhenium. Alternatively, in some implementations, the second material is one or more of alkali metals, alkaline earth metals, and some of the poor metals.

In some implementations, the first ferromagnetic layer has a first set of characteristics and the second ferromagnetic layer has a second set of characteristics that at least partially differ from the first set of characteristics. In some implementations, a magnetic ground state of the first and second ferromagnetic layers is based, at least in part, on characteristics of the first and second cylindrical ferromagnetic layers, respectively. Examples of magnetic ground states are provided above with reference to FIGS. 7A-7C.

In some implementations, the first and second sets of characteristics include: (i) thicknesses of the first and second ferromagnetic layers and (ii) heights of the first and second ferromagnetic layers, respectively. In some implementations, the first and second sets of characteristics further include layer composition (e.g., single layer versus multiple sublayers), exchange energy, saturation magnetization, and uniaxial anisotropy. Further, in some implementations, the magnetic ground state of the first and second ferromagnetic layers is further based on characteristics of the cylindrical core. For example, the characteristics of the cylindrical core include: (i) a radius of the cylindrical core and (ii) a height of the cylindrical core. FIGS. 8A-8B provide phase diagrams 800 and 810 showing the relationship between certain characteristics and various magnetic ground states.

In some implementations, the first ferromagnetic layer is a storage layer (e.g., storage layer 106, FIG. 1A) and the second ferromagnetic layer is a reference layer (e.g., reference layer 102, FIG. 1A). Alternatively, in some implementations, the first ferromagnetic layer is the reference layer and the second ferromagnetic layer is the storage layer.

In some implementations, a magnetization direction of the first ferromagnetic layer mirrors a magnetization direction of the second ferromagnetic layer when the magnetic memory device is in a first resistance state (e.g., parallel resistance states shown in FIGS. 6A and 6C). Alternatively, in some implementations, a magnetization direction of the first ferromagnetic layer is opposite the magnetization direction of the second ferromagnetic layer when the magnetic memory device is in a second resistance state (e.g., anti-parallel configurations shown in FIGS. 6B and 6D).

Additionally, in some implementations, the first and second ferromagnetic layers are magnetized along an axis (e.g., axis 704) when each layer is in a first magnetic ground state (e.g., in the perpendicular magnetic ground state, magnetizations 602, 604, and 606 point upwards or downwards in FIGS. 6A-6B). Alternatively, in some implementations, the first and second ferromagnetic layers are magnetized about the axis when each layer is in a second magnetic ground state different from the first magnetic ground state (e.g., in the vortex magnetic ground state, magnetizations 612, 614, and 616 either have a clockwise chirality or a counterclockwise chirality).

In some implementations, the cylindrical core is a nonmagnetic metal and the cylindrical core is configured to receive a current. For example, the core 507 may receive a current from the source line 510 (FIG. 5). Further, in some implementations, the received current flows radially through the metallic buffer layer, the first ferromagnetic layer, and the barrier layer towards the second ferromagnetic layer. Moreover, radial flow of the current through the barrier layer and the second ferromagnetic layer imparts a torque at least on a magnetization of the first ferromagnetic layer (and in some implementations imparts a torque on the second ferromagnetic layer). In some implementations, the magnetization of the first cylindrical ferromagnetic layer changes from a first direction to a second direction when the current satisfies a threshold. For example, FIGS. 6A-6B illustrate the magnetization of the first ferromagnetic layer 502 changing from a first direction (e.g., upwards) to a second direction (e.g., downwards) when the current satisfies the threshold (e.g., energy barrier 1016, FIG. 10B). In doing so, the first and second ferromagnetic layers in FIG. 6B are in an anti-parallel state. In another example, FIGS. 6C-6D illustrate the magnetization of the first ferromagnetic layer 502 changing from a first direction (e.g., counterclockwise chirality) to a second direction (e.g., clockwise chirality) when the current satisfies the threshold (e.g., energy barrier 1006, FIG. 10A). In doing so, the first and second ferromagnetic layers in FIG. 6D are in an anti-parallel state. It is noted that in some implementations the threshold corresponding to FIGS. 6A-6B differs from the threshold corresponding to FIGS. 6C-6D.

In some implementations, the barrier layer insulates the first ferromagnetic layer from the second ferromagnetic layer.

In some implementations, the cylindrical core, the metallic buffer layer, the first ferromagnetic layer, the barrier layer, and the second ferromagnetic layer are coaxial with one another. Further, the cylindrical core may be a solid cylinder, while the metallic buffer layer, the first ferromagnetic layer, the barrier layer, and the second ferromagnetic layer may be cylindrical shells of the same or different thicknesses.

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first electronic device could be termed a second electronic device, and, similarly, a second electronic device could be termed a first electronic device, without departing from the scope of the various described implementations. The first electronic device and the second electronic device are both electronic devices, but they are not the same type of electronic device.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A magnetic memory device comprising:
   a cylindrical core;
   a metallic buffer layer that surrounds the cylindrical core;
   a first ferromagnetic layer that surrounds the metallic buffer layer;
   a barrier layer that surrounds the first ferromagnetic layer; and
   a second ferromagnetic layer that surrounds the barrier layer, wherein the cylindrical core, the metallic buffer layer, the first ferromagnetic layer, the barrier layer, and the second ferromagnetic layer collectively form a magnetic tunnel junction,
   wherein:
      a magnetization of the first ferromagnetic layer parallels an interface of the metallic buffer layer and the first ferromagnetic layer; and
      the metallic buffer layer reduces an interfacial anisotropy contribution, resulting from the interface between the metallic buffer layer and the first ferromagnetic layer, to an anisotropy of the first ferromagnetic layer, the interfacial anisotropy being in a direction that is perpendicular to the magnetization of the first ferromagnetic layer.

2. The magnetic memory device of claim 1, wherein the interfacial anisotropy is magnetic anisotropy.

3. The magnetic memory device of claim 1, wherein:
   when the metallic buffer layer is a first material, the first ferromagnetic layer has a first thermal stability; and
   when the metallic buffer layer is a second material different from the first material, the first ferromagnetic layer has a second thermal stability greater than the first thermal stability.

4. The magnetic memory device of claim 3, wherein the second material is selected from the group consisting of: aluminum, magnesium, ruthenium, and rhenium.

5. The magnetic memory device of claim 1, wherein:
   the first ferromagnetic layer has a first set of characteristics; and
   the second ferromagnetic layer has a second set of characteristics that at least partially differ from the first set of characteristics.

6. The magnetic memory device of claim 5, wherein a magnetic ground state of the first and second ferromagnetic layers is based, at least in part, on characteristics of the first and second ferromagnetic layers, respectively.

7. The magnetic memory device of claim 6, wherein the first and second sets of characteristics include: (i) thicknesses of the first and second ferromagnetic layers and (ii) heights of the first and second ferromagnetic layers, respectively.

8. The magnetic memory device of claim 6, wherein the magnetic ground state is one of an out-of-plane ground state or a vortex ground state.

9. The magnetic memory device of claim 6, wherein the magnetic ground state of the first and second ferromagnetic layers is further based on characteristics of the cylindrical core.

10. The magnetic memory device of claim 9, wherein the characteristics of the cylindrical core include: (i) a radius of the cylindrical core and (ii) a height of the cylindrical core.

11. The magnetic memory device of claim 1, wherein:
    the first ferromagnetic layer is a storage layer; and
    the second ferromagnetic layer is a reference layer.

12. The magnetic memory device of claim 1, wherein:
    the cylindrical core is a non-magnetic metal; and
    the cylindrical core is configured to receive a current.

13. The magnetic memory device of claim 12, wherein:
the received current flows radially through the metallic buffer layer, the first ferromagnetic layer, and the barrier layer towards the second ferromagnetic layer; and
radial flow of the current through the barrier layer and the second ferromagnetic layer imparts a torque at least on a magnetization of the first ferromagnetic layer.

14. The magnetic memory device of claim 13, wherein the magnetization of the first ferromagnetic layer changes from a first direction to a second direction when the current satisfies a threshold.

15. The magnetic memory device of claim 14, wherein:
the first direction is a first chirality; and
the second direction is a second chirality opposite to the first chirality.

16. The magnetic memory device of claim 1, wherein the barrier layer insulates the first ferromagnetic layer from the second ferromagnetic layer.

17. The magnetic memory device of claim 1, wherein the cylindrical core, the metallic buffer layer, the first ferromagnetic layer, the barrier layer, and the second ferromagnetic layer are coaxial with one another.

18. The magnetic memory device of claim 1, further comprising:
a first terminal lead connected to the cylindrical core; and
a second terminal lead connected to the second ferromagnetic layer.

* * * * *